US008140288B2

(12) United States Patent
Yang et al.

(10) Patent No.: US 8,140,288 B2
(45) Date of Patent: Mar. 20, 2012

(54) ON-MACHINE METHODS FOR IDENTIFYING AND COMPENSATING FORCE-RIPPLE AND SIDE-FORCES PRODUCED BY ACTUATORS ON A MULTIPLE-AXIS STAGE

(75) Inventors: Pai-Hsueh Yang, Palo Alto, CA (US); Bausan Yuan, San Jose, CA (US); Kazuo Masaki, Saitama (JP); Kazuhiro Hirano, Saitama (JP); Xiao-Feng Yang, Saitama (JP); Scott Coakley, Belmont, CA (US); Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 264 days.

(21) Appl. No.: 11/986,314

(22) Filed: Nov. 19, 2007

(65) Prior Publication Data

US 2008/0275661 A1 Nov. 6, 2008

Related U.S. Application Data

(60) Provisional application No. 60/925,235, filed on Apr. 18, 2007.

(51) Int. Cl.
*G01L 25/00* (2006.01)

(52) U.S. Cl. ........ 702/105; 318/254; 318/128; 318/623; 318/625; 318/575; 318/649; 318/560; 318/566; 355/53; 73/105

(58) Field of Classification Search .................. 702/105; 318/254, 35, 128, 114, 649, 640, 632, 560, 318/623, 625, 135, 687, 568.1, 7, 575; 73/105, 73/774; 356/501, 401, 124; 355/67, 53, 355/76, 77, 78, 220; 430/5; 310/10, 12
See application file for complete search history.

(56) References Cited

U.S. PATENT DOCUMENTS

| 5,666,038 | A | | 9/1997 | Ohishi |
| 5,959,427 | A | * | 9/1999 | Watson .................. 318/687 |
| 6,028,376 | A | * | 2/2000 | Osanai et al. ........... 310/12.13 |
| 6,654,098 | B2 | * | 11/2003 | Asano et al. .............. 355/53 |
| 6,922,025 | B2 | | 7/2005 | Smith |
| 7,193,493 | B2 | * | 3/2007 | Asano et al. ............. 335/220 |
| 7,215,095 | B2 | * | 5/2007 | Sekiguchi ................ 318/575 |
| 7,312,853 | B2 | * | 12/2007 | Kiriya .................... 355/76 |

(Continued)

FOREIGN PATENT DOCUMENTS

JP 2001-218497 8/2001

(Continued)

*Primary Examiner* — Carol Tsai
(74) *Attorney, Agent, or Firm* — Klarquist Sparkman, LLP

(57) ABSTRACT

Methods, apparatus, and systems are disclosed for identifying force-ripple and/or side-forces in actuators used for moving a multiple-axis stage. The identified force-ripple and/or side-forces can be mapped, and maps of corresponding position-dependent compensation ratios useful for correcting same are obtained. The methods are especially useful for stages providing motion in at least one degree of freedom using multiple (redundant) actuators. In an exemplary method a stage member is displaced, using at least one selected actuator, multiple times over a set distance in the range of motion of the subject actuator(s). Each displacement has a predetermined trajectory and respective starting point in the range. For each displacement, respective section force-command(s) are extracted and normalized to a reference section force-command to define a section compensation-ratio. Multiple section compensation-ratios are assembled, as functions of displacement in the range, to provide a map of compensation ratios for the actuator(s) throughout the range.

41 Claims, 46 Drawing Sheets

U.S. PATENT DOCUMENTS

| | | | |
|---|---|---|---|
| 7,330,093 B2 * | 2/2008 | Asano et al. | 335/220 |
| 7,333,862 B2 * | 2/2008 | Makino | 700/56 |
| 7,385,370 B2 * | 6/2008 | Sekiguchi | 318/575 |
| 7,597,531 B2 * | 10/2009 | Okada et al. | 414/806 |
| 2001/0015799 A1 * | 8/2001 | Asano et al. | 355/72 |
| 2006/0033896 A1 * | 2/2006 | Kiriya | 355/53 |
| 2006/0049697 A1 | 3/2006 | Binnard | |
| 2006/0170382 A1 * | 8/2006 | Yang et al. | 318/114 |
| 2006/0232142 A1 | 10/2006 | Binnard | |
| 2008/0067968 A1 | 3/2008 | Binnard et al. | |
| 2008/0285004 A1 | 11/2008 | Binnard et al. | |

FOREIGN PATENT DOCUMENTS

| | | |
|---|---|---|
| JP | 2004-336922 | 11/2004 |
| WO | WO 2005/036620 | 4/2005 |
| WO | WO 2008/130560 | 10/2008 |

* cited by examiner

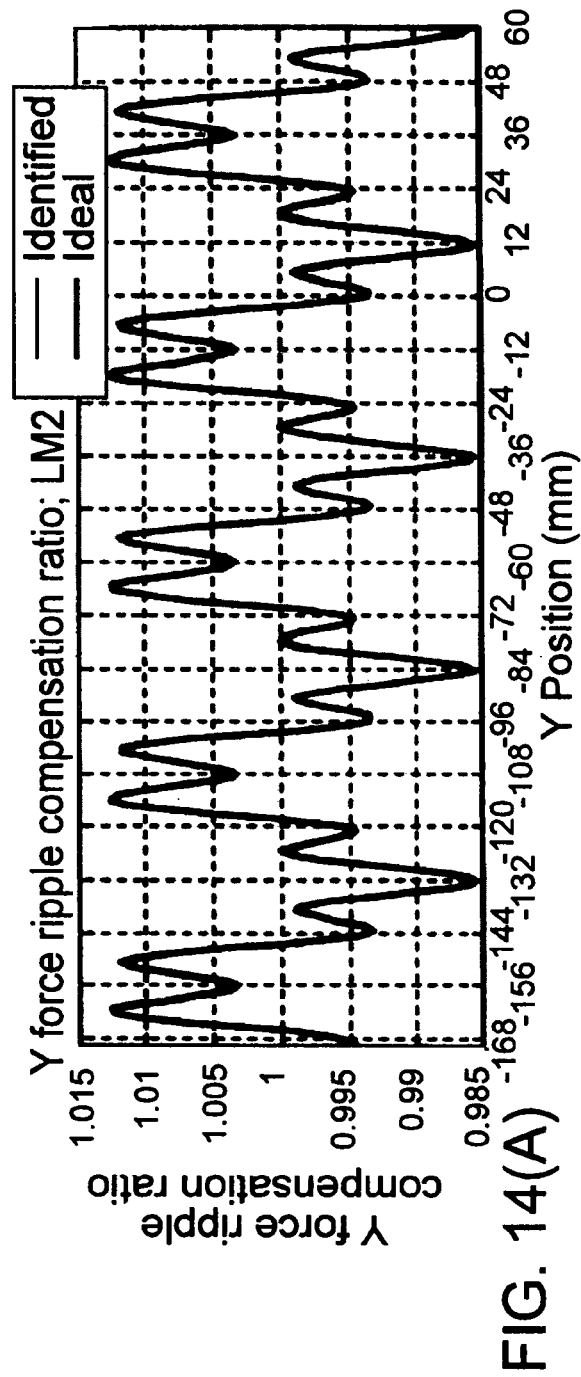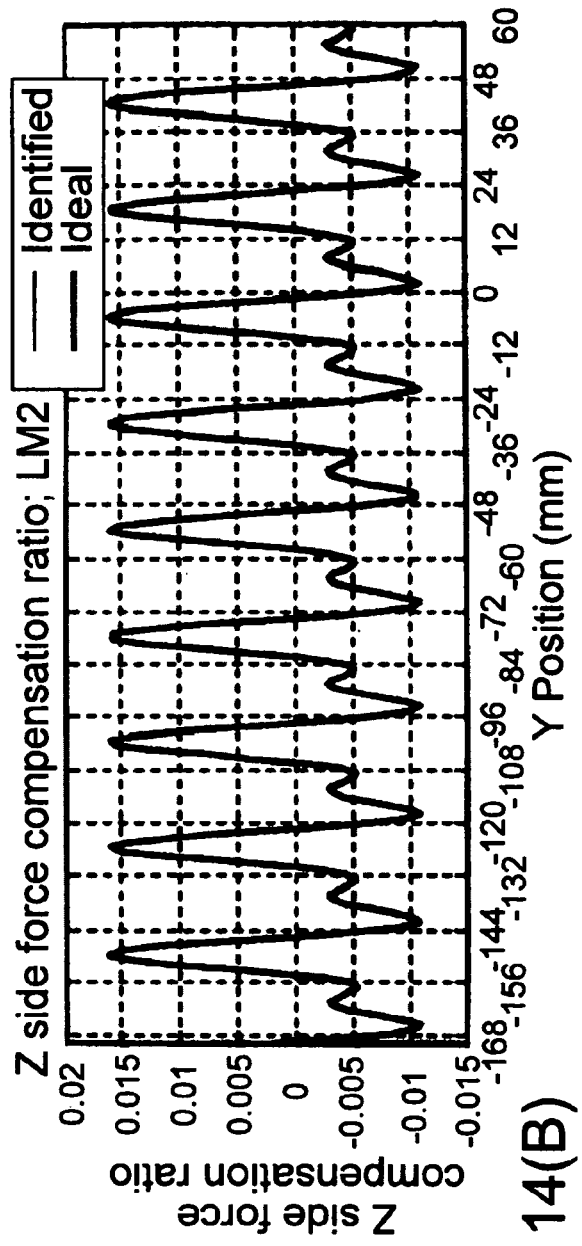
FIG. 14(A)
FIG. 14(B)

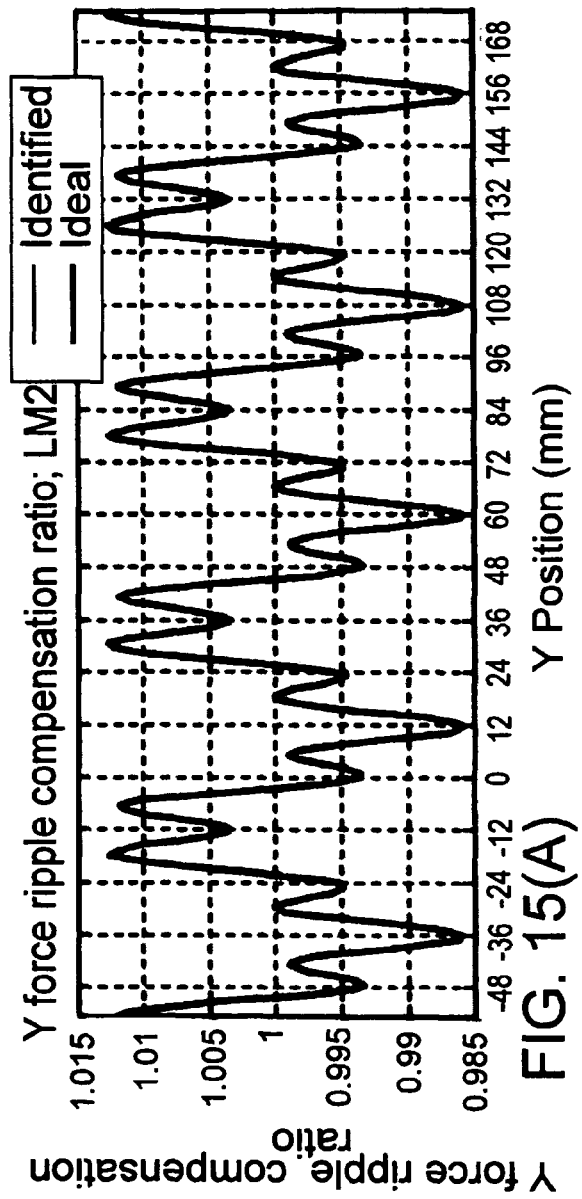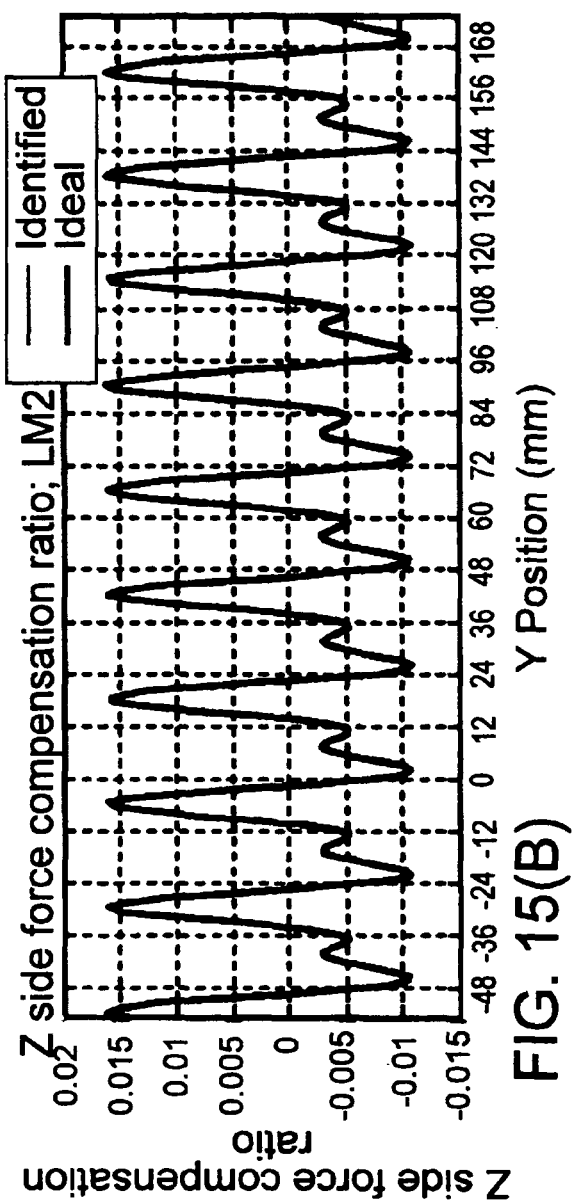
FIG. 15(A)
FIG. 15(B)

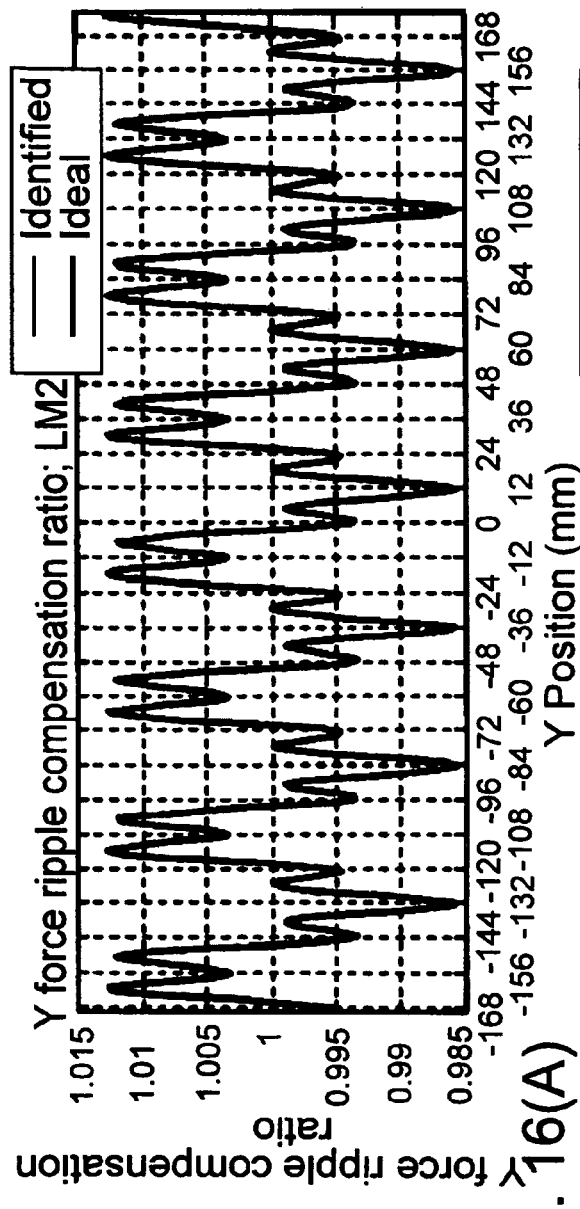
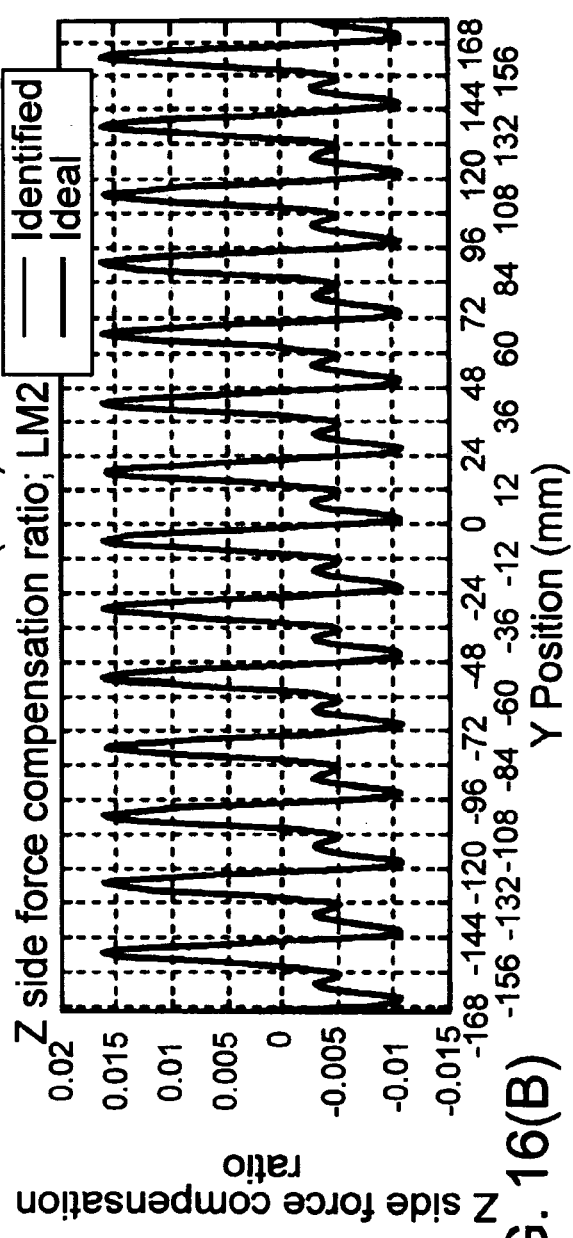
FIG. 16(A)
FIG. 16(B)

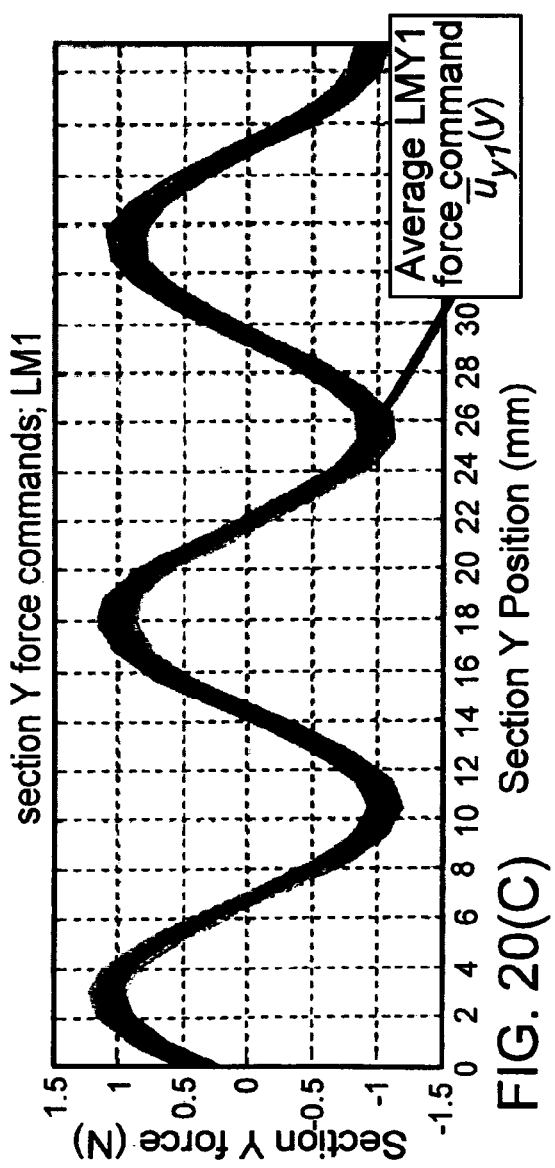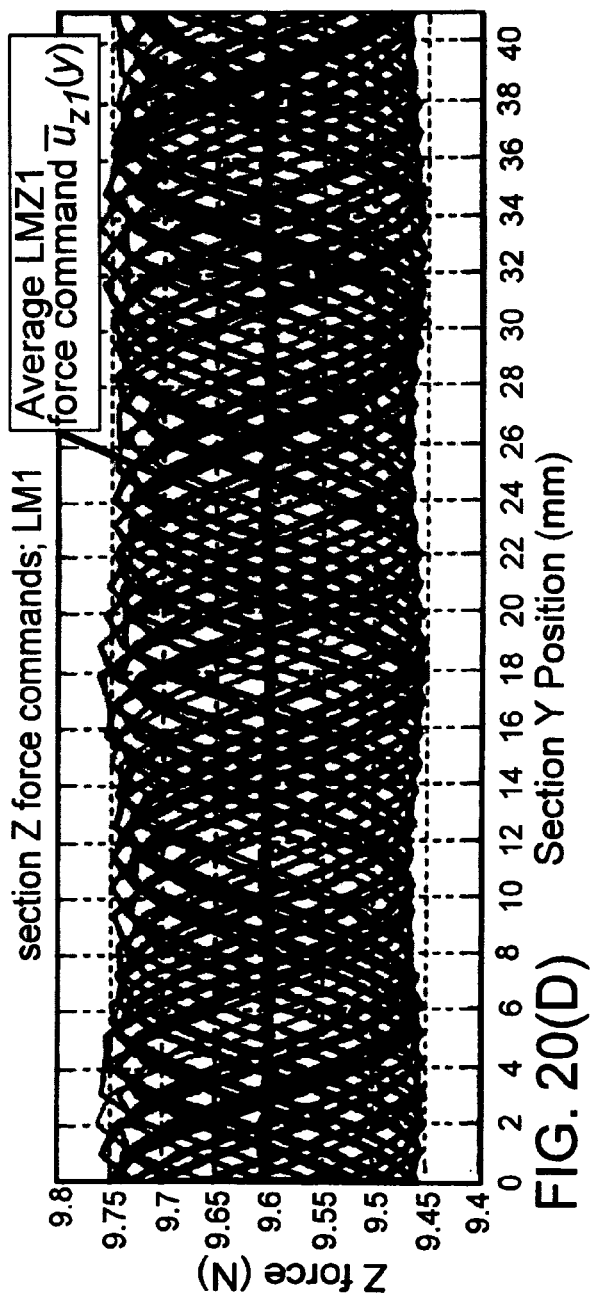
FIG. 20(C)
FIG. 20(D)

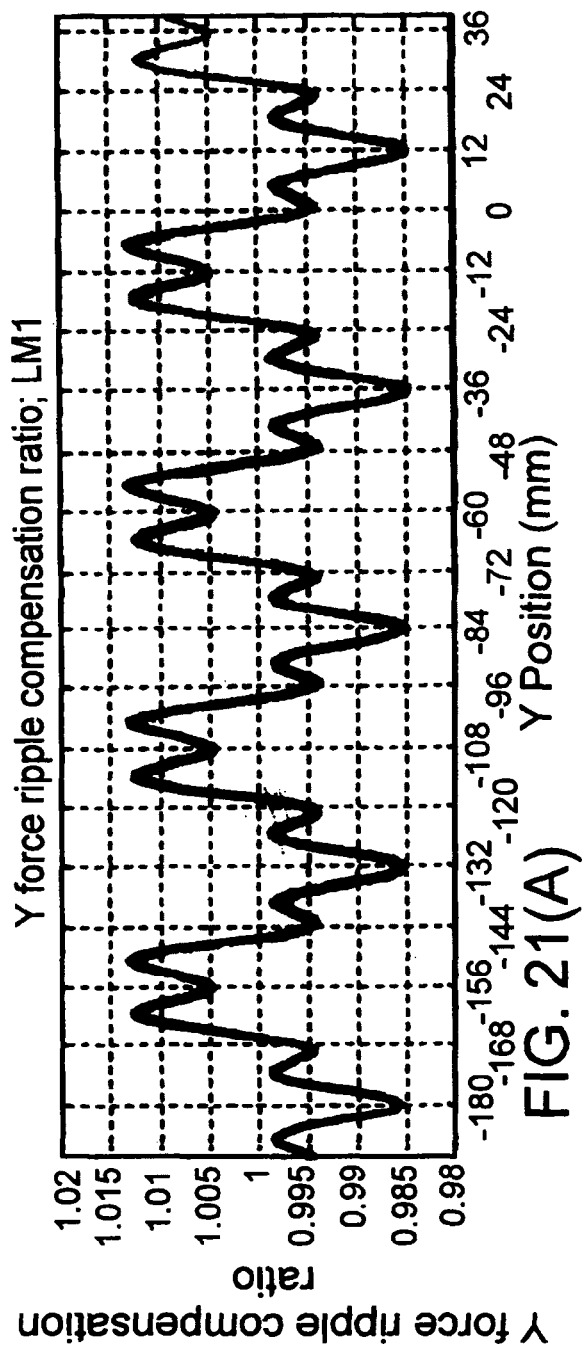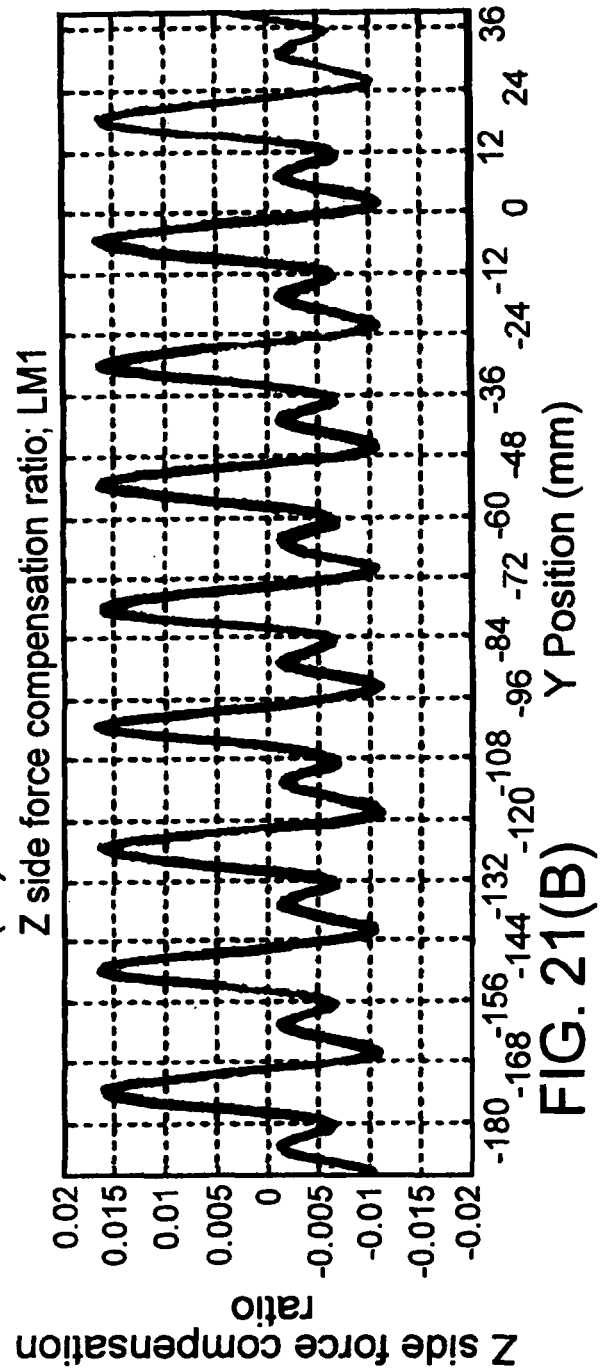

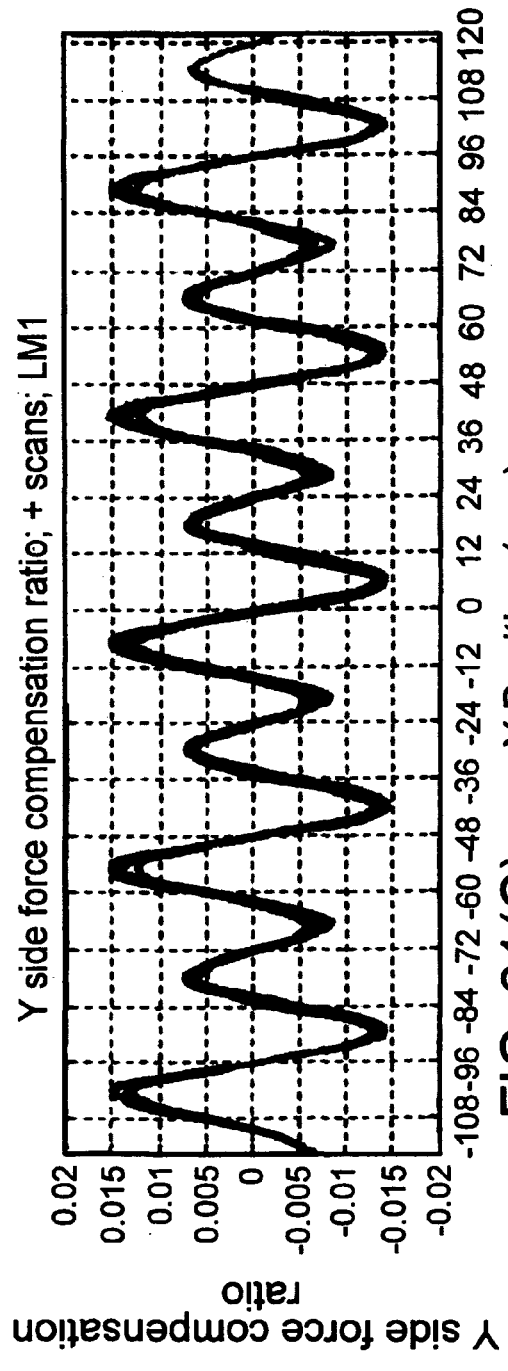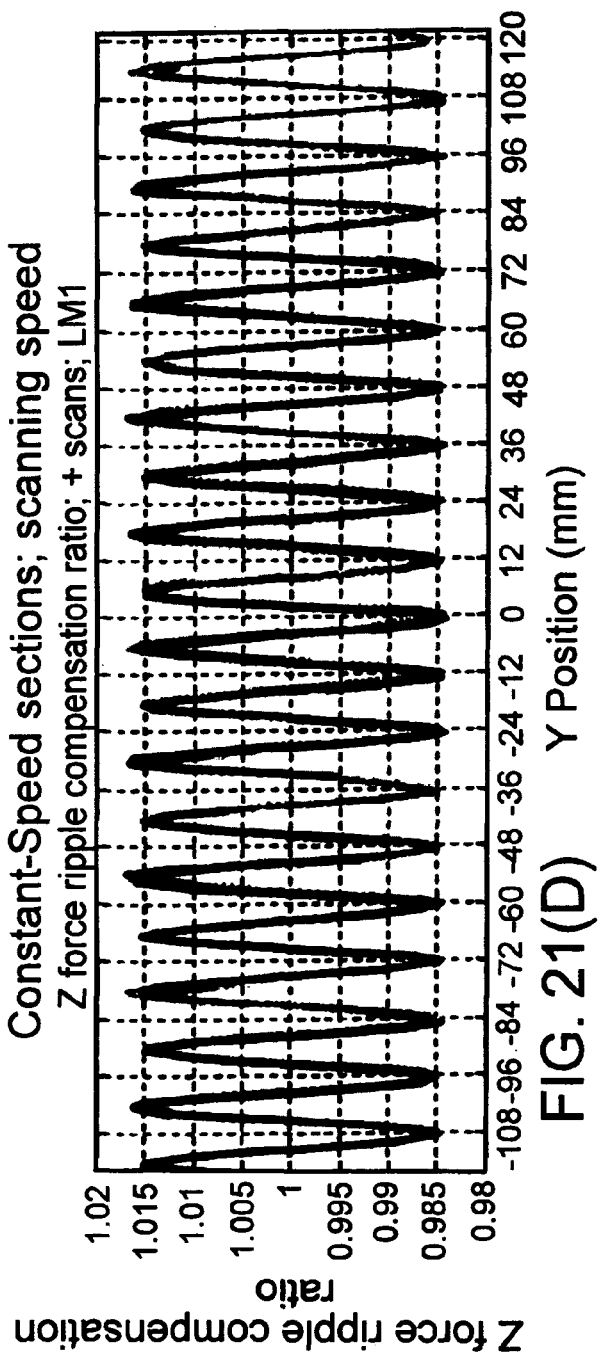

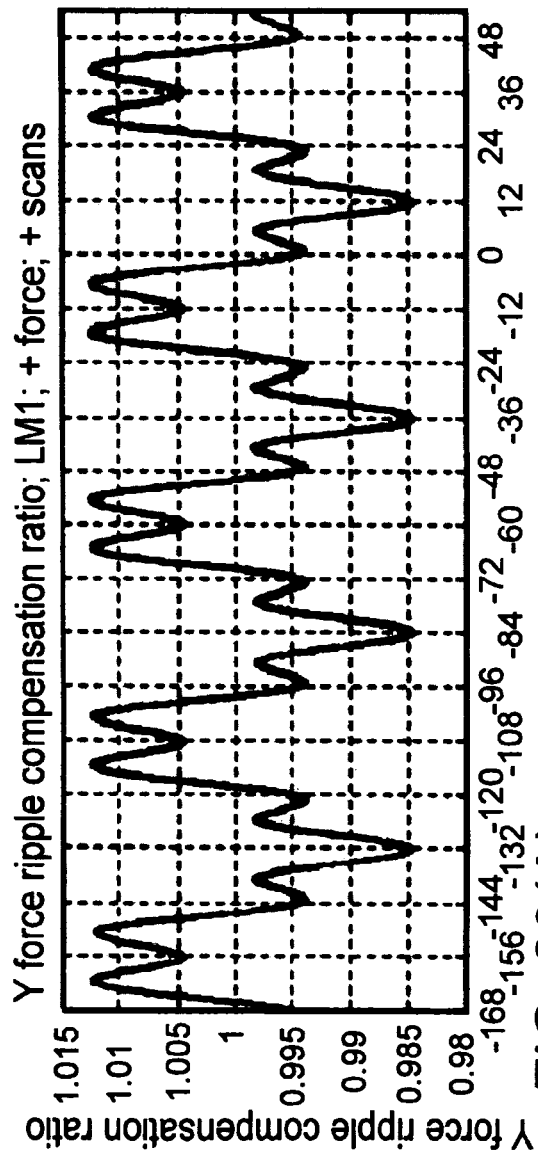
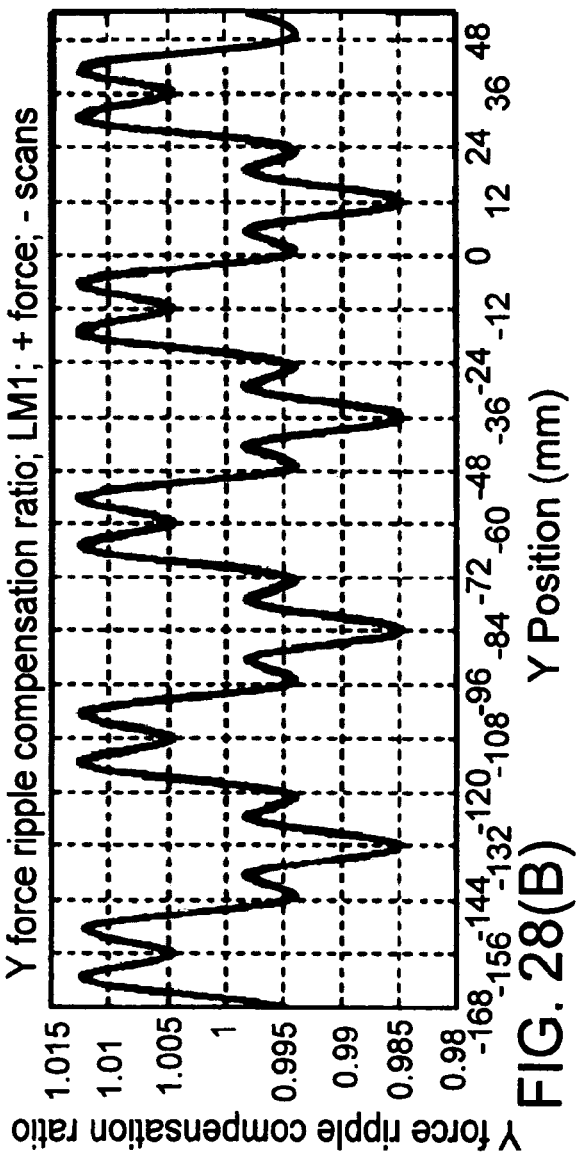

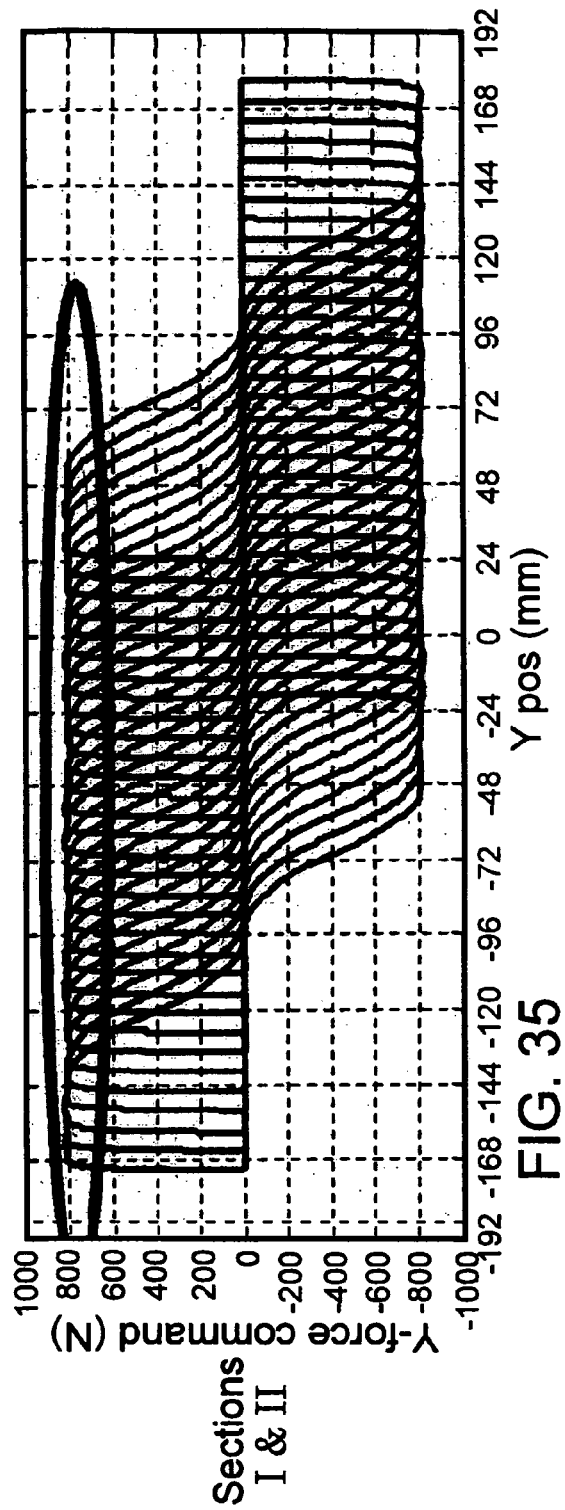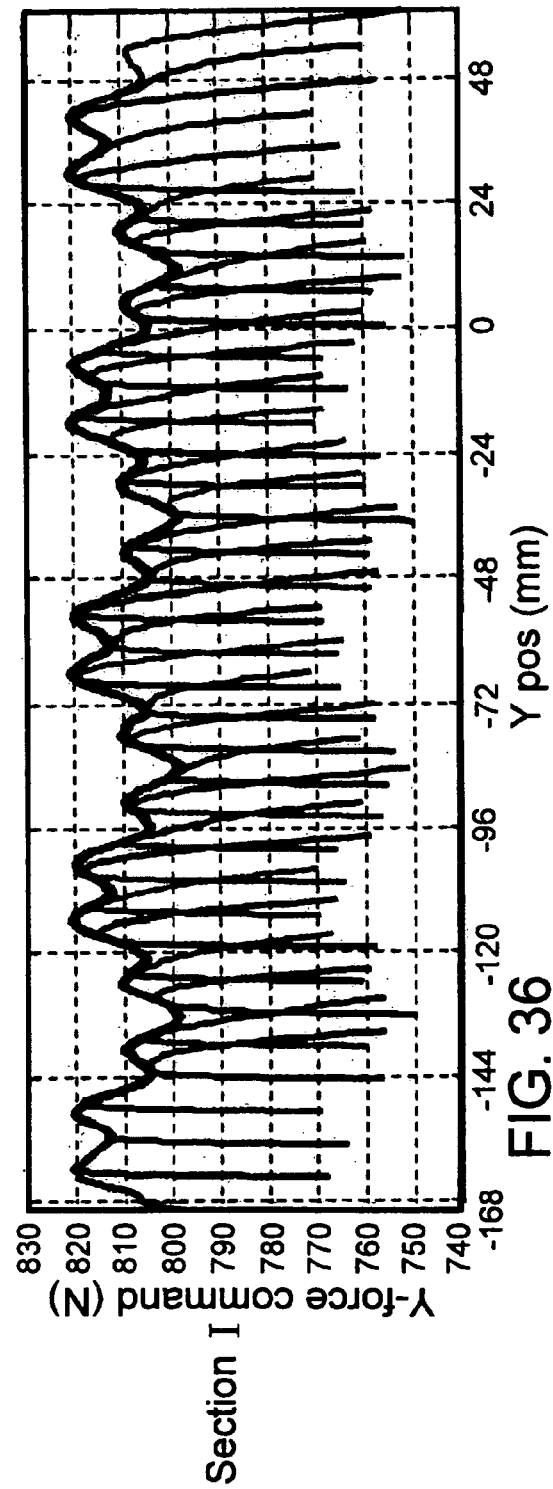

Section I

Section I

ON-MACHINE METHODS FOR IDENTIFYING AND COMPENSATING FORCE-RIPPLE AND SIDE-FORCES PRODUCED BY ACTUATORS ON A MULTIPLE-AXIS STAGE

PRIORITY CLAIM

This application claims priority to, and the benefit of, U.S. Provisional Application No. 60/925,235, filed on Apr. 18, 2007, which is incorporated herein by reference in its entirety.

FIELD

This disclosure relates to, inter alia, electromagnetic actuators, and more particularly but not exclusively to precision control of electromagnetic actuators of the types known as "linear actuators" and "planar actuators." An example of the former is a linear motor, and an example of the latter is a planar motor.

BACKGROUND

Modern microlithography systems and other systems that require extremely accurate positioning of workpieces typically employ stages to hold and move the workpieces. For example, a microlithography system usually employs a stage for the lithographic substrate (e.g., semiconductor wafer, glass plate, or the like). If the lithography is performed based on a pattern defined by a reticle, then the microlithography system generally also includes a reticle stage. These stages generally provide motions in multiple orthogonal axes (x-, y-, z-directions), and may also include one or more tilting motions ($\theta_x$, $\theta_y$, $\theta_z$). To meet current demands of accuracy and precision of stage motion, linear actuators are frequently used for producing stage motions. An exemplary linear actuator is a linear motor. Another type of electromagnetic actuator that can be used is a planar actuator such as a planar motor.

A typical linear actuator includes a stationary member and a moving member that moves relative to the stationary member. In linear motors one of these members comprises a plurality of permanent magnets arranged in a generally linear array along a principal axis of travel (principal "stroke axis") of the actuator. The magnets are typically arranged with adjacent magnets having alternating polarity. The other member comprises an array of one or more electrical windings or "coils." Either member can be the coil array or the magnet array. The magnetic fields produced by the magnet array interact with magnetic fields produced by electrical current flowing in the coil array to impart a linearly translational force to the moving member relative to the stationary member along the principal stroke axis. To a first approximation, this output force in the principal stroke axis is substantially linearly proportional to the current through the coil array.

Planar motors are types of linear actuators that produce movement within a defined plane, such as an x-y plane. Planar actuators have certain features that are similar to corresponding features in linear actuators. For example, in many planar motors, multiple permanent magnets are arranged in a two-dimensional array (rather than a one-dimensional array) on a platen serving as the stationary member, with a coil assembly serving as the moving member that moves relative to the stationary member. Planar actuators provide motion along a second orthogonal axis in addition to motion along a first orthogonal axis. Hence, a planar actuator may have, for example, more than one principal stroke axis. Since a planar motor produces movement in at least two dimensions, it also can be used to produce movement in one dimension (e.g., x- or y-axis).

Certain linear actuators provide motion along a second axis in addition to motion along the principal stroke axis. This second-axis motion is usually limited in range compared to motion along the principal stroke axis. These types of linear actuators thus provide motions in two degrees of freedom and are called herein "2DOF" linear actuators. An exemplary 2DOF linear actuator has a principal stroke axis in the y-direction and also provides motion along the z-axis. Motion in the y-direction results from a y-force-command ($u_y(y)$) to the actuator that produces a y-direction output force $F_y(y)$. Similarly, motion in the z-direction results from a z-force-command ($u_z(y)$) to the actuator that produces a z-direction output force $F_z(y)$.

With electromagnetic actuators, force-commands for motions in particular respective directions do not result only in motions of the moving member in the particular desired directions; the moving member usually also experiences additional forces. These additional forces are usually relatively small, but in some applications they can have a significant adverse impact on the accuracy and precision of motion and positioning produced by the actuator. One of these additional forces is called "force-ripple," which is a periodic variation in the force output to the moving member in the direction (e.g., the principal stroke direction) corresponding to the force-command. Force-ripple arises from any of several various causes such as irregularities and imperfections in the magnets, the coils, or other aspects of the actuator's construction. Another of these additional forces is called "side-force," which is a periodic variation in the force output to the moving member in a direction that is normal to the direction corresponding to the force-command. Side-force results from magnetic-field interactions similar to those that cause force-ripple. Force-ripple and side-force can be manifest in each stroke direction of the linear actuator. For example, a 2DOF linear actuator having y- and z-stroke axes may exhibit respective force-ripple and side-force associated with each stroke direction.

The magnitude of these additional forces usually varies with position of the moving member, even if a constant current is being supplied as a force-command to the coil(s). In some applications, the impact of these additional forces is negligible. In other applications, such as certain microlithography-stage applications, these additional forces can cause significant problems in achieving imaging accuracy and fidelity.

Spatial control of the moving member of an actuator, and thus of a stage moved by the moving member, could be improved by identifying and compensating for force-ripple and side-forces. Some OEM suppliers of linear actuators, for example, address this issue by providing, for each actuator, a map of force-ripple and/or side-force as a function of position of the moving member in the principal stroke direction. The end-user of the actuator can utilize the map to supply current to the coil array in a controlled manner that provides at least some offset to the force-ripple and/or side-force. In the map, each of a series of positions of the moving member in the principal stroke direction is associated with a respective offset of the respective force-ripple and/or side-force at the position. These maps, if provided, are conventionally produced during testing of the newly manufactured actuators by the manufacturer in a standard test environment. A disadvantage of these maps is that they are produced only at the time of manufacture of the respective actuators. The maps do not, and cannot, reflect variables introduced during actual installation and use of the actuators. Also, performance parameters of electromagnetic actuators usually change (e.g., drift) over time. These drifts and changes eventually render useless any compensations based on map data obtained when the actuators were new.

Therefore, there is a need for methods for identifying and compensating force-ripples and side-forces in electromagnetic actuators that can be performed substantially at any time, particularly in situ.

SUMMARY

The foregoing need is addressed by methods as disclosed herein.

This invention is directed to, inter alia, determining and applying force calibrations and compensations to actuators, including linear actuators configured for motions in more than one DOF and including planar actuators.

By way of example, a 2DOF linear actuator can be configured to respond to both y-direction force-commands and z-direction force-commands. The respective actuation forces produced by these commands can be accompanied by force-ripple and side-forces as described in Equation (1):

$$\begin{pmatrix} F_y(y) \\ F_z(y) \end{pmatrix} = \begin{pmatrix} g_{yy}(y) & g_{zy}(y) \\ g_{yz}(y) & g_{zz}(y) \end{pmatrix} \begin{pmatrix} u_y(y) \\ u_z(y) \end{pmatrix} \quad (1)$$

In Equation (1), $g_{yy}(y)$ denotes y-direction force-ripple, mapping from the y-direction force-command $u_y(y)$ to the resulting y-direction output force $F_y(y)$; $g_{yz}(y)$ denotes the z-direction side-force, mapping from the y-direction force-command $u_y(y)$ to the resulting z-direction output force $F_z(y)$; $g_{zy}(y)$ denotes the y-direction side-force, mapping from the z-direction force-command $u_z(y)$ to the resulting y-direction output force $F_y(y)$; and $g_{zz}(y)$ denotes the z-direction force-ripple, mapping from the z-direction force-command $u_z(y)$ to the resulting z-direction output force $F_z(y)$. In the absence of compensation, this actuator may have, for example, position-dependent y- and z-force actuations accompanied by cross-coupling z- and y-direction side-forces. If more than one linear actuator is used for producing motion in the same direction, then contributions of side-force and force-ripple to a particular linear actuator may come from the other linear actuator(s).

This invention provides, inter alia, methods for calibrating and compensating these actuators "on-machine" (i.e., in situ on a system, such as a microlithography system, in which the actuators have been incorporated). As a result of such calibrations, which can be performed at any desired time, 2DOF actuators produce, for example, only independent y- and z-direction actuation forces without significant respective force-ripple or respective side-force. An exemplary on-machine method provides a compensation matrix C for the force-commands, as set forth in Equation (2):

$$\begin{pmatrix} F_y(y) \\ F_z(y) \end{pmatrix} = \begin{pmatrix} g_{yy}(y) & g_{zy}(y) \\ g_{yz}(y) & g_{zz}(y) \end{pmatrix} \begin{pmatrix} c_{yy}(y) & c_{zy}(y) \\ c_{yz}(y) & c_{zz}(y) \end{pmatrix} \begin{pmatrix} u_y(y) \\ u_z(y) \end{pmatrix} \quad (2)$$

The compensation matrix is approximately the inverse of the actuation matrix, $$\begin{pmatrix} c_{yy}(y) & c_{zy}(y) \\ c_{yz}(y) & c_{zz}(y) \end{pmatrix} \cong \begin{pmatrix} g_{yy}(y) & g_{zy}(y) \\ g_{yz}(y) & g_{zz}(y) \end{pmatrix}^{-1} \quad (3)$$

and the output force is approximately equal to the force-command:

$$\begin{pmatrix} F_y(y) \\ F_z(y) \end{pmatrix} \cong \begin{pmatrix} u_y(y) \\ u_z(y) \end{pmatrix} \quad (4)$$

According to one aspect, methods are provided for identifying a position-dependent compensation ratio for one or more actuators of a set of actuators. In an embodiment, a movable member is displaced by a selected one or more of the actuators of the set. The displacement is a predetermined increment in a range of motion of the selected actuator(s), and multiple displacements are made, each from a respective starting position in the range. Each displacement is of a predetermined trajectory involving at least multiple acceleration sections (e.g., acceleration forward, zero acceleration, acceleration backward, and stop). The trajectory also can include sections of substantially constant velocity. From each displacement, position and corresponding force-command data associated with acceleration and deceleration sections are obtained and are used to determine respective section force-commands. A "map" of force-commands versus position is obtained by assembling the individual force-command data. The section force-commands are normalized to a reference section force-command (e.g., by dividing each section force-command by the reference-section force-command) to define respective section compensation ratios. The section compensation ratios are assembled to define a map of compensation ratios for force-ripple and/or side-force throughout the range of motion. The compensation ratios for multiple sections can be combined to produce maps for all +force (including +motion and −motion) or all −force (including +motion and −motion), for example, which in turn can be combined to produce a combined map for all the sections (+force, −force, +motion, −motion) of motion of the actuator. The maps can be used to determine and apply corrected force-commands to the actuator(s) to correct force-ripple and/or side-force.

The movable member can be of, for example, a stage apparatus. The stage apparatus can form a respective part of, for example, a photolithography machine. In this regard, the stage apparatus can be, at least in part, a reticle stage, a wafer stage, and/or a reticle blind, for example.

An average of one or more section force-commands can form the reference-section force-command for the one or more actuators being evaluated. Thus, the reference-section force-command reflects the behavior of the particular actuator(s) being evaluated.

According to a second aspect, methods are provided for deriving a map of force-ripple and/or side-force compensation ratios for a selected one or more actuators over at least a portion of the motion range in one or more degrees of freedom (DOFs) of motion of the actuator(s). An embodiment of this method includes positioning a movable member at a first initial position. Using the actuator(s), the member is displaced over a predetermined trajectory, from the first initial position, within the range of motion of the actuator(s). Multiple trajectories are made, such as in a stroke direction of the actuator(s). The displacement from the first initial position includes at least a respective acceleration section and a respective deceleration section. Upon completing the first displacement, the movable member is positioned at a second initial position and displaced, using the actuator, according to the trajectory. The displacement from the second initial position includes at least a respective acceleration section and a respective deceleration section. From position data obtained during the series of displacements, corresponding acceleration and force-command data are extracted. Position-dependent, section-compensation ratios are defined for each displacement, and the section-compensation ratios are assembled to provide a map of position-dependent compensation ratios for the section throughout the range of motion of the actuator. The section maps can be combined to obtain combination maps for all force sections and motion sections of the trajectory.

Displacing the member can further include actuating at least one actuator coupled to a stage apparatus, wherein the actuator(s) is configured to provide a motive force to the member in at least one DOF. The stage apparatus can be of a type used on a photolithography machine. In this regard, the member can form, at least in part, one or more of a reticle stage, a wafer stage, and a reticle blind.

According to a third aspect, exemplary computing environments are provided. An embodiment of the computing environment includes a computer-readable media that further includes computer-executable instructions that, when executed, cause the computing environment to perform a method for identifying a position-dependent compensation ratio for one or more actuators. The method includes, at least in part, the method described with respect to the second aspect.

According to a fourth aspect, control methods are provided. An embodiment includes defining a force-command for one or more of a set of actuators that movably engage a member of a stage apparatus in at least one DOF. The force-command is corrected with a position-dependent compensation ratio defined, at least in part, by displacing the member throughout a range of motion according to a predetermined trajectory in combination with a plurality of initial positions. The control methods can further include displacing the member according to the corrected force-command applied to the one or more actuators.

As with other aspects, the stage apparatus can form, at least in part, a photolithography machine. The member can form, at least in part, one or more of a reticle stage, a wafer stage, and a reticle blind.

According to a fifth aspect, computing environments that include computer-readable media are described. The computer-readable media further include computer-executable instructions that, when executed, cause the computing environment to perform control methods according to the fourth aspect.

According to a sixth aspect, computer-readable media are disclosed. The computer-readable media include computer-executable instructions that, when executed, cause a computing environment to perform control methods according to the fourth aspect.

According to a seventh aspect, motion-control apparatus are disclosed. Embodiments of the motion control apparatus include at least one actuator and a bus coupled to the actuator. The motion control apparatus further includes a controller coupled to the actuator through the bus. The controller is configured to apply a position dependent compensation ratio to a received force-command. The position dependent compensation ratio is defined, at least in part, according to a method that includes displacing a member throughout a range of motion according to a predetermined trajectory in combination with a plurality of initial positions.

According to an eighth aspect, systems are disclosed. The systems include an exposure apparatus and at least one actuator configured to displace a movable member of the exposure apparatus. The systems also include a bus coupled to the actuator(s) and a controller coupled to the actuator(s) through the bus. The controller is configured to apply a position dependent compensation ratio to a received force-command. The position-dependent compensation ratio is defined, at least in part, according to a method that includes displacing a member throughout a range of motion according to a predetermined trajectory in combination with a plurality of initial positions.

Systems according to the eighth aspect can further include a computing environment coupled to the bus, wherein the computing environment comprises the controller.

Certain embodiments and examples of the invention summarized above and described below rely on the usage of linear actuators. However, it should be understood that the invention may be used with and covers both linear and planar actuators.

The foregoing and additional features and advantages of the invention will be more readily apparent from the following detailed description, which proceeds with reference to the accompanying drawings.

BRIEF DESCRIPTION OF THE DRAWINGS

FIGS. 14(A) and 14(B) are respective combined maps of average compensation ratios for all +force data (including +scan and −scan) for y-force-ripple and z-side-force, respectively, exhibited by LM2. See first representative embodiment. Combining the maps in this way is facilitated by the same position points being used in each.

FIGS. 15(A) and 15(B) are respective combined maps of average compensation ratios for all −force data (including +scan and −scan) for y-force-ripple and z-side-force, respectively, exhibited by LM2. See first representative embodiment.

FIGS. 16(A) and 16(B) are respective combined maps of average compensation ratios for both +force and −force data (including +scan and −scan) for y-force-ripple and z-side-force, respectively, exhibited by LM2. See first representative embodiment.

FIGS. 20(A) and 20(B) provide plots of corresponding y-force-commands (producing y-force-ripple) and z-force-commands (producing z-side-force), respectively, as functions of y-position. These force data were obtained from respective high-acceleration (and thus +force) sections of the acceleration profile to obtain the best signal-to-noise ratios (208 of FIG. 17). See second representative embodiment. Note plots of average position-dependent force-commands $\bar{u}_{y1}(y)$ in FIG. 20(A) and $\bar{u}_{z1}(y)$ in FIG. 20(B) (210 in FIG. 17).

FIGS. 20(C) and 20(D) provide plots of corresponding y-force-commands (producing y-side-force) and z-force-commands (producing z-force-ripple), respectively, as functions of y-position. See second representative embodiment. These force data were obtained from respective constant-velocity sections of the acceleration profile. Note plots of average position-dependent force-commands $\bar{u}_{y1}(y)$ in FIG. 20(C) and $\bar{u}_{z1}(y)$ in FIG. 20(D) (210 in FIG. 17).

FIGS. 21(A)-21(D) are respective plots of position-dependent compensation ratios determined from the average force-command data in FIGS. 20(A)-20(D), respectively (212 in FIG. 17).

FIGS. 28(A) and 28(B) are plots of compensation ratios that can be applied to the linear-motor force-commands for force-ripple compensations, for data of +scans and −scans, respectively, as described in the fourth representative embodiment.

FIG. 35 is a superimposed plot of the plurality of actuator force-commands directed toward moving a member through sections I and II of the trajectory of FIGS. 25(A)-25(B) for various initial positions, as described in the Example.

FIG. 36 is a continuous plot of truncated portions of extracted force-command sections corresponding to each initial position and section I of the trajectory of FIG. 25(B). The extracted force-commands of FIG. 36 include portions of the data of FIG. 35 located within the horizontal ellipse.

DETAILED DESCRIPTION

The following detailed description describes, inter alia, methods and computing environments for deriving and using one or more compensation ratios for one or more linear actuators. Also disclosed are several exemplary embodiments that are not intended to be limiting in any way.

The following makes reference to the accompanying drawings that form a part hereof, wherein like numerals designate like parts throughout. The drawings illustrate specific embodiments, but other embodiments can be formed and structural and/or logical changes can be made without departing from the intended scope of this disclosure. For example, directions and references (e.g., up, down, top, bottom, left, right, rearward, forward, etc.) may be used to facilitate discussion of the drawings but are not intended to be limiting. Further, some embodiments of processes discussed below can omit elements shown, combine two or more discretely illustrated elements in a single step, and/or include additional processing. Accordingly, the following detailed description shall not to be construed in a limiting sense and the scope of property rights sought shall be defined by the appended claims and their equivalents.

Certain embodiments and examples of the invention described below rely on the usage of linear actuators. However, it should be understood that the invention may be used with and covers both linear and planar actuators.

Stage Apparatus

Figure 1A:
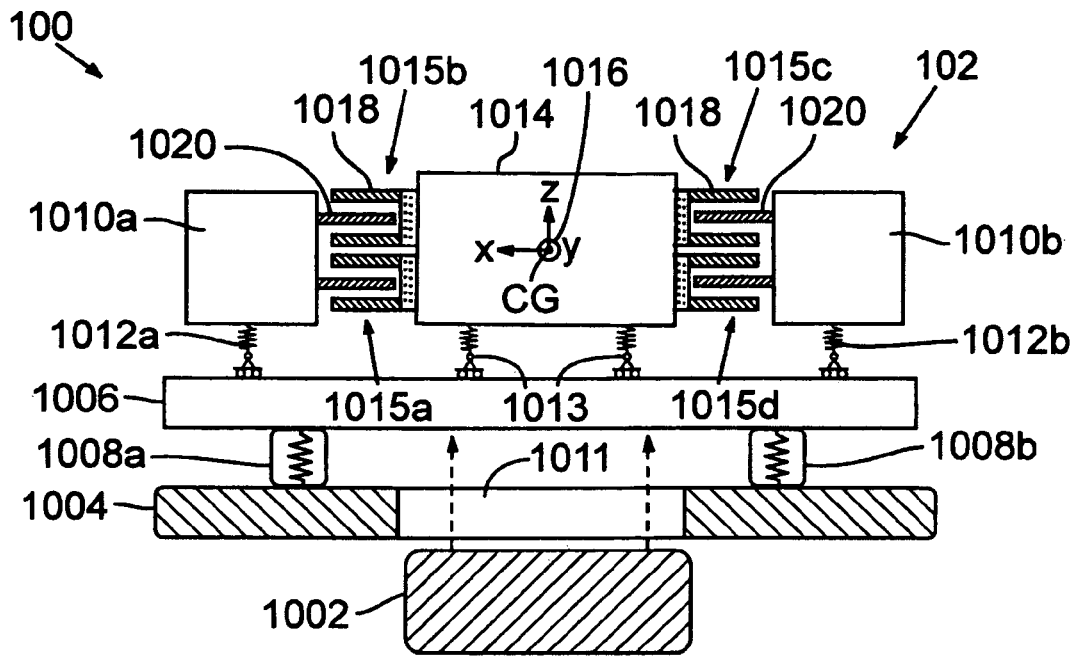
FIG. 1(A) is a schematic elevational view of a first embodiment of a stage apparatus comprising multiple (four) linear actuators, as exemplary electromagnetic actuators, that redundantly provide motion of a movable member in at least one stroke direction. These linear actuators can have one DOF each or multiple DOFs each.

Although many embodiments of stage apparatus are possible, an exemplary embodiment of a stage apparatus is described, by way of introduction, with reference to FIG. 1(A). FIG. 1(A) illustrates a schematic diagram of a portion of an exemplary photolithography machine 100 including a stage 102 comprising a movable member 1014. The stage 102 can be any of various types of stages, although with reference to the currently described photolithography machine 100 the stage 102 can be a reticle stage, a wafer stage, or a reticle blind. The stage 102 comprises multiple linear actuators 1015a-1015d for moving and positioning the member 1014 relative to a base member 1006. The linear actuators 1015a-1015d can be 1DOF linear actuators, providing the stage 102 with a principal stroke direction in the y-direction, for example. Alternatively, the linear actuators 1015a-1015d can be multiple DOF linear actuators (providing motion in, e.g., the y- and z-directions, in which case the linear actuators are 2DOF linear actuators).

The configuration in FIG. 1(A) includes an optical system 1002 that directs incident light through an aperture 101 in a frame 1004. The base member 1006, characterized by having large mass, is coupled to the frame 1004 by a vibration-isolation system 1008 (e.g., an active vibration-isolation system, or "AVIS"). The vibration-isolation system 1008 is schematically represented by a spring, in reference to a mechanical-vibration model of the coupling provided by the vibration-isolation system 1008 between the base member 1006 and the frame 1004.

The stage 102 includes symmetric counter-masses 1010a-1010b disposed on flanking sides of the movable member 1014. (Alternatively, the counter-masses 1010a-1010b can be combined into a single body.) The counter-masses 1010 and the member 1014 are movably engaged with respect to each other via the linear actuators 1015a-1015d.

The illustrated embodiment comprises four linear actuators 1015a-1015d. Each linear actuator 1015a-1015d comprises a respective first member 1020 and a respective pair of second members 1018. The second members 1018 are disposed on opposing sides of the respective first member 1020. In this embodiment two first members 1020 (of the actuators 1015a, 1015b) are coupled to one of the counter-masses 1010a, and the other two first members 1020 are coupled to the other counter-mass 1010b. The second members 1018 are coupled to respective flanking sides of the movable member 1014. Thus, the linear actuators 1015a-1015d and counter-masses 1010a-1010b are placed symmetrically with respect to the center of gravity CG in the z-direction and in the y-direction. This symmetrical arrangement relative to the movable member 1014 results in motive force being applied, collectively by the four linear actuators 1015a-1015d, to the center of gravity CG of the movable member.

In an alternative configuration, the first members 1020 are coupled to the movable member 1014, and the second members 1018 are coupled to respective the counter-masses 1010. In some embodiments, the first member 1020 comprises a linear-motor coil array, and each second member 1018 comprises an array of permanent magnets. In other embodiments, the first member 1020 comprises a respective array of permanent magnets, and each second member 1018 comprises a respective linear-motor coil array. These alternative configurations also are symmetrical, resulting in application of motive force to the center of gravity of the movable member 1014.

In the FIG. 1(A) embodiment, application of electrical current to the coil arrays of the linear actuators 1015a-1015d generates motive forces between the first members 1020 and the respective second members 1018. With reference to the coordinate system 1016 for the movable member 1014, the motive force has a primary component along the y-axis (e.g., into or out of the x-z plane). Hence, the y-direction is a principal stroke direction of this embodiment. The y-direction motive force also has secondary components along the z-axis and along the x-axis. Either of these secondary-force components can be referred to as a respective "side-force," wherein "z-side-force" refers to a secondary-force component along the z-axis and "x side-force" refers to a secondary force component along the x-axis. The motive force also includes force-ripple that occurs along the y-axis.

Displacements of the movable member 1014 and of the counter-masses 1010 result from the combined motive forces generated by the linear actuators 1015a-1015d. The counter-masses 1010 and movable member 1014 are supported by air bearings 1012a-1012b, 1013, respectively, relative to the base member 1006. Each air bearing 1012a-1012b, 1013 is schematically depicted as a frictionless roller and spring (in reference to its modeled behavior for predicting mechanical response of the stage apparatus 102). The air bearings 1012a-1012b, 1013 exhibit low friction in the x-y plane and generally act as springs with respect to displacement along the z-axis. Thus, the displacement of the movable member 1014 and counter-masses 1010a-1010b is relative to the base member 1006. This displacement can be rotational and/or translational, depending upon the respective contribution by each linear actuator 1015a-1015d relative to the contributions of the others. Each linear actuator 1015a-1015d produces motion in response to a respective "force-command" of electrical current supplied to its coil arrays. Thus, the force-commands are effectively control signals for the respective linear actuators 1015a-1015d, and are generally proportional to the motive force produced by the respective actuators.

Displacements of the movable member 1014 and of the counter-masses 1010a-1010b are generally in opposite directions in the principal stroke direction, relative to a fixed coordinate system. In other words, motion of the counter-masses 1010a-1010b is reactionary to motion of the movable member 1014. These relative motions are facilitated by the counter-masses 1010a-1010b and member 1014 being coupled to the stage apparatus 102 in an extremely low-friction manner, such as using air bearings. In the principal stroke direction, the ratio of stroke, or linear displacement, of the counter-masses 1010 to the corresponding stroke of the movable member 1014 is approximately inversely proportional to the ratio of total mass of the counter-masses 1010a-1010b to the mass of the movable member 1014. In other words, the relationship between the stroke of each component and the mass of each component can be roughly approximated by:

$$\frac{s_{member}}{s_{cm}} = \frac{m_{cm}}{m_{member}}, \quad (5)$$

where $$\frac{s_{member}}{s_{cm}}$$

represents the ratio of the stroke of the movable member 1014 to the stroke of the counter-masses 1010a-1010b, and $$\frac{m_{cm}}{m_{member}}$$

represents the ratio of the mass of the counter-masses to the mass of the movable member 1014.

Figure 1B:
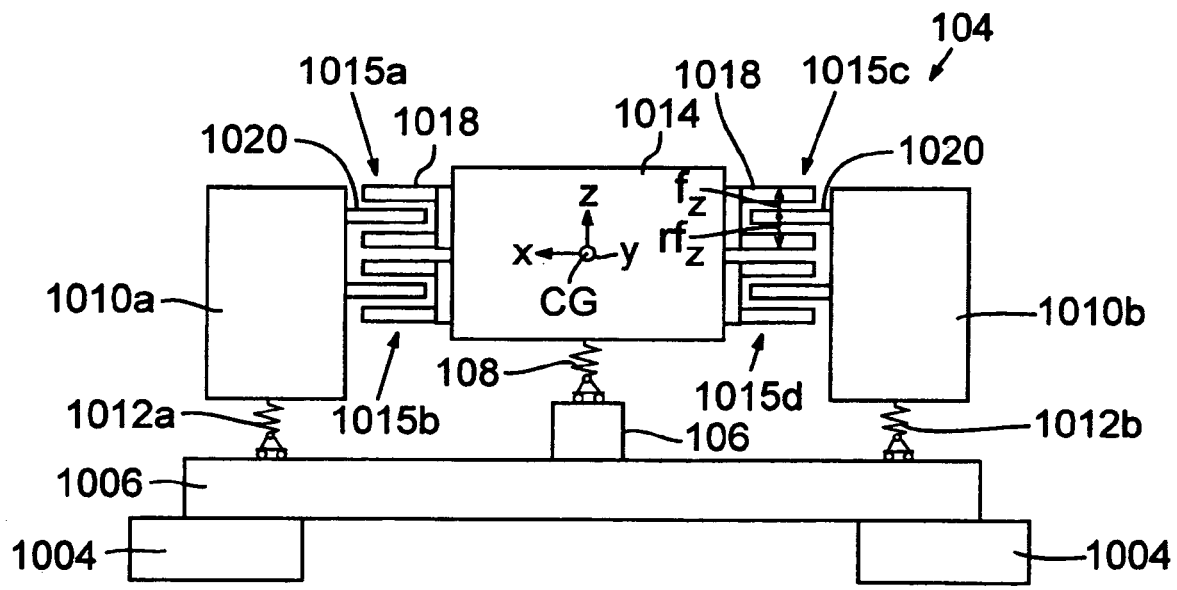
FIG. 1(B) is a schematic elevational view of a second embodiment of a stage apparatus comprising multiple (four) 2DOF linear actuators that redundantly provide motion in at least two directions.

An alternative embodiment of a stage apparatus 104 is shown in FIG. 1(B), in which components that are similar to those shown in FIG. 1(A) have the same reference numerals. Shown are a frame 1004, a base member 1006, a movable member 1014, and counter-masses 1010a-1010b. The movable member 1014 can undergo motions in all six DOFs. The stage apparatus comprises four 2DOF linear actuators 1015a-1015d symmetrically arranged relative to the center of gravity CG of the movable member 1014. Each of the linear actuators 1015a-1015d can separately provide motion in the y- and z-directions, but operate together in a coordinated manner to apply forces to the movable member 1014 sufficient for achieving motion thereof in the y, z, $\theta_x$, $\theta_y$, and $\theta_z$ directions as required. The y-direction motion has the largest range in this embodiment and is hence the principal stroke direction. An example force $f_z$ in the +z-direction is shown associated with the linear actuator 1015c, along with the corresponding reaction force $rf_z$ on the counter-mass 1010b. Respective forces for motions in the x-direction are provided by a separate 1DOF actuator, not shown. The stage apparatus 104 includes position sensors (not shown) situated and configured to measure displacements of the movable member 1014 in all six DOFs.

Between the movable member 1014 and the base 1006 is an anti-gravity device 106. The anti-gravity device 106 comprises a 1DOF stage (not detailed) that supports most to substantially all of the mass of the movable member 1014 and attached portions of the linear actuators 1015a-1015d. Thus, the magnitudes of static forces that must be produced in the z-direction by the four 2DOF linear actuators 1015a-1015d to support the mass of the movable member 1014 are substantially reduced compared to the embodiment of FIG. 1(A). It will be understood that the anti-gravity device 106 is not required; rather, it is an optional component having particular utility for reducing the z-force requirement imposed on the linear actuators 1015a-1015d.

The FIG. 1(B) embodiment also includes air bearings 1012a-1012b between the counter-masses 1010a-1010b and the base member 1006. An additional air bearing 108 is situated between the antigravity device and the movable member 1014. Note the absence of air springs between the base member 1006 and frame 1004 (compare to FIG. 1(A)). Also note the absence of an air spring between the movable member 1014 and the base member 1006, and the absence of AVIS devices.

Figure 2:
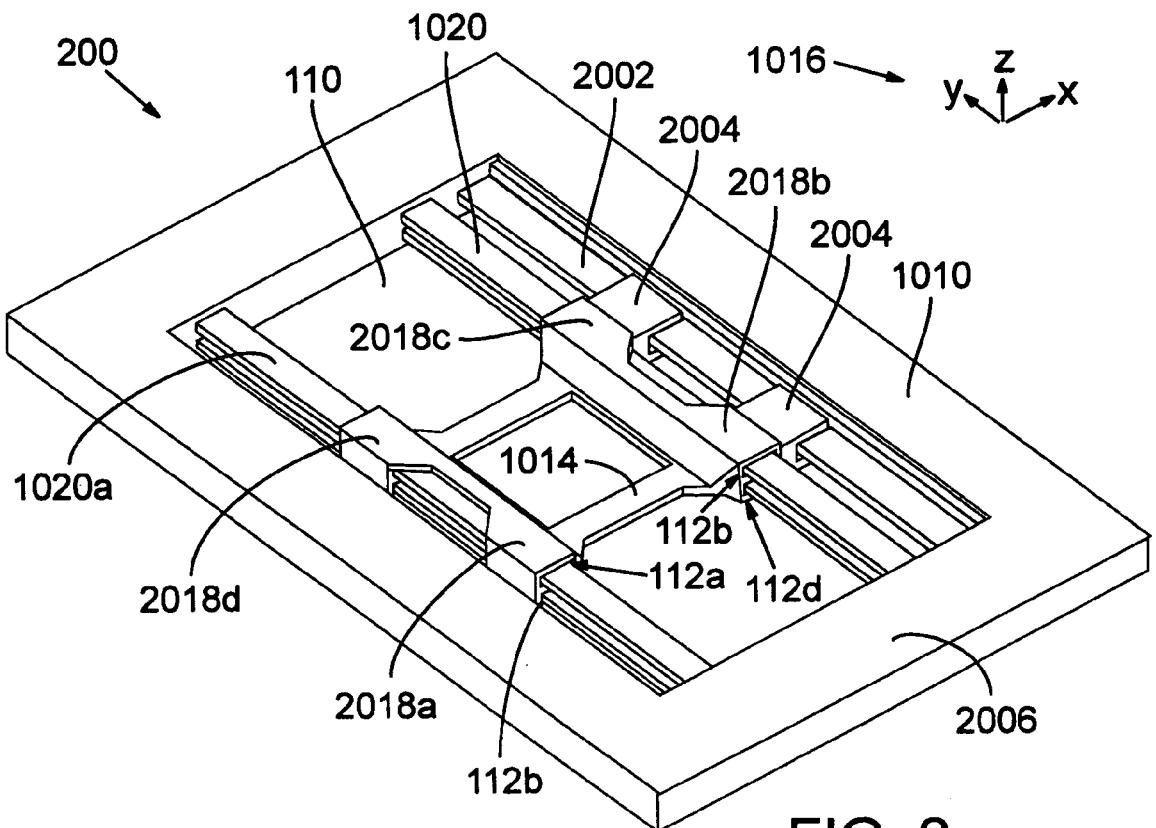
FIG. 2 is a perspective view of a stage and counter-mass assembly, such as might be employed in a stage apparatus according to FIG. 1(A) or FIG. 1(B).

Although many different configurations of stage and counter-mass assembly are possible, an exemplary embodiment is shown in FIG. 2, which illustrates a perspective view of an assembly schematically represented by either of FIGS. 1(A) and 1(B). The counter-mass 1006 of FIG. 2 is configured as a rectangular member, similar to a picture frame. Extending in the y-direction across an interior region 110 defined by the counter-mass 1010 are respective first members 1020a of linear actuators 112a-112b and respective first members 1020b of linear actuators 112c-112d. A movable member 1014 extends between the first members 1020a-1020b. The movable member 1014 incorporates four pairs of linear-actuator second members 1018a-2018d disposed near respective outer corners of the movable member 1014. The arrangement of the first members 1020a-1020b and second members 2018a-2018d relative to the center of gravity of the movable member 1014 is symmetrical, which is desirable for achieving, inter alia, controlled y-direction motion as well as stable $\theta_z$ control of the movable member 1014. The embodiment of FIG. 2 also includes a linear actuator to provide displacement of the movable member 1014 along the x-axis. The x-axis linear actuator includes a stator 2002 and a pair of movers 2004.

Alternative configurations of the second members 2018a-2018d are possible. For example, a first pair of second members 1018a and 1018d and a second pair of second members 1018b and 1018c can be elongated along the y-axis (of the reference frame 1016) and combined to form a single pair of second members disposed on flanking sides of the movable member 1014.

Mechanical Response of Stage Apparatus

Figure 3:
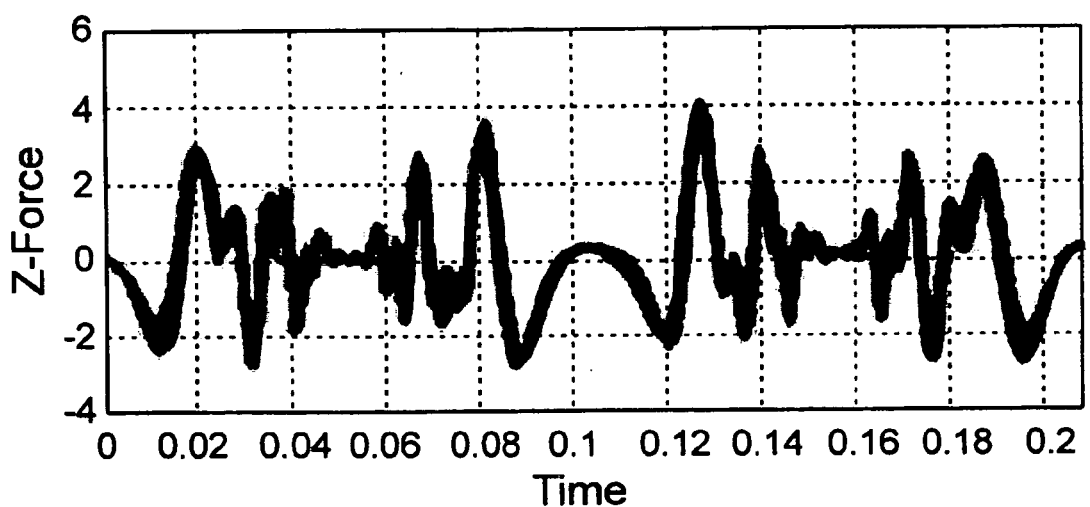
FIG. 3 is a representative plot of transient side-force (z-force) variation versus time for a linear actuator undergoing a trajectory similar to that depicted in FIGS. 25(A)-25(B).

In addition to desired motions along respective stroke axes, a stage apparatus with a movable member displaced by electromagnetic actuator(s) will exhibit mechanical vibration responses that are a function of, inter alia, the trajectory of the member, the member's initial position, and characteristics of the actuator(s). Although generally proportional, the relationship between a force-command and a motive force produced by the actuator in response to the command varies in part according to the mechanical-vibration response of the stage apparatus and actuator position within the overall range of motion of the stage apparatus. For example, FIG. 3 illustrates a representative plot of transient side-force variation (in the z-direction) in a linear actuator displacing a movable member through a trajectory in the y-direction. The side-force illustrated in FIG. 3 periodically varies and results from displacing a member through a trajectory similar to that shown by FIG. 6(A). FIG. 3 illustrates that the force-commands applied to a movable member include a combination of position-dependent (e.g., actuator side-force) and time-dependent (e.g., trajectory shape and mechanical vibrations) effects. For particular actuator configurations, separating effects of time-domain vibration response from the physical characteristics of the actuator provides improved control of the location of a movable member associated with the actuator.

Identification and Compensation Methods

In apparatus comprising a movable member and one or more electromagnetic actuators for displacing the movable member, improved control can be exerted over movement and positioning of the movable member by identifying compensating force-commands for force-ripple and/or side-force and employing those compensating force-commands during operation of the actuators. These compensating force-commands can be used in any of various ways. For example, force-ripple and/or side-force effects can be subtracted from force-commands supplied to a linear actuator. Alternatively, where force-ripple and/or side-force are approximately proportional to the supplied force-command, compensation can be achieved by multiplying an uncompensated force-command by the inverse of the force-ripple or side-force ratio. Yet another alternative can utilize a combination of these compensation techniques.

As noted above, a 2DOF linear actuator can be configured to respond to both y-direction force-commands and z-direction force-commands. The respective actuation forces produced by these commands can be accompanied by force-ripple and side-forces as described in Equation (1):

$$\begin{pmatrix} F_y(y) \\ F_z(y) \end{pmatrix} = \begin{pmatrix} g_{yy}(y) & g_{zy}(y) \\ g_{yz}(y) & g_{zz}(y) \end{pmatrix} \begin{pmatrix} u_y(y) \\ u_z(y) \end{pmatrix} \quad (1)$$

In Equation (1), $g_{yy}(y)$ denotes y-direction force-ripple, mapping from the y-direction force-command $u_y(y)$ to the resulting y-direction output force $F_y(y)$; $g_{yz}(y)$ denotes the z-direction side-force, mapping from the y-direction force-command $u_y(y)$ to the resulting z-direction output force $F_z(y)$; $g_{zy}(y)$ denotes the y-direction side-force, mapping from the z-direction force-command $u_z(y)$ to the resulting y-direction output force $F_y(y)$; and $g_{zz}(y)$ denotes the z-direction force-ripple, mapping from the z-direction force-command $u_z(y)$ to the resulting z-direction output force $F_z(y)$. If more than one actuator is used for producing motion in the same direction, then contributions of side-force and force-ripple to a particular linear actuator may come from the other actuator(s).

Methods described herein, in which force-ripple and side-forces (or one of these) are identified and compensated, are advantageous for calibrating electromagnetic actuators for more accurate performance. The methods can be performed "on-machine" (i.e., in situ on a system, such as a microlithography system, in which the actuators have been incorporated). An on-machine method advantageously can be performed any time and as often as desired during the useful life of the machine, rather than only once when the actuators are new and not yet installed in a machine. Thus, an on-machine method reveals the existence and magnitude of drift and other changes in actuator behavior as these changes occur under actual-use conditions.

As a result of such calibrations the actuators produce, for example, only independent y- and z-direction actuation forces without any significant z- or y-direction side-forces and/or force-ripple. An exemplary on-machine method provides a compensation matrix C as used for force-commands, as set forth in Equation (2):

$$\begin{pmatrix} F_y(y) \\ F_z(y) \end{pmatrix} = \begin{pmatrix} g_{yy}(y) & g_{zy}(y) \\ g_{yz}(y) & g_{zz}(y) \end{pmatrix} \begin{pmatrix} c_{yy}(y) & c_{zy}(y) \\ c_{yz}(y) & c_{zz}(y) \end{pmatrix} \begin{pmatrix} u_y(y) \\ u_z(y) \end{pmatrix} \quad (2)$$

The compensation matrix is approximately the inverse of the actuation matrix, $$\begin{pmatrix} c_{yy}(y) & c_{zy}(y) \\ c_{yz}(y) & c_{zz}(y) \end{pmatrix} \cong \begin{pmatrix} g_{yy}(y) & g_{zy}(y) \\ g_{yz}(y) & g_{zz}(y) \end{pmatrix}^{-1} \quad (3)$$

and the output force is approximately equal to the force-command:

$$\begin{pmatrix} F_y(y) \\ F_z(y) \end{pmatrix} \cong \begin{pmatrix} u_y(y) \\ u_z(y) \end{pmatrix} \quad (4)$$

As noted elsewhere herein, stages and related apparatus that operate at extremely high accuracy and precision may utilize multiple actuators for achieving motion in a particular DOF. For example, to achieve motion along the y-axis as a principal stroke axis, two or four linear actuators may be used. These multiple actuators desirably are situated so that their collective motive forces are applied in a symmetrical manner relative to the center of gravity of the movable member of the stage. In another example, to achieve motion along the y-axis, as a principal stroke axis, and along the z-axis using the same linear actuators, four 2DOF linear actuators desirably are situated in a symmetrical manner relative to the y and the z axes. Using multiple linear actuators to achieve motion in a particular DOF is termed "redundancy." The need or desirability for redundancy of linear actuators can be obviated by using at least one planar actuator instead.

Figure 4A:
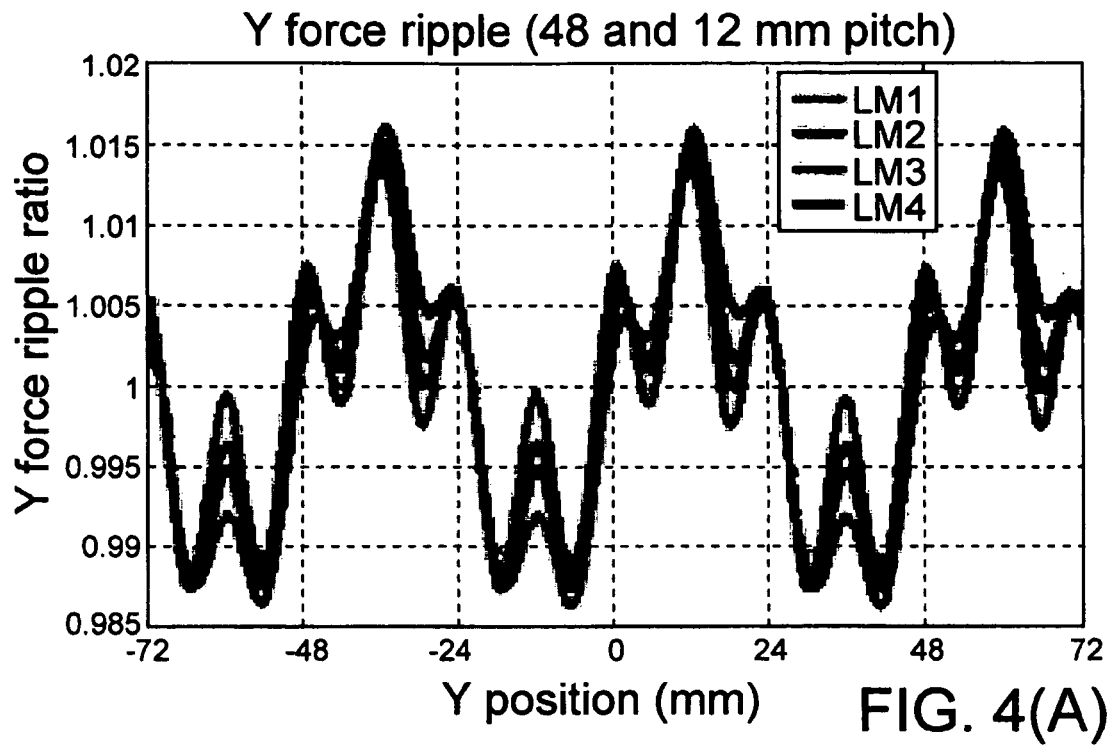
FIG. 4(A) is a plot of y-force-ripple versus y-position, as exhibited by each of four exemplary linear actuators.
Figure 4B:
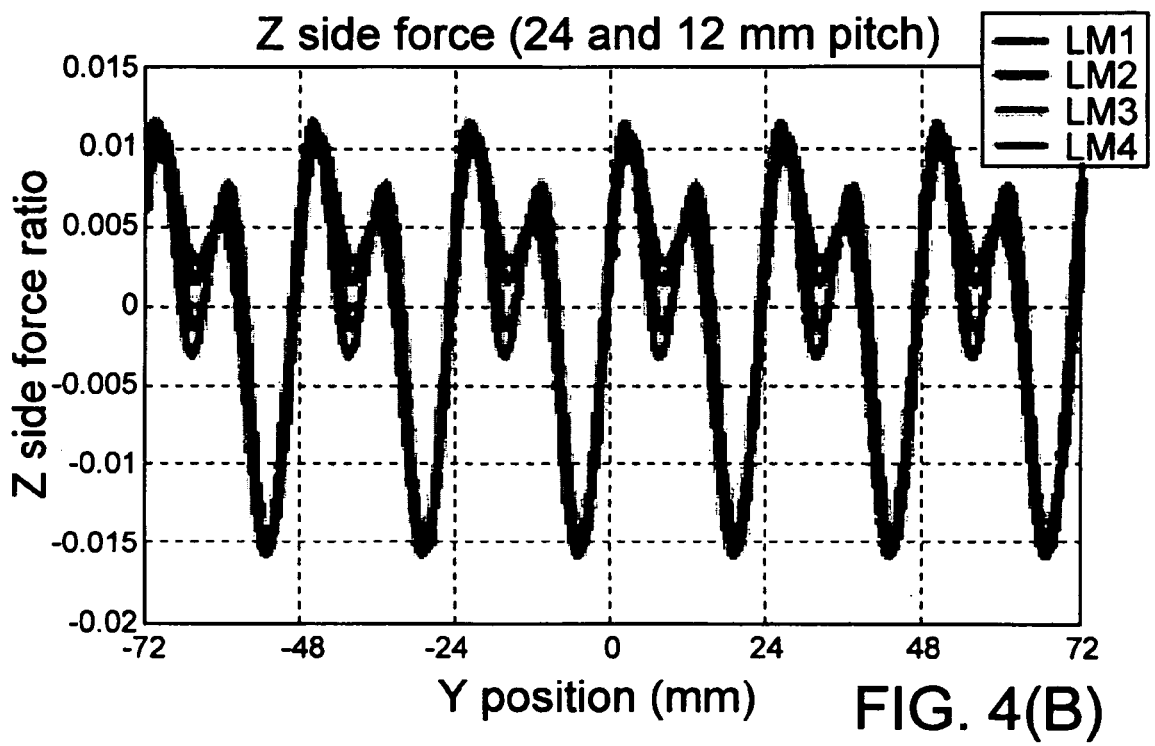
FIG. 4(B) is a plot of z-side-force versus y-position, as exhibited by the exemplary linear actuators that are the subject of FIG. 4(A).

In devices comprising redundant linear actuators, extraneous forces such as force-ripple and side-force are usually not the same from each linear actuator. For example, reference is made to FIG. 4(A) in which y-force-ripple is plotted from each of four linear actuators, and to FIG. 4(B) in which z-side-force is plotted from each of the same four actuators. As can be seen, these forces do not have the same magnitude from one linear actuator to the next.

First Embodiment of Identification and Compensation Method

This embodiment is directed to an exemplary method for identifying and compensating for force-ripple and side-force in linear actuators each providing 2DOF motion. This method can be performed in situ, and utilizes a multiple-trajectory approach to identification of these forces. This approach is desirable because, inter alia, it allows these forces to be separately identified and compensated, both on the same actuator and on different actuators.

Figure 5:
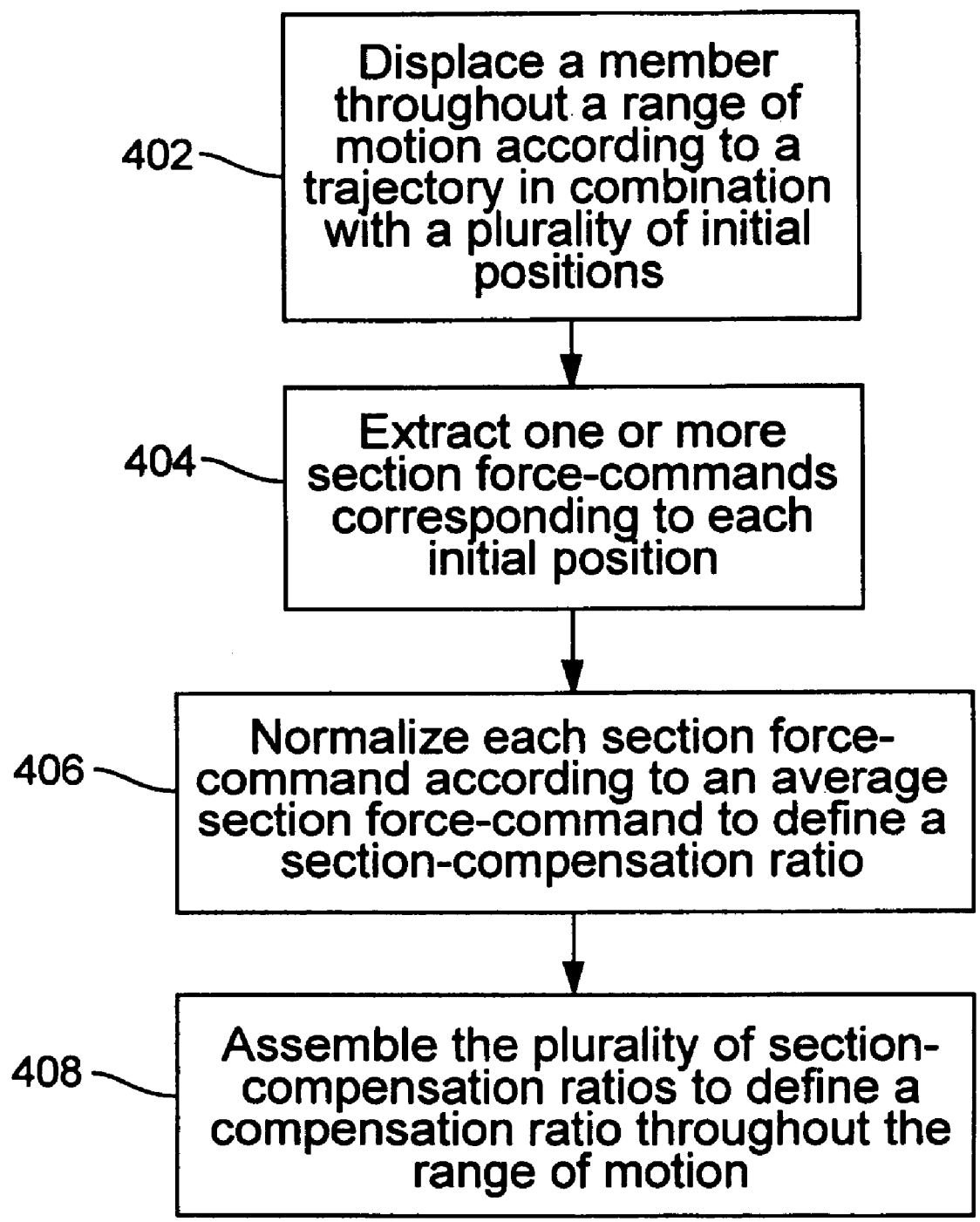
FIG. 5 is a flow-chart of a first representative embodiment of a method for deriving position-dependent compensation ratio(s) for linear actuator(s).

FIG. 5 is a flowchart of this embodiment, resulting in the preparation of a position-dependent compensation-ratio "map" for one actuator of a stage apparatus or the like that comprises and utilizes redundant actuators. The method is repeated for the other actuators.

To obtain accurate identifications of force-ripple, actuator redundancy desirably is removed or at least reduced during the identification process. By way of example, in this embodiment the stage apparatus comprises four redundant linear actuators LM1-LM4 (each providing motion in the y- and z-directions). See FIG. 1(A). Thus, each linear actuator LM1-LM4 consisted of a respective two actuators denoted (LMY1 and LMZ1), (LMY2 and LMZ2), (LMY3 and LMZ3), and (LMY4 and LMZ4). The following planar force distributions can be used for evaluating forces in the y-direction:

$$\text{For } LMY1 \text{ and } LMY4: \begin{pmatrix} u_x \\ u_{y1} \\ u_{y2} \\ u_{y3} \\ u_{y4} \end{pmatrix} = \begin{pmatrix} 1 & 0 & 0 \\ 0 & 1/2 & (1/2)/a_{y1} \\ 0 & 0 & 0 \\ 0 & 0 & 0 \\ 0 & 1/2 & (1/2)/a_{y4} \end{pmatrix} \begin{pmatrix} u_x \\ u_y \\ u_{\theta z} \end{pmatrix} \quad (5)$$

$$\text{For } LMY2 \text{ and } LMY3: \begin{pmatrix} u_x \\ u_{y1} \\ u_{y2} \\ u_{y3} \\ u_{y4} \end{pmatrix} = \begin{pmatrix} 1 & 0 & 0 \\ 0 & 0 & 0 \\ 0 & 1/2 & (1/2)/a_{y2} \\ 0 & 1/2 & (1/2)/a_{y3} \\ 0 & 0 & 0 \end{pmatrix} \begin{pmatrix} u_x \\ u_y \\ u_{\theta z} \end{pmatrix} \quad (6)$$

Similarly, for identifying forces in the z-direction, the following force distributions (from the CG of the movable member of the stage) can be used:

$$\text{For } LMZ1 \text{ and } LMZ4: \begin{pmatrix} u_{z1} \\ u_{z2} \\ u_{z3} \\ u_{z4} \end{pmatrix} = \begin{pmatrix} 1/2 & 0 & -(1/2)/a_{z1} \\ 0 & 0 & 0 \\ 0 & 0 & 0 \\ 1/2 & 0 & -(1/2)/a_{z4} \end{pmatrix} \begin{pmatrix} u_z \\ u_{\theta x} \\ u_{\theta y} \end{pmatrix} \quad (7)$$

$$\text{For } LMZ2 \text{ and } LMZ3: \begin{pmatrix} u_{z1} \\ u_{z2} \\ u_{z3} \\ u_{z4} \end{pmatrix} = \begin{pmatrix} 0 & 0 & 0 \\ 1/2 & 0 & -(1/2)/a_{z2} \\ 1/2 & 0 & -(1/2)/a_{z3} \\ 0 & 0 & 0 \end{pmatrix} \begin{pmatrix} u_z \\ u_{\theta x} \\ u_{\theta y} \end{pmatrix} \quad (8)$$

For illustrative purposes, in the description of this embodiment below, identification of y-force-ripple and z-side-forces of LM2 is made, using the distributions (6) and (8), which are also usable for evaluating LM3. Unique force distributions are obtained from the stage CG y-force and $\theta_z$ force for LMY2 (and LMY3), and from the stage CG z-force and roll for LMZ2 (and LMZ3). As noted, LM2, similar to LM1 and LM3-LM4, is a 2DOF linear actuator that normally provides motion to the movable member in the y- and z-directions.

The movable member is displaced multiple times along a stroke axis (in this case the y-axis). Each displacement is a start-forward-stop-backward-stop displacement over the same distance but commencing from (and stopping at) a different predetermined respective position in the stroke range (402). Since movement and applied force are both positive and negative in direction, respective regions of relatively high acceleration in each section include (+motion, +force), (+motion, −force), (−motion, −force), and (−motion, +force). During each displacement, data concerning position of the member versus time are obtained. This data readily yields corresponding data of acceleration versus time. The starting positions desirably have equal intervals between them. For example, the starting positions can be 6 mm apart along the y-axis. The interval desirably is chosen to provide some data overlap from one displacement to the next one or several adjacent displacements.

Figure 6A:
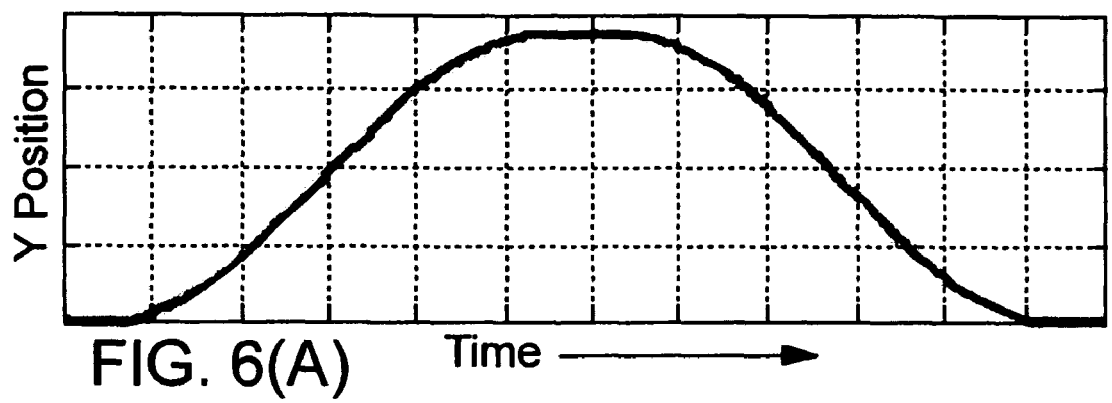
FIG. 6(A) is a plot of y-position versus time for an example displacement by a subject linear actuator along the y-axis as produced in the first representative embodiment.
Figure 6B:
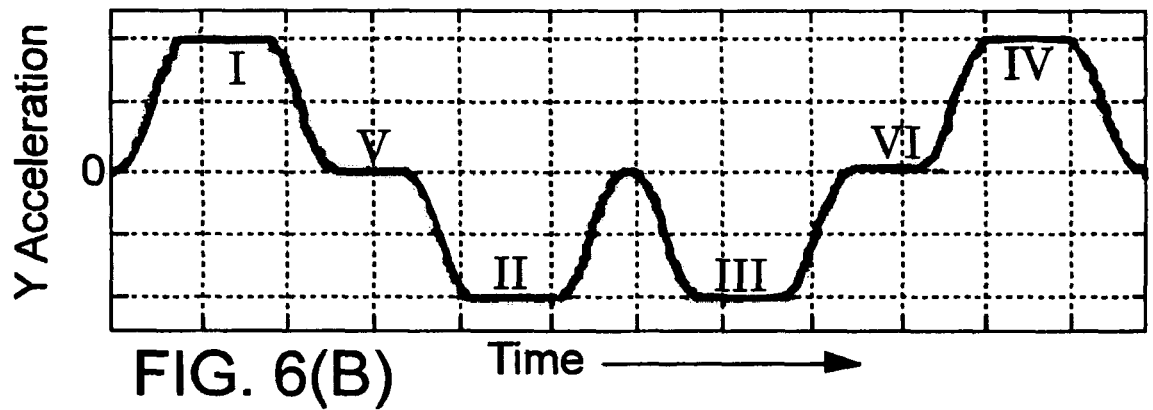
FIG. 6(B) is a plot of acceleration data corresponding to the position data in FIG. 6(A). Six regions or sections are denoted, namely two regions or sections of positive acceleration (I and IV), two regions or sections of negative acceleration (II and III), and two regions or sections of zero acceleration (V and VI). The regions I, II, III, IV are regions of relatively high acceleration (and thus of relatively high applied force), and the regions V, VI are regions of substantially constant velocity (and thus of relatively low applied force). See first representative embodiment.

A plot of an example displacement along the y-axis is shown in FIG. 6(A). A corresponding plot of acceleration is shown in FIG. 6(B). In FIG. 6(B) note the denotation of six specific regions, namely two regions of positive acceleration (I and IV), two regions of negative acceleration (II and III), and two regions of zero acceleration (V and VI). The regions I, II, III, IV are regions of relatively high acceleration (and thus of relatively high applied force), and the regions V, VI are regions of substantially constant velocity (and thus of relatively low applied force).

Although the force-command data in the entire acceleration sections can be used, it is desirable to select appropriate section(s) of the acceleration profile for each displacement. The appropriate sections are those that provide the best signal-to-noise ratios for the particular force(s) being identified. In this embodiment, sections of high acceleration (sections I-IV) are used.

As the displacements are being made, member-positioning errors throughout each trajectory of the movable member desirably are minimized. Low positioning errors also tend to improve the quality of measured force-commands. One way in which to reduce errors is to apply ILC (interative learning control) to provide "perfect" force actuations for each actuator at each position. If the system dynamics are well-known, ILC may not be needed to identify force-ripple and side-force. For example, if force-ripple is regarded as a disturbance, a transfer-function from the disturbance to the force-command serves as a closed-loop transfer-function. The disturbance force may be identified by application of an inverse closed-loop transfer-function to the force-command. Application of inverse closed-loop transfer function can significantly improve identification of y-force-ripple and z-side-force. Further alternatively, a filter of inverse closed-loop dynamics of the stage system can be applied to improve the force-commands. Other methods to improve the quality of the force-command, and correspondingly reduce the positioning error of the movable member, are also possible.

Corresponding section force-command(s) are extracted from the acceleration sections. Thus, respective force-commands, as functions of actuator displacement, are obtained for the selected section(s) for the motions from each initial position (404). See FIG. 7(A) for example plots, for each of the displacements, of y-direction force-commands for LM2, and FIG. 7(B) for example plots, for each of the displacements, of z-direction force-commands for LM2. Thus, it can be seen that multiple sets of force-commands can be obtained from the acceleration sections.

Figure 7A:
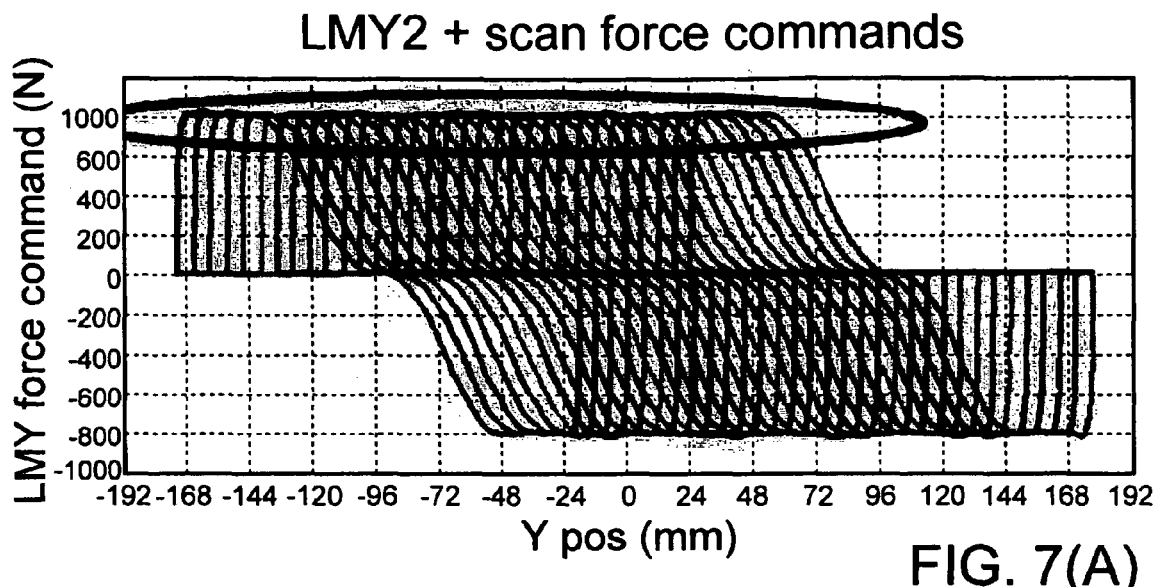
FIG. 7(A) is a composite plot of multiple y-force-commands, as functions of actuator displacement, obtained for the selected section(s) for the motions from each respective initial position (404 in FIG. 5) provided by a linear actuator LM2 being evaluated. See first representative embodiment.
Figure 7B:
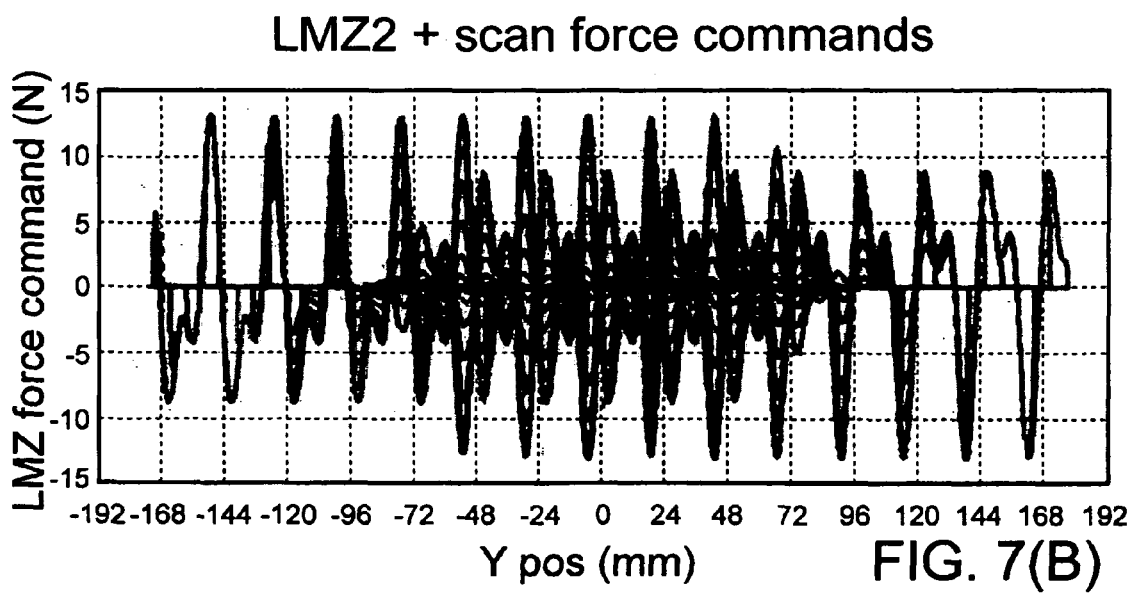
FIG. 7(B) is a composite plot of multiple z-direction force-commands, as functions of actuator displacement, provided by the subject linear actuator LM2 evaluated in FIG. 7(A).
Figure 8A:
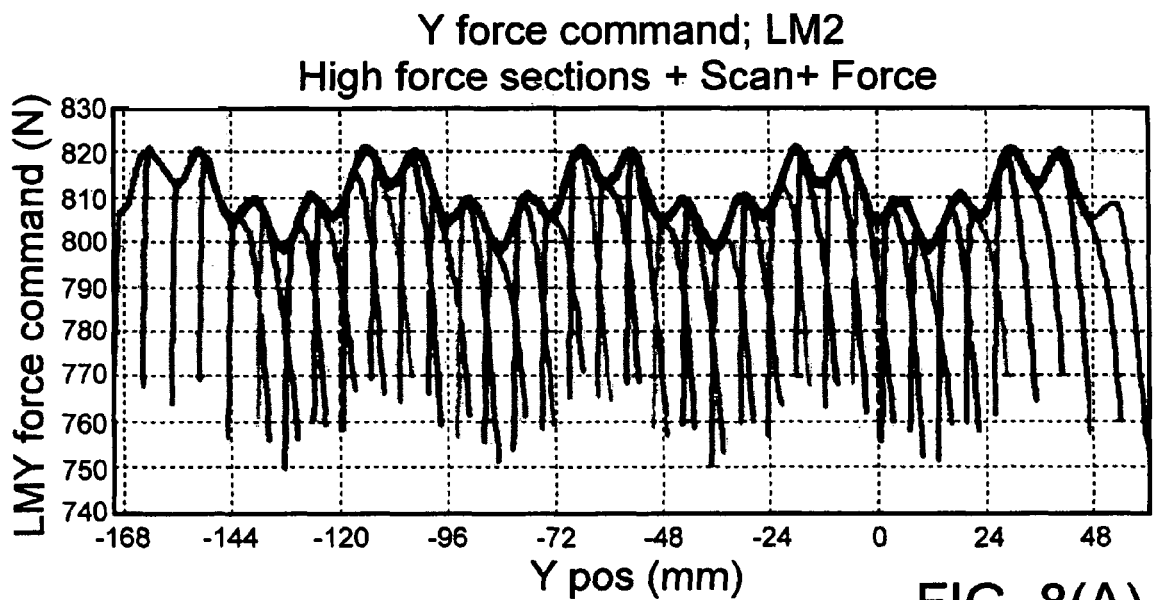
FIG. 8(A) is a composite plot of multiple actuator y-direction force-commands, versus y-position, for motion through a (+force, +scan) section of the trajectory of FIG. 6(A) from each of a plurality of initial positions by the subject linear actuator. The plotted data were extracted from the data of FIG. 7(A). ("Scan" is also called "motion" herein.) See first representative embodiment.
Figure 8B:
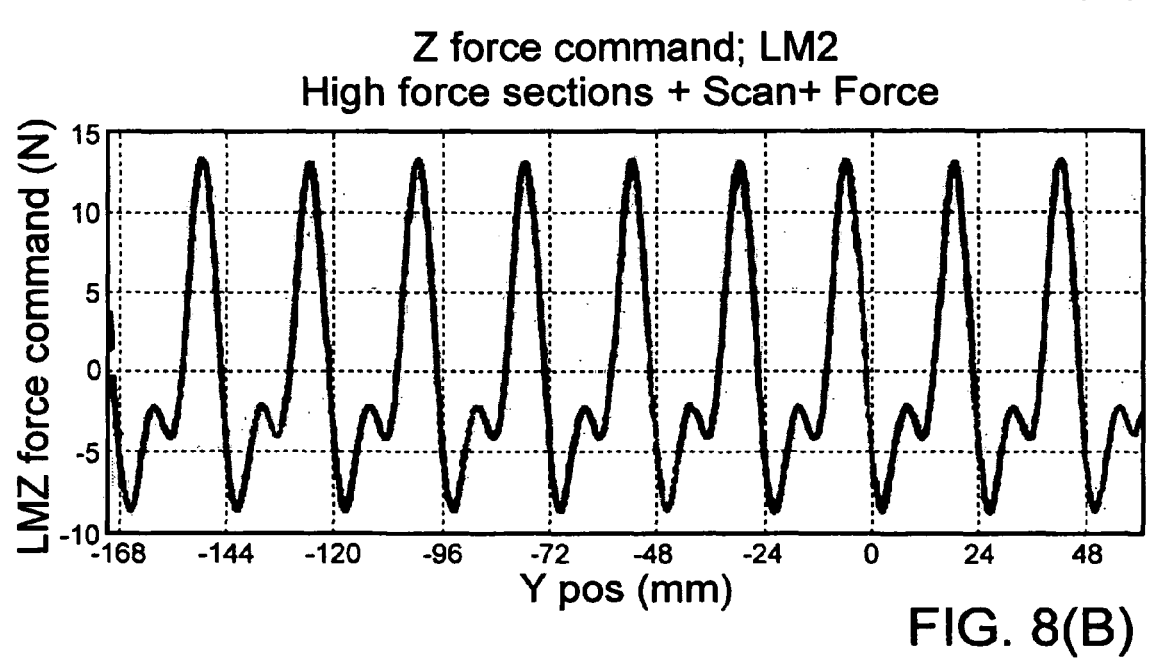
FIG. 8(B) is a continuous plot assembled from truncated portions of z-direction force-commands, versus y-position, for the motion associated with FIG. 8(A). The plotted data were extracted from the data of FIG. 7(B).

Plotting particular portions of the force-commands against position in the displacement direction (also called "scan direction" or "motion direction" or "stroke direction") reveals respective force-ripple and side-forces. For example, the portions within the ellipse in FIG. 7($a$) can be plotted. Exemplary data, pertaining to high-force sections for +scan and +force as extracted from the data in FIGS. 7(A) and 7(B), are shown in FIGS. 8(A) and 8(B) for y-direction force-commands and z-direction force-commands, respectively. These selected high-force sections correspond to the same trajectory time indices. If desired, for later construction of position-dependent maps, interpolation can be used to re-sample the data from the high-force sections with a smaller, but nevertheless fixed, position interval (e.g., 1 mm interval used in interpolation of data initially obtained at 6-mm intervals).

If the force-command data are plotted with their respective section positions being synchronized with each other, it can be seen that force-ripple and side-forces can cause significant position-dependent force variations. See FIGS. 9(A) and 9(B) for exemplary plots of synchronized data for y-force-commands and z-force-commands, respectively.

In 406, each section force-command is normalized according to an average section force-command to define section-compensation ratios. The average force-command can be determined as follows. If $F_{j,k}$ denotes the force at data point k=1, ..., n in trajectory section j=1, ..., N, the averaged force $\overline{F}_k$ across different trajectory sections may be regarded as the common nominal force, which compensates for system transient responses and other time-dependent disturbances:

$$\overline{F}_k = \sum_{j=1}^{N} F_{j,k} \qquad (9)$$

Figure 9A:
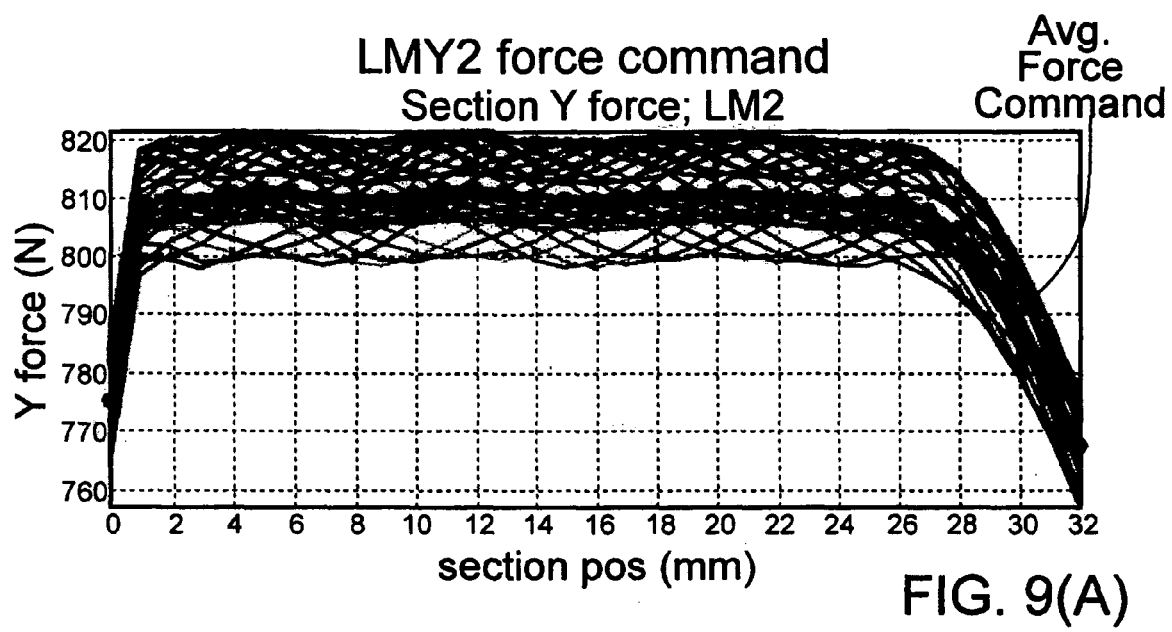
FIGS. 9(A) and 9(B) provide plots of synchronized data for y-force-commands and z-force-commands, respectively, versus section position of the subject linear actuator. See first representative embodiment. The plots also include respective plots (bold) of average force-commands.
Figure 9B:
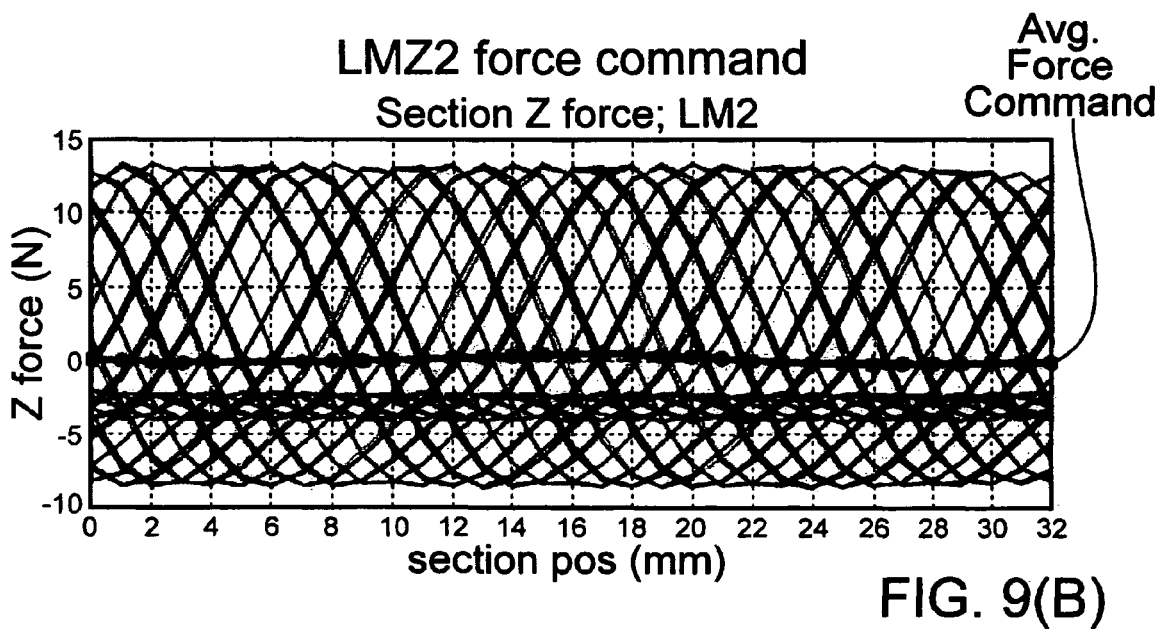

FIGS. 9(A) and 9(B) include respective plots of the average force-commands (bold). The respective averages represent nominal forces without the influence of force-ripple and side-forces. For example, force-ripple is highly attenuated by averaging through the force sections.

Then, for each trajectory section j=1, ..., N, the ratio $c_{j,k}$ of the corresponding force $F_{j,k}$ to the averaged force $\overline{F}_k$ is determined:

$$c_{j,k} = \frac{F_{j,k}}{\overline{F}_k} \qquad (10)$$

Figure 10A:
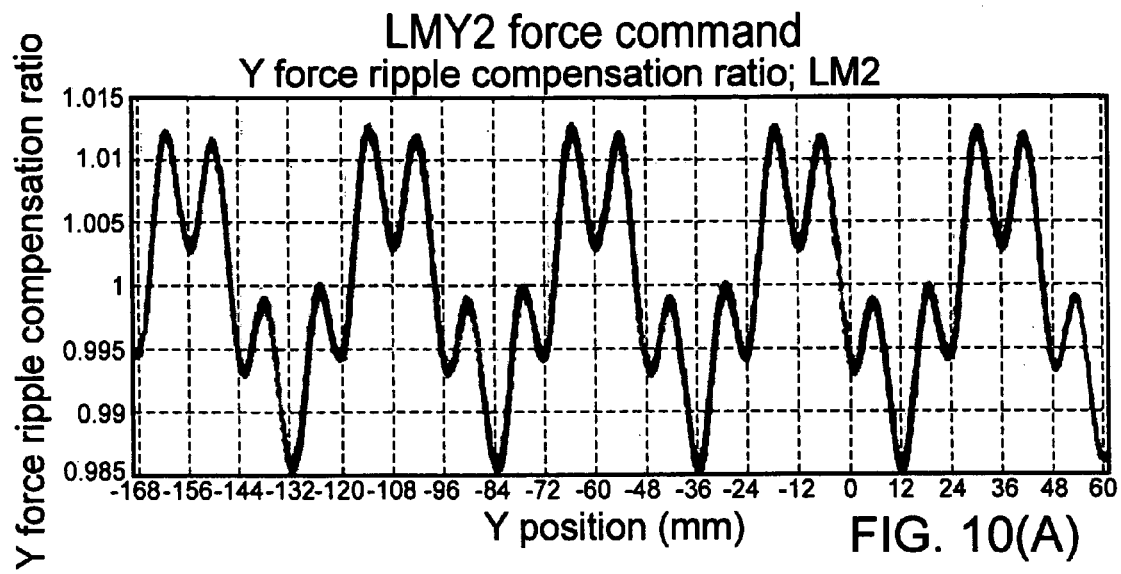
FIGS. 10(A) and 10(B) are respective plots of calculated compensation ratios for force-ripple and side-force, respectively, for the subject linear actuator LM2, as determined in the first representative embodiment.
Figure 10B:
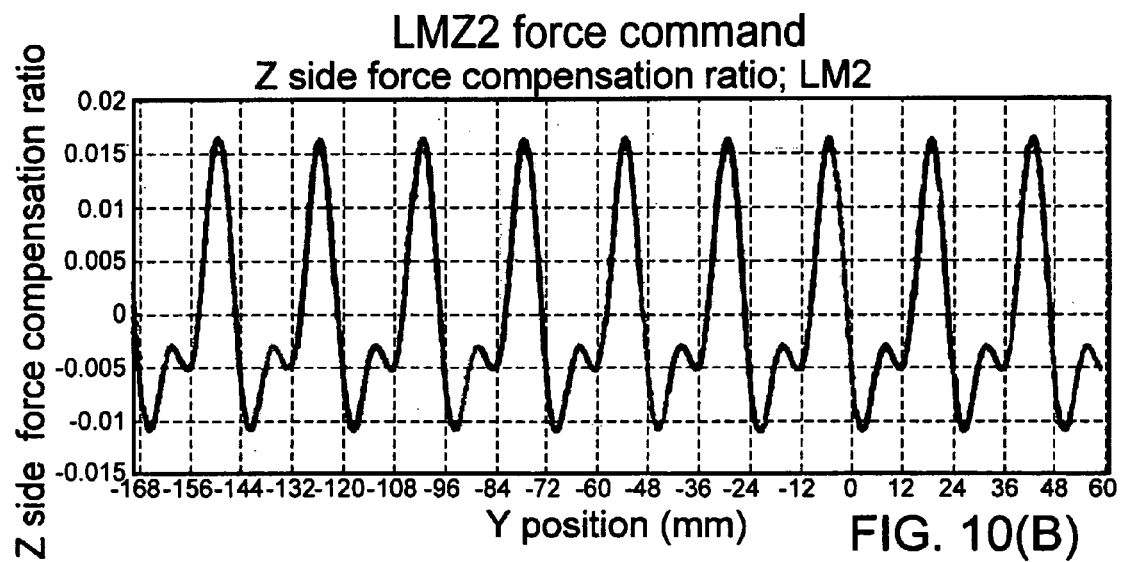

This ratio serves as the compensation ratio for force-ripple or side-force. In 408, the resulting section-compensation ratios are assembled to define a map of compensation ratios throughout the range of motion for the particular section (e.g., +motion, +force). Generally, the map will reveal some variation of compensation ratio with position over the range of motion. The compensation ratios ideally do not include time-dependent disturbances according to mechanical vibrations or other sources. As shown in FIGS. 10(A) and 10(B), the calculated compensation ratios for force-ripple and side-force, respectively, from all the sections overlapped well.

Figure 11A:
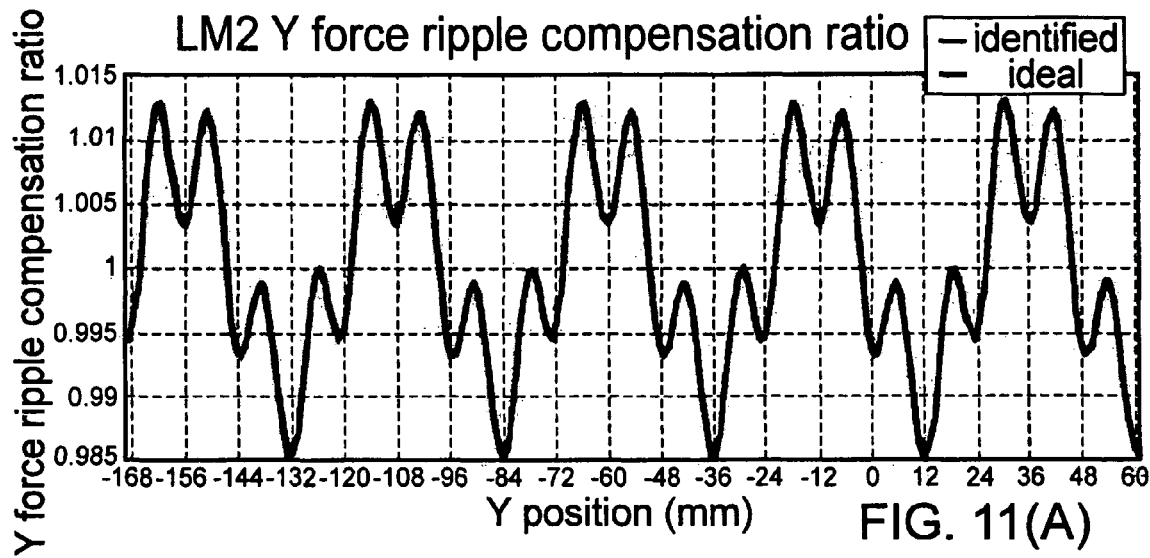
FIGS. 11(A) and 11(B) are maps of assembled y-force-ripple compensation ratios and z-side-force compensation ratios, respectively, for the entire position range of the y- and z-forces for LM2. The data are assembled from the (+force +scan) portions of the compensation ratios. Since the data sets have been re-sampled at fixed-position intervals, at every y-position point the average of the associated force ratios can be calculated from all the force sections. See first representative embodiment.
Figure 11B:
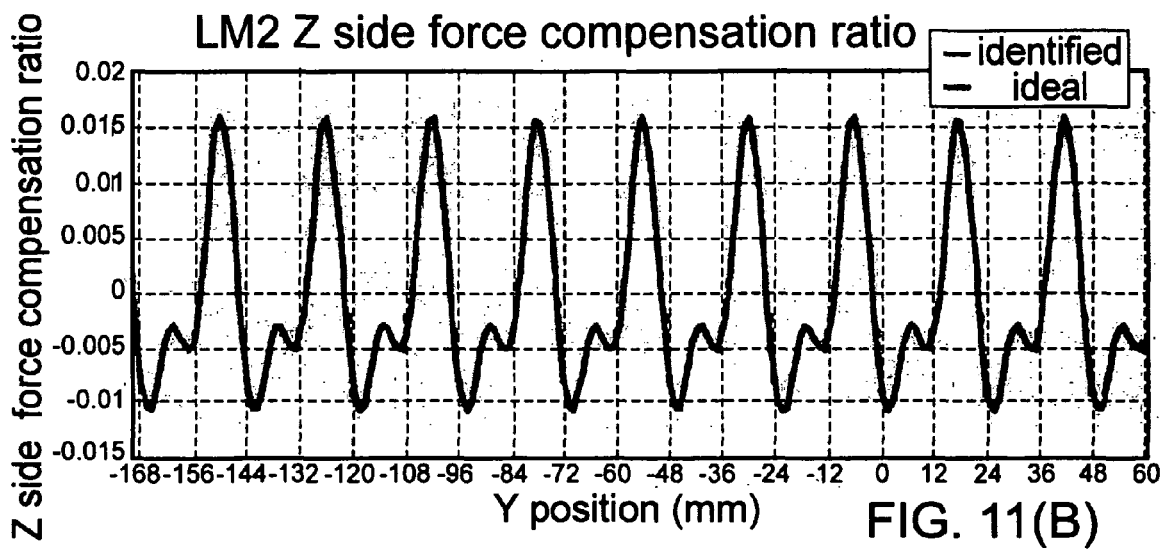

To create a single map for the entire position range of the y- and z-forces from the +force, +scan data, portions of the compensation ratios are assembled together. Since the data sets have been re-sampled at fixed-position intervals, at every y-position point the average of the associated force ratios can be calculated from all the force sections. Exemplary resulting y-force-ripple and z-side-force compensation maps are shown in FIGS. 11(A) and 11(B), respectively.

Figure 12A:
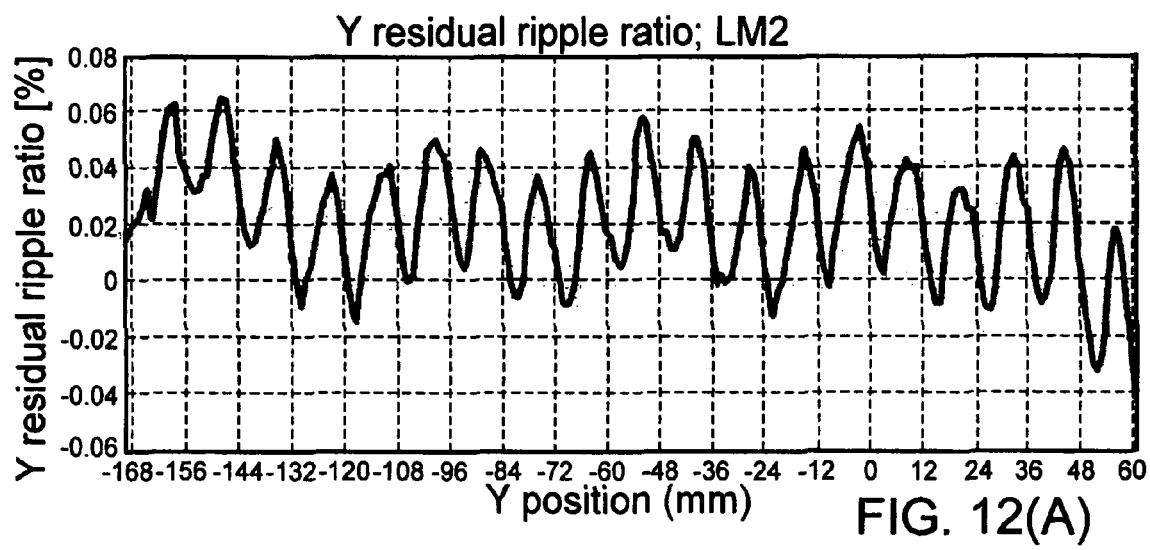
FIGS. 12(A) and 12(B) are respective maps of y residual force-ripple compensation ratios and z residual side-force compensation ratios for LM2, as functions of y-position. See first representative embodiment. To obtain the plotted data, differences between the determined compensation ratios were subtracted from corresponding "ideal" compensation ratios (determined from computer-simulation models of force-ripple and side-force for the actuator) to obtain corresponding compensation-error ratios ("map errors") that were plotted.
Figure 12B:
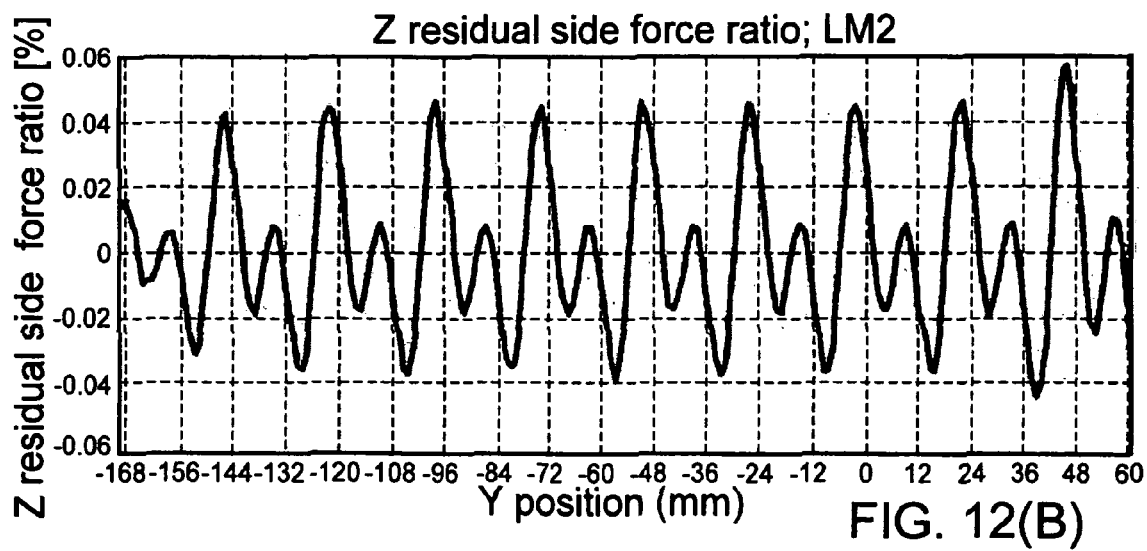

Differences between the determined compensation ratios, used above for assembling the maps, can be subtracted from corresponding "ideal" compensation ratios (determined from computer-simulation models of force-ripple and side-force for the actuator) to obtain corresponding compensation-error ratios ("map errors"). Map errors also can be plotted against displacement of the linear actuator in the stroke direction (e.g., y-direction). Example plots are shown in FIGS. 12(A) and 12(B) for force-ripple and side-force, respectively.

Figure 13A:
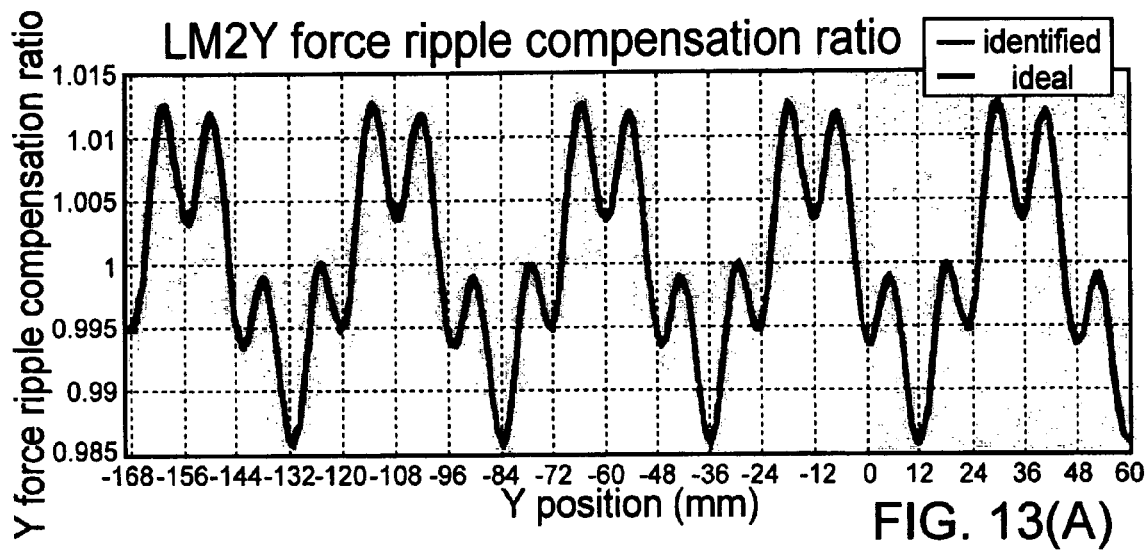
FIGS. 13(A) and 13(B) are respective maps of y-force-ripple and z-side-force compensation ratios for (+force, −motion) sections of the trajectories made by LM2. See first representative embodiment.
Figure 13B:
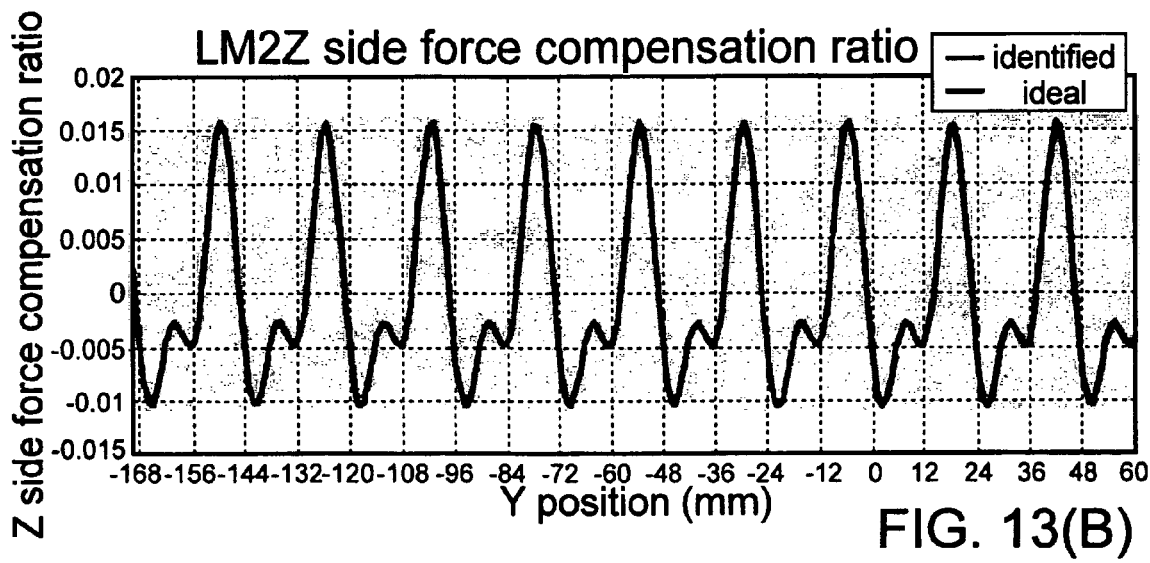

Over the same range of displacement, determinations can be made of compensation ratios for other sections of the trajectory, including (−motion, +force), (+motion, −force), and (−motion, −force). These determinations yield respective section maps of compensation ratios for those segments. Examples are shown in FIGS. 13(A) and 13(B) for (+force, −motion) for force-ripple and side-force, respectively. Since the same position points are used in these maps for (+force, +motion) and (+force, −motion), the two maps can be assembled into a single map for +force simply by averaging. Example plots are shown in FIGS. 14(A) and 14(B) for force-ripple and side-force, respectively. Similarly, single maps can be assembled for (−force, +motion) and (−force, −motion). Example (−force) plots are shown in FIGS. 15(A) and 15(B) for force-ripple and side-force, respectively.

Finally, respective section maps for areas of +force and −force (e.g., two section maps for each, wherein one such section map is for +motion and the other section map is for −motion) can be assembled to produce a single map for the entire range of stage position for the particular actuator. Example plots are shown in FIGS. 16(A) and 16(B) for force-ripple and side-force, respectively, for LM2. The +force and −force maps can share a common position range. It is also possible that slight dc differences exist in the maps even in the common-position range. In this event, dc offsets can be defined for the two maps by aligning their output values at a common position, such as y=0 mm. After such an offset adjustment, averaging can be applied again to the shared common positions, if necessary.

The same procedure discussed above can be repeated to construct force-ripple and side-force compensation maps for the LM3 actuator, using the force-command data collected from the same sets of trajectory one or more of the remaining linear actuators of the stage apparatus.

The procedure discussed generally above can also be performed to map force-ripple and side-force for the actuators LM1 and LM4, using the force distributions (5) and (7), above.

Second Embodiment of Identification and Compensation Method

This embodiment is another on-machine method for identifying and compensating for force-ripple and side-forces in multiple 2DOF linear actuators used for actuating a 6DOF stage. The particular configuration of the stage is as shown in FIG. 1(B). Specifically, four linear actuators 1015a-1015d of a set extend symmetrically, relative to the center of gravity CG, in the y-direction. Each of the linear actuators 1015a-1015d in the set is a 2DOF linear motor. The set of linear actuators 1015a-1015d redundantly but collectively provides motion of the movable member 1014 in the y, z, $\theta_x$, $\theta_y$ and $\theta_z$ DOFs. A separate 1DOF actuator (not shown) provides stage motion in the x-direction. In the following discussion, the linear actuators 1015a-1015d are linear motors denoted LM1-LM4, respectively. In view of each being a 2DOF linear motor, LM1 consists of LMY1 and LMZ1, LM2 consists of LMY2 and LMZ2, LM3 consists of LMY3 and LMZ3, and LM4 consists of LMY4 and LMZ4.

Figure 17:
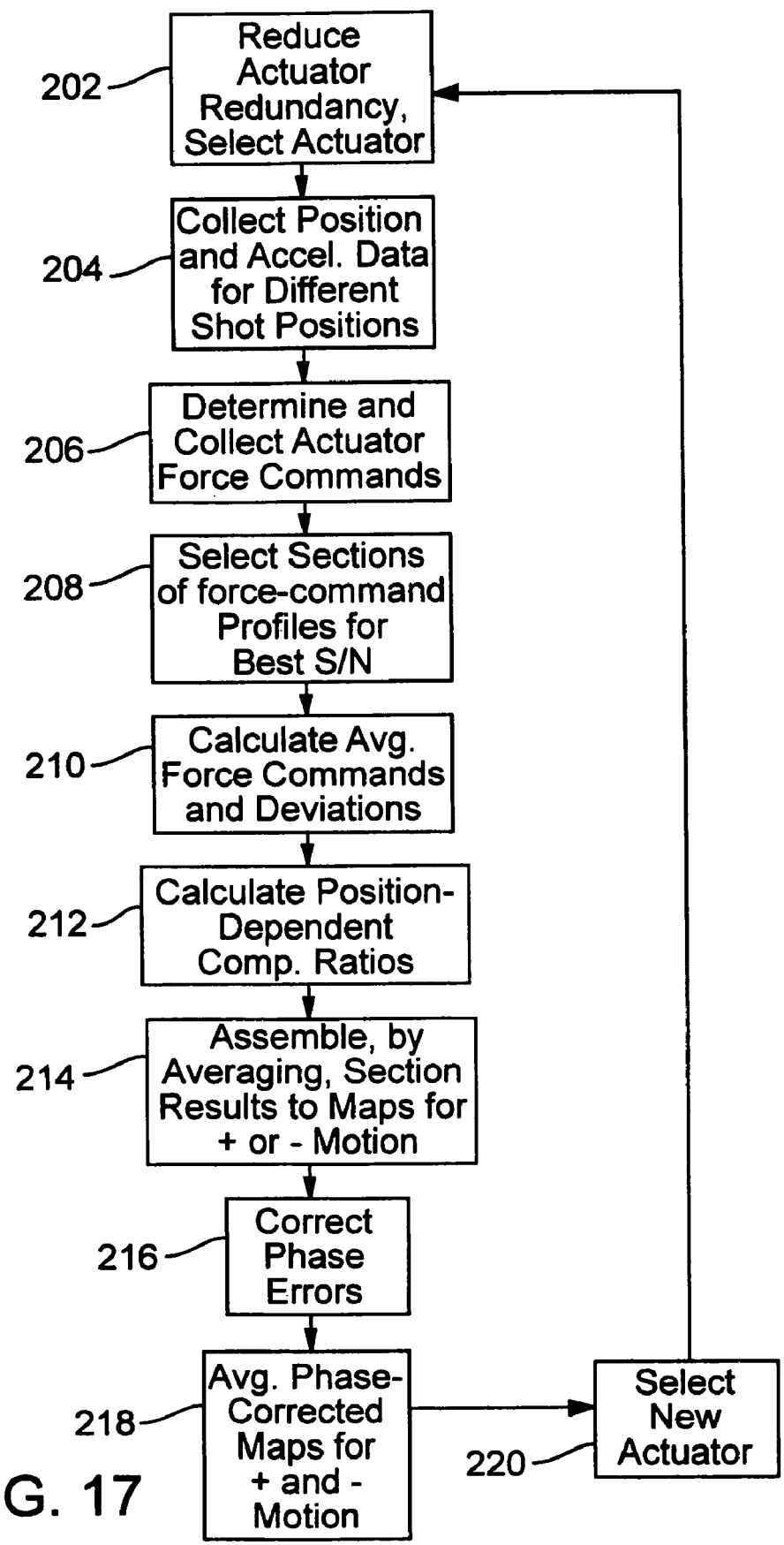
FIG. 17 is a flow-chart of a second representative embodiment of a method for identifying and mapping position-dependent compensation ratios for one or more linear actuators of a group of redundant linear actuators.

The following are addressed in this embodiment: (a) reduce coupling effects among multiple linear motors LM1-LM4 to identify force-ripple from each motor, (b) increase signal-to-noise ratio as much as possible, (c) separate time-dependent mechanical vibrations from position-dependent ripple effects, and (d) correct any map phase errors that may arise from time delays in system input and output. The method is diagrammed in FIG. 17. The following discussion of the method of this embodiment is set forth in the context of evaluating the linear motor LM1. But, as noted later, the method is also applicable, in turn, to each of the other linear motors LM2, LM3, LM4.

Figure 18:
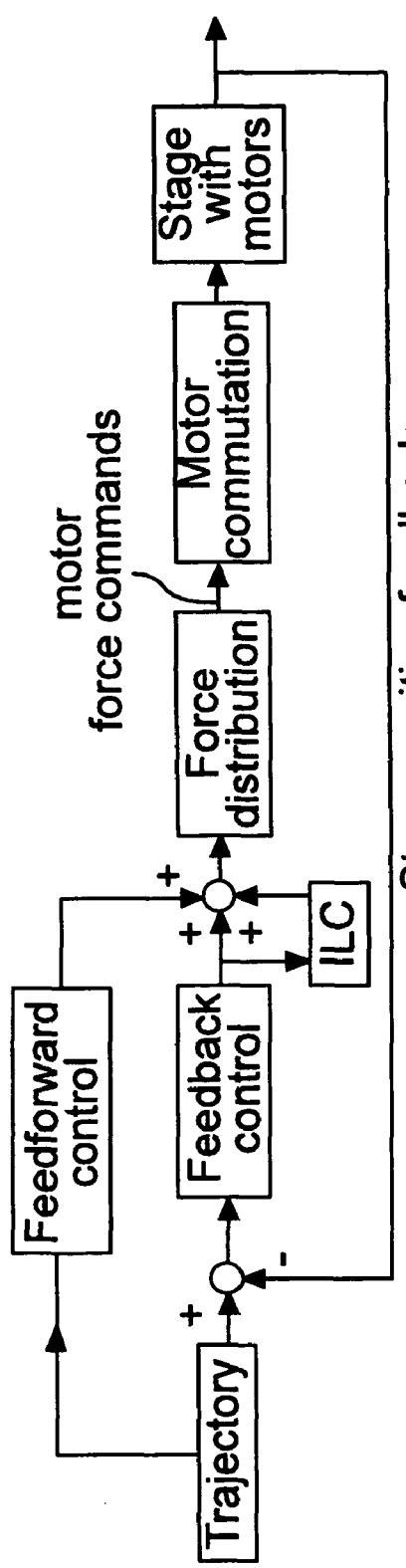
FIG. 18 is a stage-control diagram used in the second representative embodiment.

During the identification of side-forces and force-ripple produced by any of multiple redundant actuators, the force distribution (mapping of stage force-commands, at the center of gravity CG of the movable member, to forces from individual actuators) desirably is adjusted to reduce the actuator redundancy for more precise identifications of the contributions from individual actuators. Although ILC learning may be used to compensate for force-ripple and side-forces more precisely, ILC is not required. In either event, the resulting y-force and z-direction force-commands for each actuator may be used in the identification of the motor-force compensation matrix. The stage-control diagram used in this embodiment for identification of motor-force compensation matrices is shown in FIG. 18.

Returning to FIG. 17, redundancy is reduced (202) to allow independent evaluations and identifications of force-ripple and side-force in individual linear motors. By way of example, during evaluation of the linear motor LM1, the other linear motors LMY1, LMY3, and LMY4 are used to control y, $\theta_z$, $\theta_x$, and the linear motors LMZ1 and LMZ4 are used to control z and $\theta_y$.

Figure 19A:
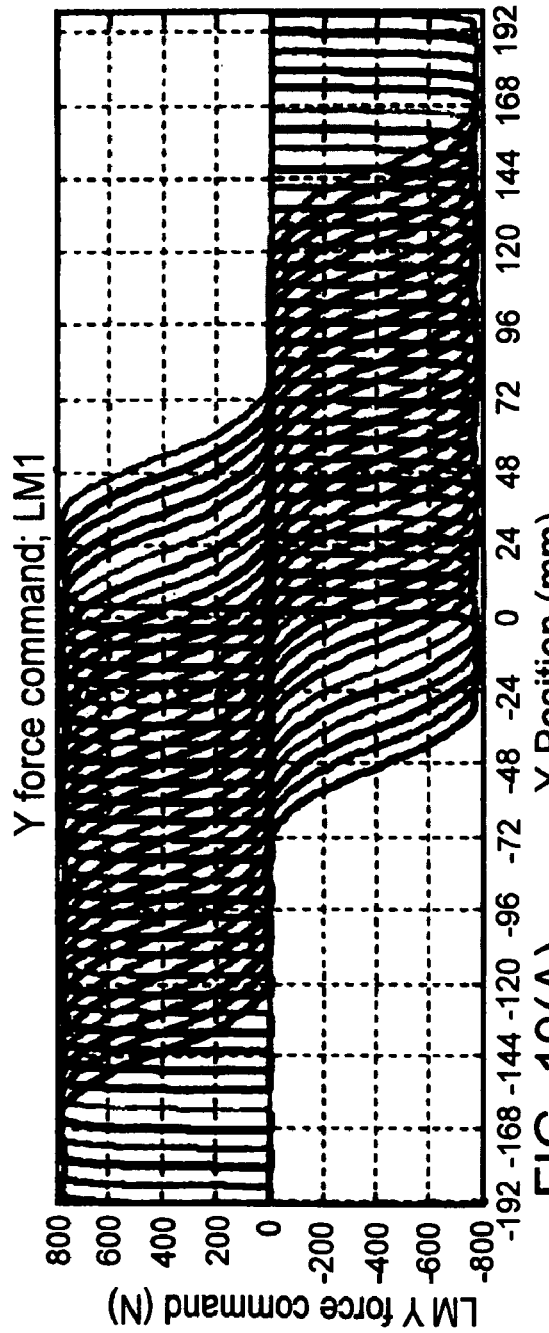
FIG. 19(A) is a composite plot of multiple y-force-commands, as functions of actuator displacement, obtained for the selected trajectory section(s) from each respective initial position (204 in FIG. 17) provided by a linear actuator LM1 being evaluated. See second representative embodiment.
Figure 19B:
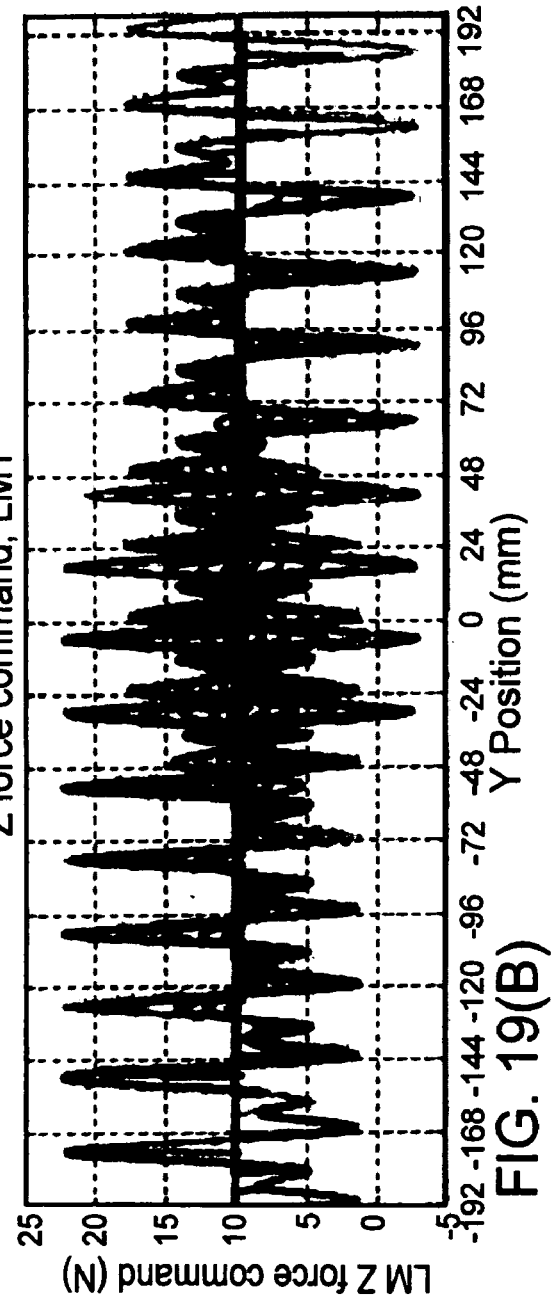
FIG. 19(B) is a composite plot of multiple z-direction force-commands, as functions of actuator displacement in the y-direction, provided by the linear actuator LM1 evaluated in FIG. 19(A).

For the selected linear motor, position and acceleration data are collected (204) for different shot positions, along with actuator force-commands (206). In 204 a series of displacements from different respective starting positions are made along the stroke axis (y-axis), accompanied by obtaining respective position and acceleration data. During these displacements, the stage follows position and acceleration trajectories as shown in FIGS. 6(A) and 6(B), respectively. In determining and collecting the force-command data (206), interactive learning control (ILC) can be utilized, if desired for enhance accuracy and precision, in all six DOFs. Exemplary y-direction force-commands and z-direction force-commands for the linear motor LM1 are shown in FIGS. 19(A)-19(B) at thirty-two shot positions that are situated 6 mm apart from each other.

Figure 20A:
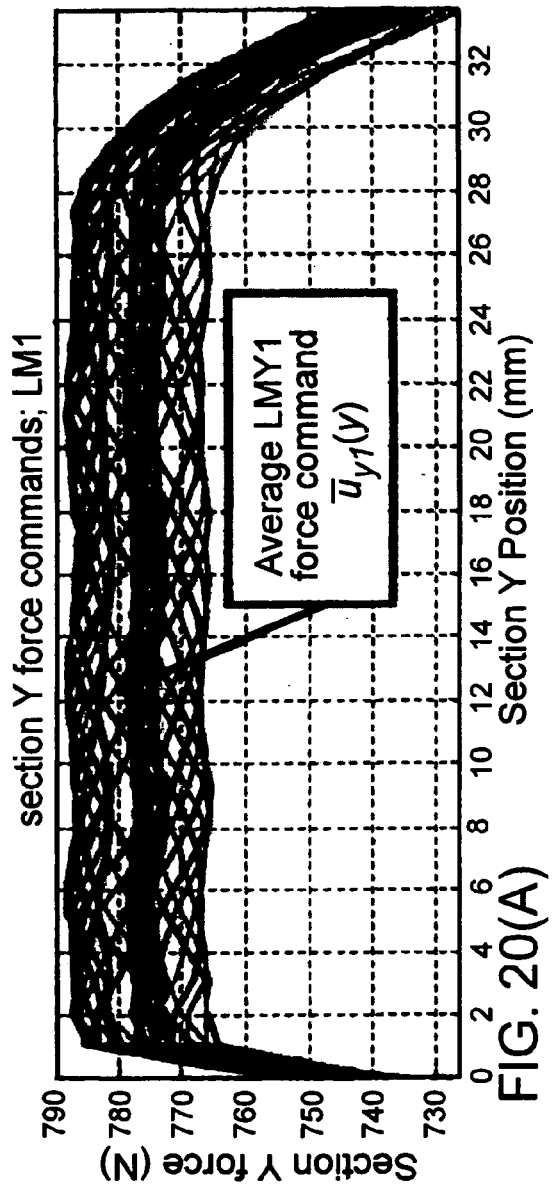
FIGS. 20(A) and 20(B) provide plots of synchronized data for y-force-commands and z-force-commands, respectively, versus section position of the linear actuator LM1 (206). See second representative embodiment. The plots also include respective plots (bold) of average force-commands.
Figure 20B:
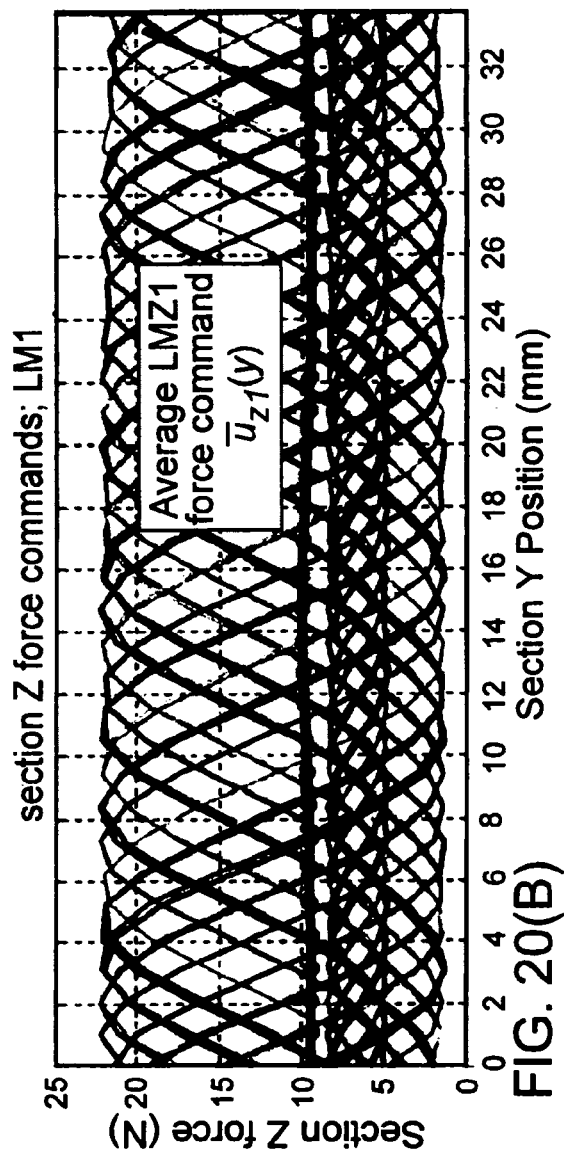

Appropriate acceleration sections are selected (208) to provide corresponding force-commands for the best signal-to-noise ratios (S/N). For example, relatively high-acceleration sections are used for obtaining data concerning y-force-ripple and z-side-force; representative data, plotted versus y-position, are shown in FIGS. 20(A) and 20(B), respectively. Constant-velocity sections are used for obtaining data concerning y-side-force and z-force-ripple; representative data, plotted versus y-position, are shown in FIGS. 20(C) and 20(D), respectively.

From the data obtained previously, average force-commands and respective deviations from the average force-commands are calculated (210). Force-command averages (which are position-independent) are calculated as follows:

$$\bar{u}_{y1}(y) = \frac{1}{N}\sum_{j=1}^{N} u_{y1}^j(y) \quad (11)$$

$$\bar{u}_{z1}(y) = \frac{1}{N}\sum_{j=1}^{N} u_{z1}^j(y) \quad (12)$$

and force-command deviations (which are position-dependent) are calculated as follows:

$$\Delta u_{y1}^j(y) = u_{y1}^j(y) - \bar{u}_{y1}(y) \quad (13)$$

$$\Delta u_{z1}^j(y) = u_{z1}^j(y) - \bar{u}_{z1}(y) \quad (14)$$

Note the plot of $\bar{u}_{y1}(y)$ in FIG. 20(A) and the plot of $\bar{u}_{z1}(y)$ in FIG. 20(B). Similarly, note the plot of $\bar{u}_{y1}(y)$ in FIG. 20(C) and the plot of $\bar{u}_{z1}(y)$ in FIG. 20(D).

From the data obtained previously, position-dependent compensation ratios are determined (212). Example data of the compensation ratio:

$$c_{y1 \to y1}(y) = 1 + \frac{\Delta u_{y1}(y)}{\bar{u}_{y1}(y)} = \frac{u_{y1}}{\bar{u}_{y1}(y)} \quad (15)$$

are plotted in FIG. 21(A); example data of the compensation ratio:

$$c_{y1 \to z1}(y) = \frac{\Delta u_{z1}(y)}{\bar{u}_{y1}(y)} \quad (16)$$

are plotted in FIG. 21(B); example data of the compensation ratio:

$$c_{z1 \to y1}(y) = \frac{\Delta u_{y1}(y)}{\bar{u}_{z1}(y)} \quad (17)$$

are plotted in FIG. 21(C); and example data of the compensation ratio:

$$c_{z1 \to z1}(y) = 1 + \frac{\Delta u_{z1}(y)}{\bar{u}_{z1}(y)} = \frac{u_{z1}(y)}{\bar{u}_{z1}(y)} \quad (18)$$

are plotted in FIG. 21(D). In addition to the compensation ratios for LM1, compensation ratios for LM4 can be identified or approximated as follows:

$$c_{y4 \to y4}(y) = 1 + \frac{\Delta u_{y4}(y)}{\bar{u}_{y4}(y)} = \frac{u_{y4}(y)}{\bar{u}_{y4}(y)} \quad (19)$$

$$c_{z4 \to z4}(y) = 1 + \frac{\Delta u_{z4}(y)}{\bar{u}_{z4}(y)} = \frac{u_{z4}(y)}{\bar{u}_{z4}(y)} \quad (20)$$

$$c_{z4 \to y4}(y) = \frac{\Delta u_{y4}(y)}{\bar{u}_{z4}(y)} \quad (21)$$

$$c_{y4 \to z4}(y) \approx \frac{\Delta u_{z4}(y)}{\bar{u}_{y4}(y) + \bar{u}_{y3}(y)} \quad (22)$$

Equation (22) above is an approximation, pertaining to z-side-force coupling of LMY4 and LMY3. Its accuracy is inversely proportional to the magnitude of LMY3; the more symmetric the stage, the more accurate the approximation.

Figure 22A:
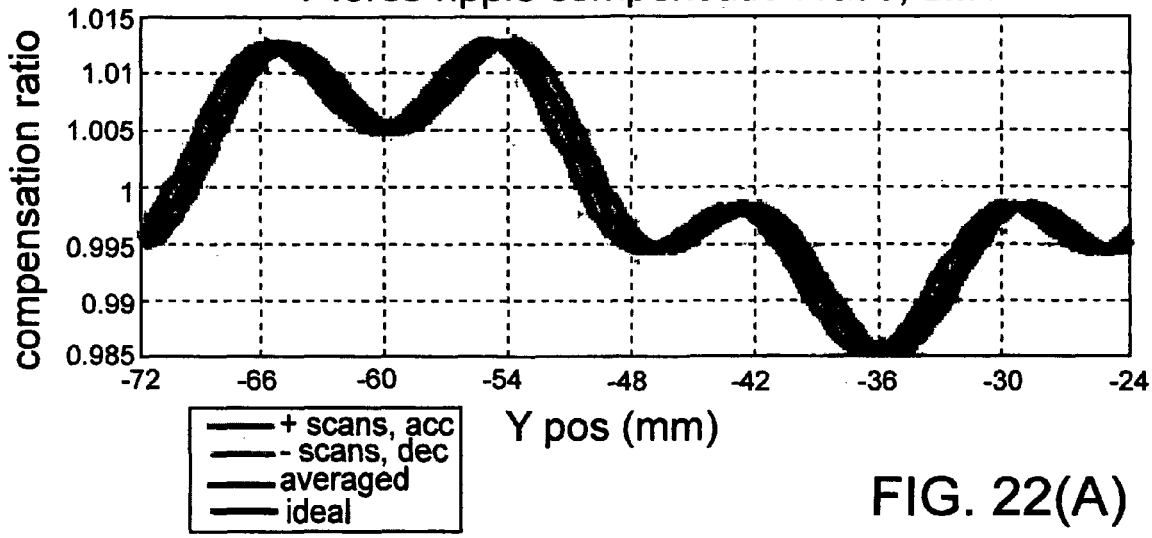
FIGS. 22(A) and 22(B) are respective maps, of averaged data for high-acceleration sections (FIG. 22(A) for +motion, FIG. 22(B) for −motion), for y-force-ripple and z-side-force, respectively. (No. 214 in FIG. 17.)
Figure 22B:
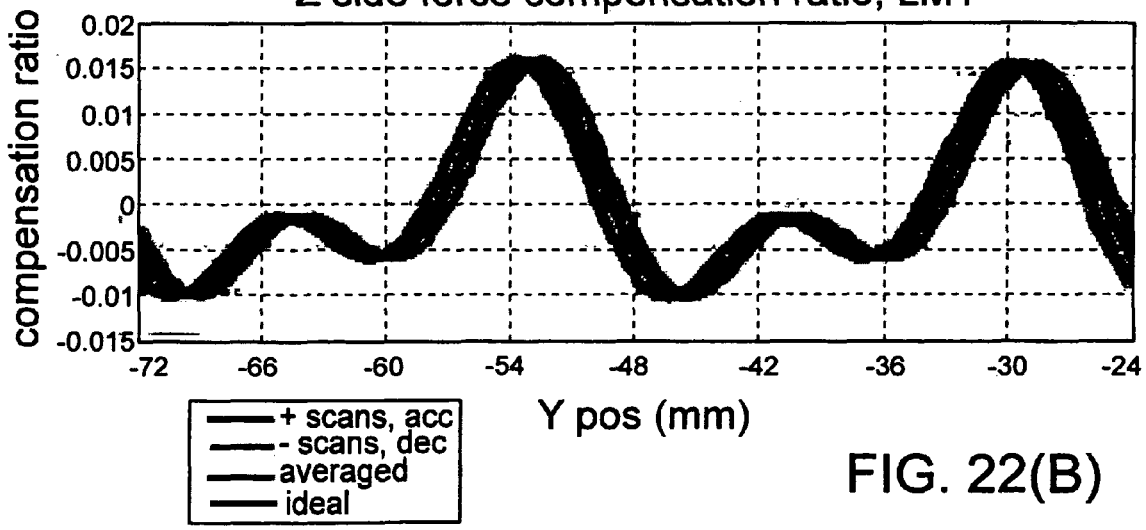
Figure 22C:
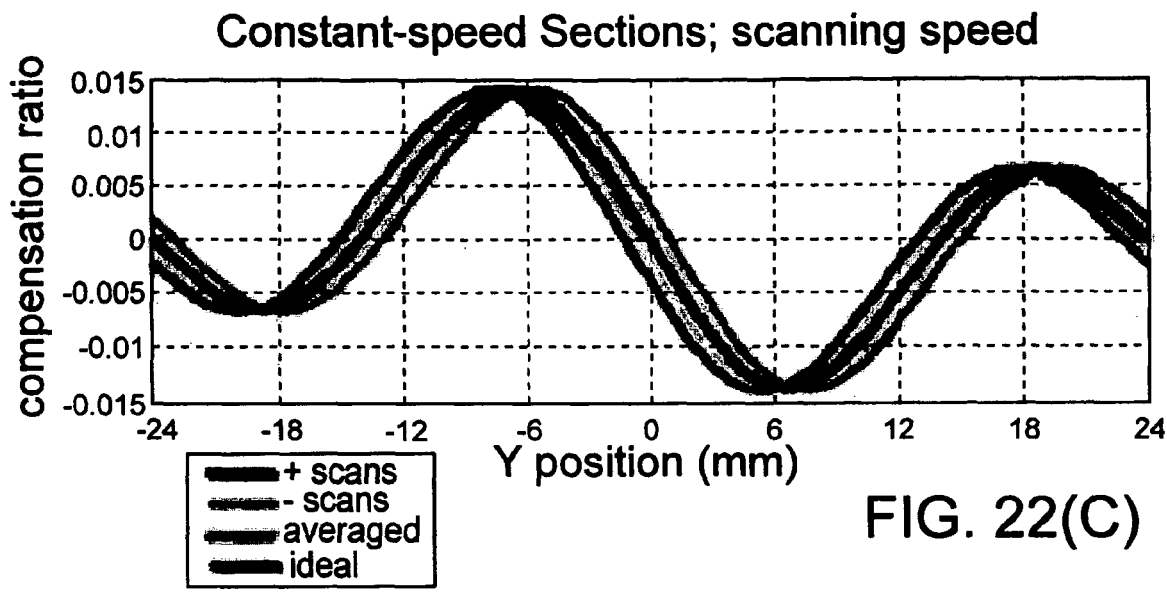
FIGS. 22(C) and 22(D) are respective maps, of averaged data for constant-velocity sections (FIG. 22(C) for +motion, FIG. 22(D) for −motion), for y-side-force and z-force-ripple, respectively.
Figure 22D:
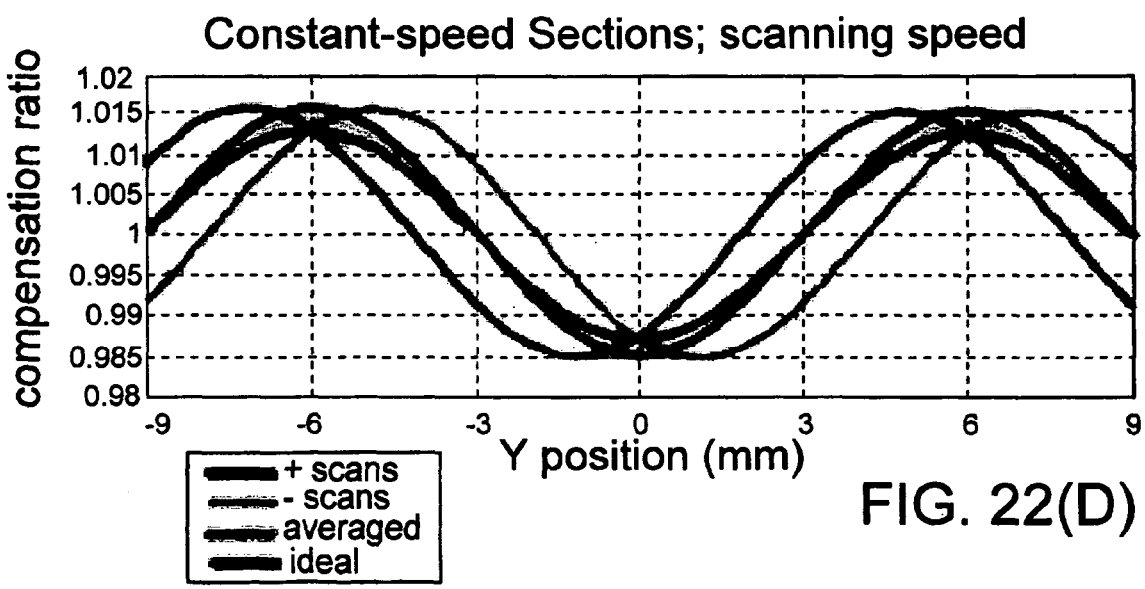

The results for the sections are assembled, by averaging, into a map of compensation ratios (one for +motions, another for −motions) (214). Exemplary results are shown in FIGS. 22(A) and 22(B) for the high-acceleration sections at approximately ½ scanning velocity for y-force-ripple and z-side-force compensation, respectively, and in FIGS. 22(C) and 22(D) for the constant-velocity sections at approximately full scanning velocity for y-side-force and z-force-ripple, respectively.

Figure 23A:
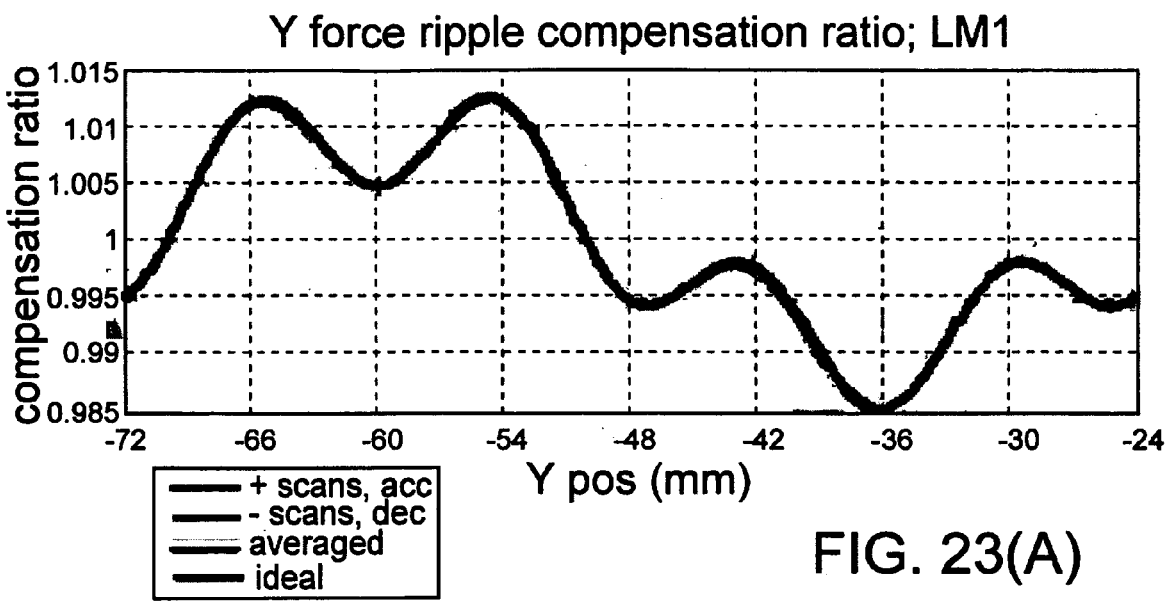
FIGS. 23(A)-23(D) are respective maps of the data of FIGS. 22(A)-22(D), respectively, in which phase differences have been corrected. (216 in FIG. 217).
Figure 23B:
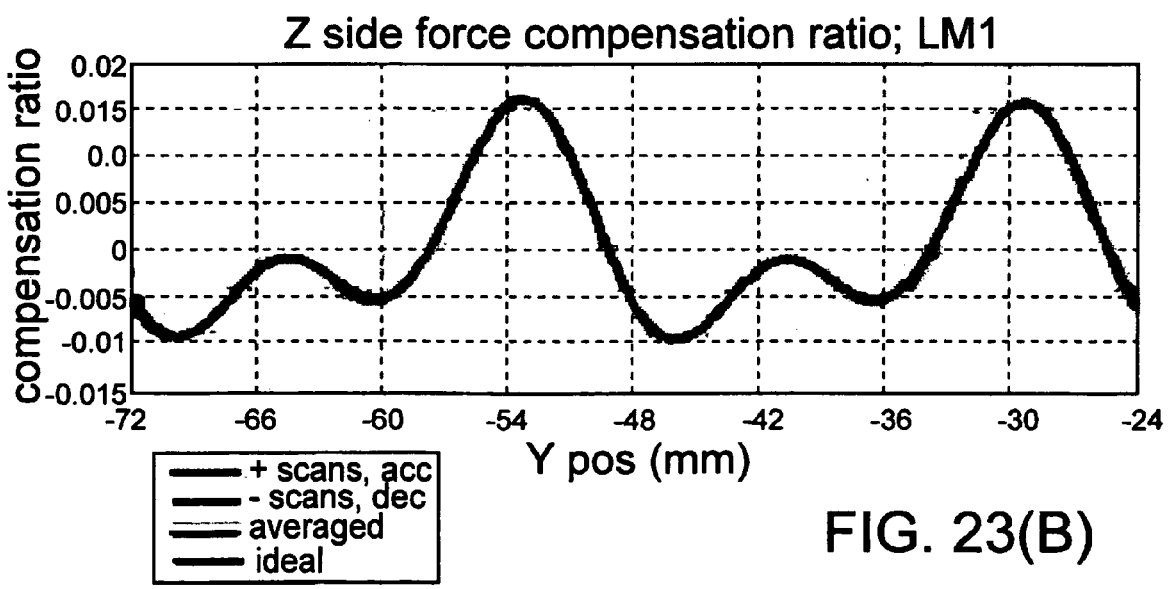
Figure 23C:
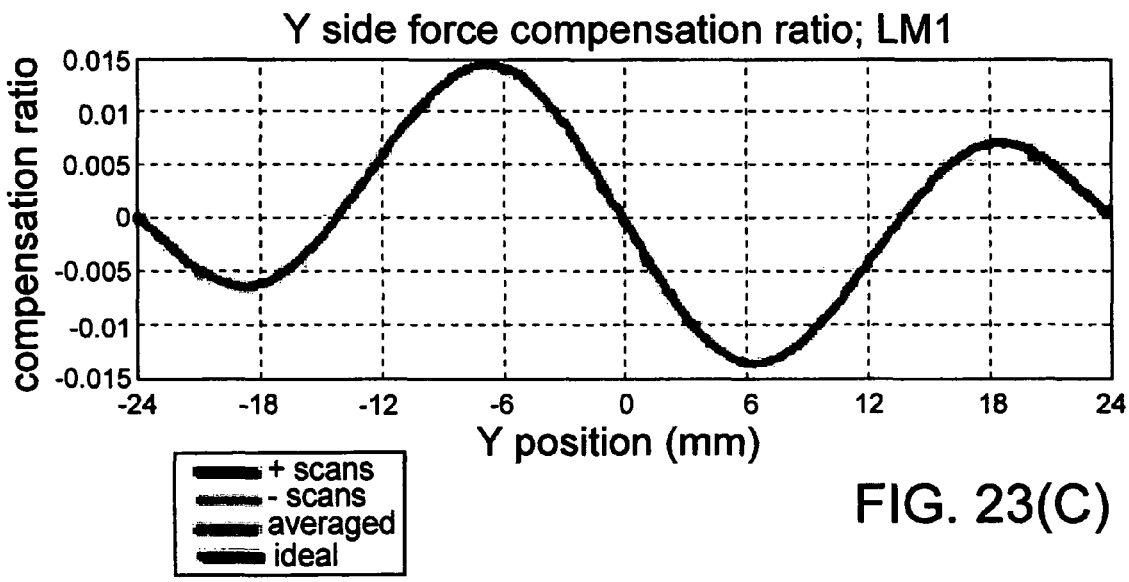
Figure 23D:
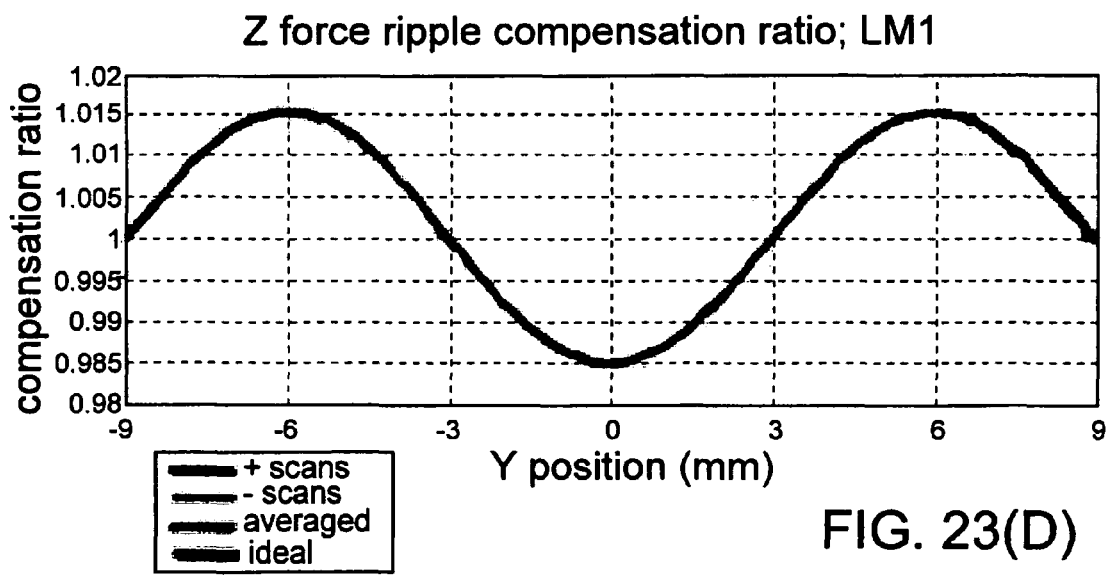

Next, phase errors are corrected in the data (216). Due to possible time delays, maps obtained from +motions and −motions may have phase differences. The phase differences are proportional to the stage velocity and are estimated as respective lags associated with their maximal cross-covariances. Exemplary results for high-acceleration sections (approximately half stage-scanning velocity) for y-force-ripple and z-side-force are shown in FIGS. 23(A) and 23(B), respectively, and exemplary results for constant-velocity sections (full stage-scanning velocity) for y-side-force and z-force-ripple are shown in FIGS. 23(C) and 23(D), respectively. Note that FIGS. 23(A)-23(D) correspond to FIGS. 22(A)-22(D), respectively, except that FIGS. 23(A)-23(D) depict exemplary results after phase correction, and FIGS. 22(A)-22(D) depict exemplary results before phase correction.

A complete map is constructed for LM1 by averaging the phase-corrected maps for +motion and −motion (218).

To identify and construct respective maps for the remaining linear motors LM2-LM4, the respective force-distributions are changed and 202-218, above, are repeated (220). To map LM2, the motors LMY2, LMY3, and LMY4 are used to control y, $\theta_z$, and $\theta_x$, and the motors LMZ2 and LMZ3 are used to control z and $\theta_y$. To map LM3, the motors LMY3, LMY2, and LMY1 are used to control y, $\theta_z$, and $\theta_x$, and the motors LMZ3 and LMZ2 are used to control z and $\theta_y$. To map LM4, the motors LMY4, LMY1, and LMY2 are used to control y, $\theta_z$, and $\theta_x$, and the motors LMZ4 and LMZ1 are used to control z and $\theta_y$.

After identification of side-forces and force-ripple as described above, these forces can be fully compensated by force-compensation matrices identified for each actuator of the set. This eliminates the need to employ ILC for motor-force compensations.

Figure 24:
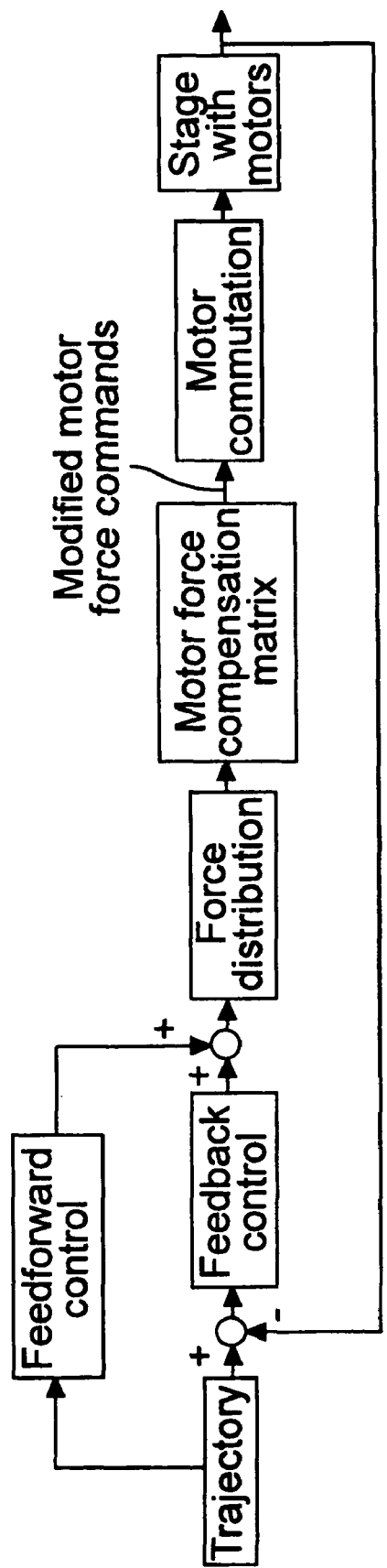
FIG. 24 is a stage-control diagram used in the second representative embodiment after motor-force compensations have been identified.

Each respective element of a compensation matrix desirably is in the form of a lookup table. Data from the lookup table can be applied along with linear interpolation, if necessary or desired, for arbitrary stage positions. Reference is made to FIG. 24 for an example stage-control diagram utilizing motor-force compensations performed after identification.

In various embodiments, using a group of multiple actuators during the identification process can yield compensation data that correspond to the group of actuators. For example, each compensation-ratio derived using multiple actuators includes information for the select combination(s) of actuators. Such a compounded compensation ratio will generally continue to be effective to the extent the relative force distribution between the actuators remains similar to the force distribution applied during the identification process. Accordingly, if one of the actuators is replaced, or as an actuator's characteristics (e.g., magnetic-field strength) drift, actual compensation ratios can differ from those originally derived. In such instances, new compensation ratios desirably are identified using an identification method as described herein.

Third Embodiment of Identification and Compensation Method

An alternative in situ characterization of position-dependent compensation for force-ripple and side-force is now described. This embodiment includes use of an appropriate number of actuators to avoid redundancy (e.g., a number of actuators can be selected to match the number of degrees of freedom for which control is desirable). Compensation ratios for each actuator are identified and applied to arbitrary force-commands.

Position of a movable member is controlled using a first plurality of installed actuators. Using the first plurality (servo actuators), the member is moved throughout its range of motion. During the motion, an actuator (the mapping actuator) is commanded to generate a constant force. The force variation with position applied to the servo actuators results in a force map that combines information for force-ripple, side-force, amplifier gain, and other imperfections in both the servo and mapping actuators. Alternatively, a load-cell or other force-measurement device can be used, in part, to extract a force-command for individual and/or combinations of actuators. By repeating measurements using different combinations of servo and mapping actuators, individual force-commands for each actuator are extracted.

An on-machine identification method that determines compensation ratios for individual actuators can be used to provide a compensation ratio for a group of multiple actuators used for moving and positioning a movable member. Preferably, the individual compensation ratios are identified using a high force to achieve a desirable signal-to-noise ratio. A high signal-to-noise ratio generally improves separation from force transients caused, at least in part, by feed-forward error, mechanical vibrations, and/or other disturbances.

Fourth Embodiment of Identification and Compensation Method

This embodiment is directed to an identification and compensation method applicable to 1DOF actuators (e.g., electromagnetic actuators each providing motion of a movable member in one direction as a principal stroke direction). Thus, the embodiment is directed to identification of force-ripple only.

This embodiment is applied to a stage apparatus 102 as shown in FIG. 1(A), in which four linear actuators 1015a-1015d collectively are used to provide motions of the member 1014 in the y-direction, as the principal stroke direction, as well as $\theta_z$ motions. Since these two motions of the member could be produced by only two of the four actuators, one on each side of the movable member 1014, this stage apparatus 102 has redundant actuators.

To perform this embodiment of the method, it is desirable to reduce the redundancy. If the linear actuators 1015a-1015d are respective linear motors LM1-LM4, actuation of selected combinations of two linear motors provides redundancy reduction while still providing 2DOF stage motion. Any of the following paired combinations can be selected: (LMY1 and LMY3), (LMY1 and LMY4), (LMY2 and LMY3), and (LMY2 and LMY4). The following description is based on the combination LM1 and LM4 being selected.

In this embodiment, ILC is used in the x-, y-, and $\theta_z$ DOFs to have stage performance close to "perfect" despite the existence of force-ripple. ILC need not be used, in which event identifications can be obtained using default feedback and feed-forward controls, for example. ILC is advantageous because, after ILC learning, the stage following-error converges to a very small value (e.g., $<1 \times 10^{-10}$ nm, n-radian).

Figure 25A:
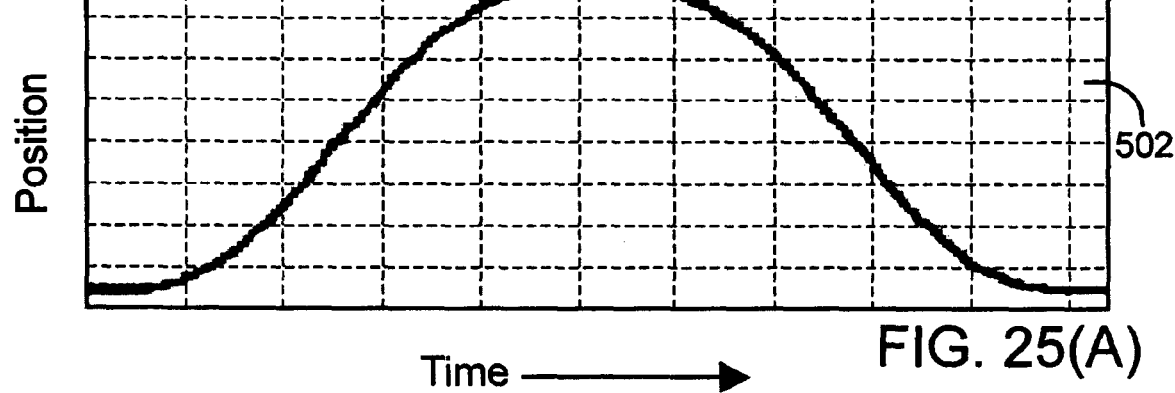
FIG. 25(A) is a plot of y-position versus time for an example displacement by a subject linear actuator along the y-axis as produced in the fourth representative embodiment and in the Example.
Figure 25B:
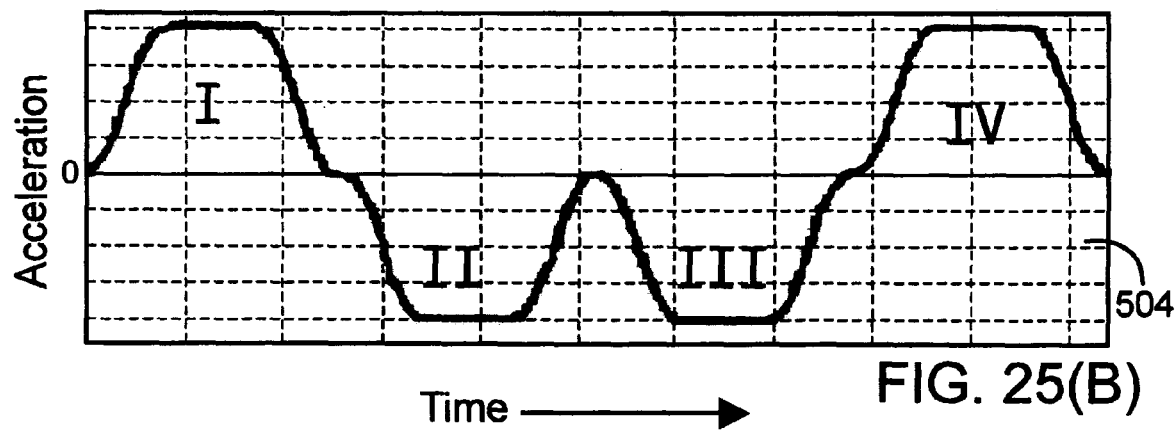
FIG. 25(B) is a plot of acceleration corresponding to the position data in FIG. 25(A). Four regions or sections are denoted, namely two regions or sections of positive acceleration (I and IV) and two regions or sections of negative acceleration (II and III). The regions I-IV are regions of relatively high applied force.
Figure 26A:
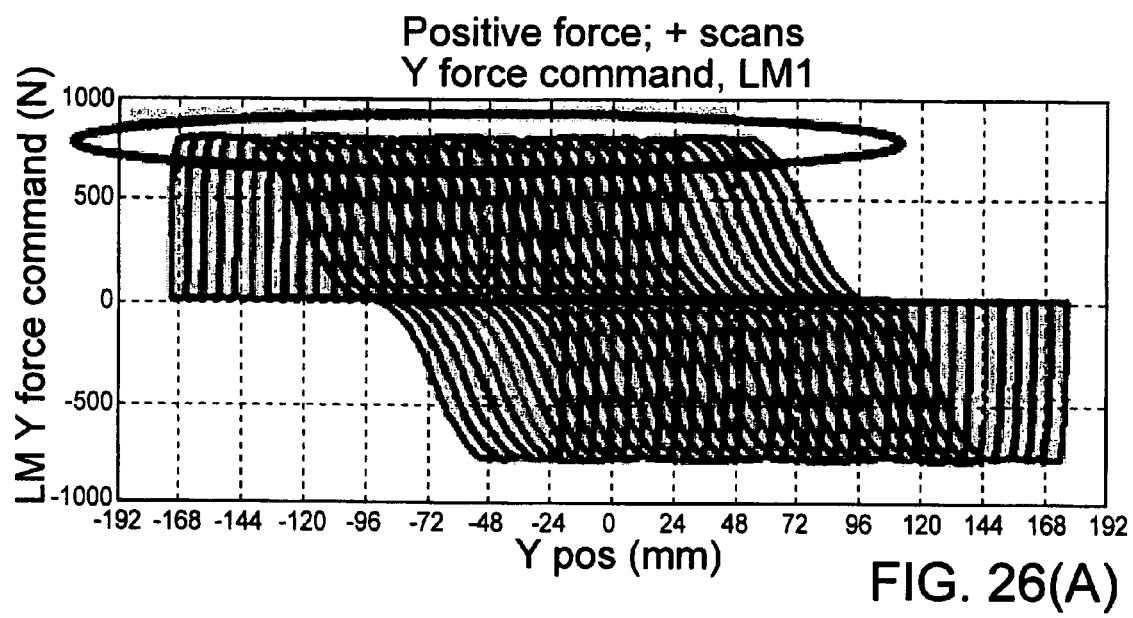
FIGS. 26(A) and 26(B) are plots, as described in the fourth representative embodiment, of y-force-commands produced by a linear actuator LM1 during +scans and −scans, respectively, in the y-direction. The linear actuator LM1 is one of multiple redundant actuators.
Figure 26B:
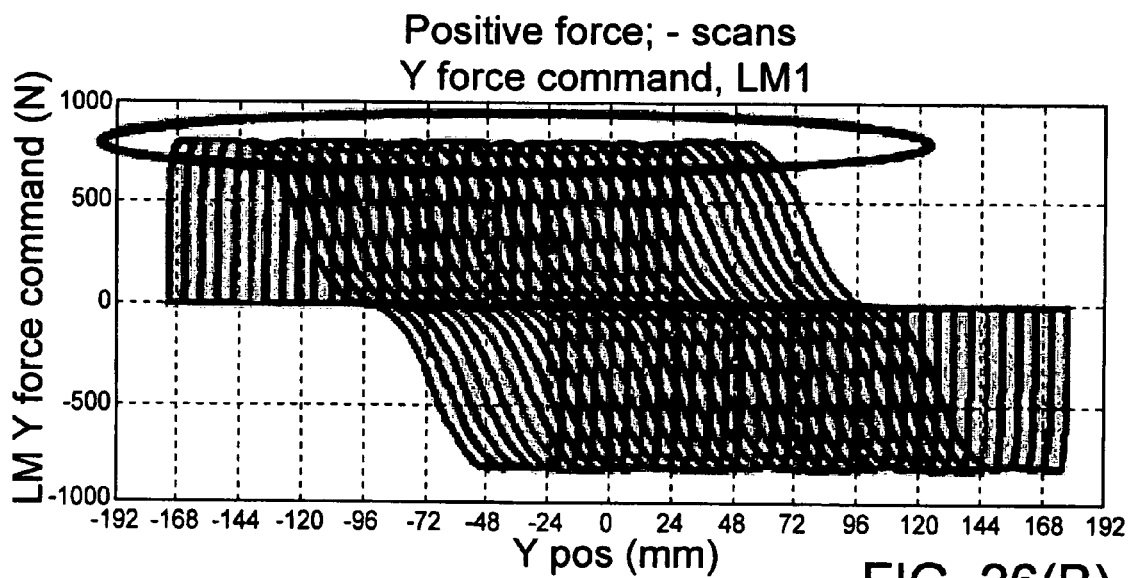

For each linear motor, four high-force sections of acceleration profiles (see FIG. 25(B), sections I-IV) are used to achieve good S/N during identification, including for positive and negative sections of +motions (+scans) and −motions (−scans). The stage trajectory can be rearranged to have zero settling time and zero exposure time. Force distribution can be as set forth in Equation (5). Meanwhile, the position trajectories are incrementally shifted by, e.g., 6 mm for each trajectory (by changing the respective starting position of each trajectory) to assure overlap of the data from one trajectory to the next. Example results are plotted in FIGS. 26(A) and 26(B) for y-force-commands produced by LM1 during +scans and −scans, respectively.

Figure 27A:
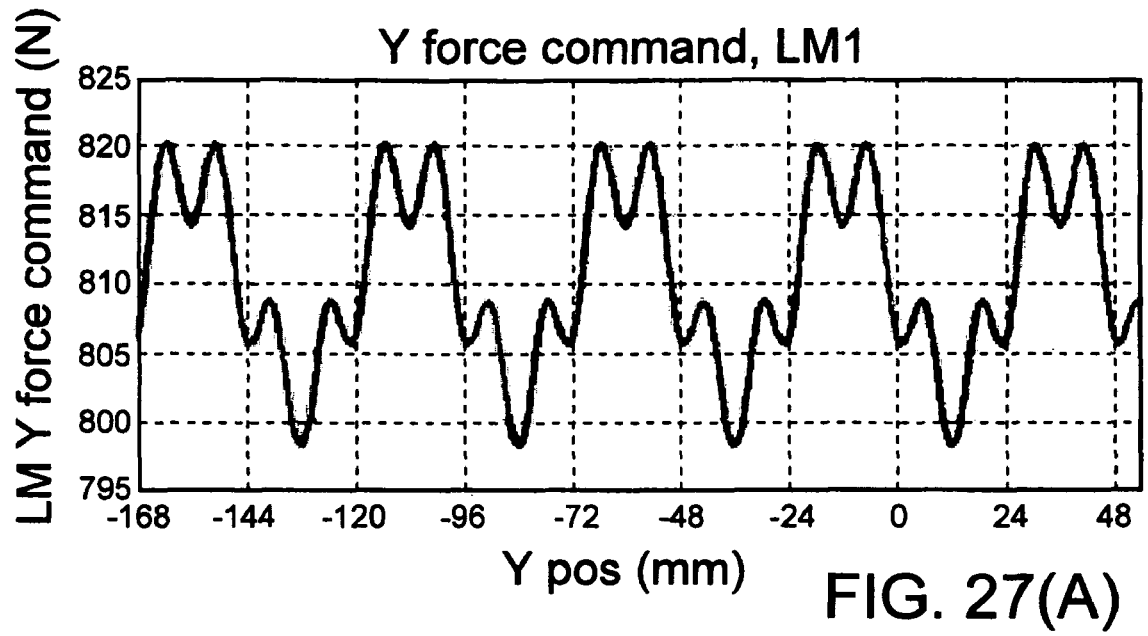
FIGS. 27(A) and 27(B) are plots prepared from the collected individual force-commands for the series of trajectories described in the fourth representative embodiment. To achieve better S/N, only the high-force sections were considered and assembled for +scans and −scans, respectively. As plotted, each force section overlapped with adjacent sections very smoothly.
Figure 27B:
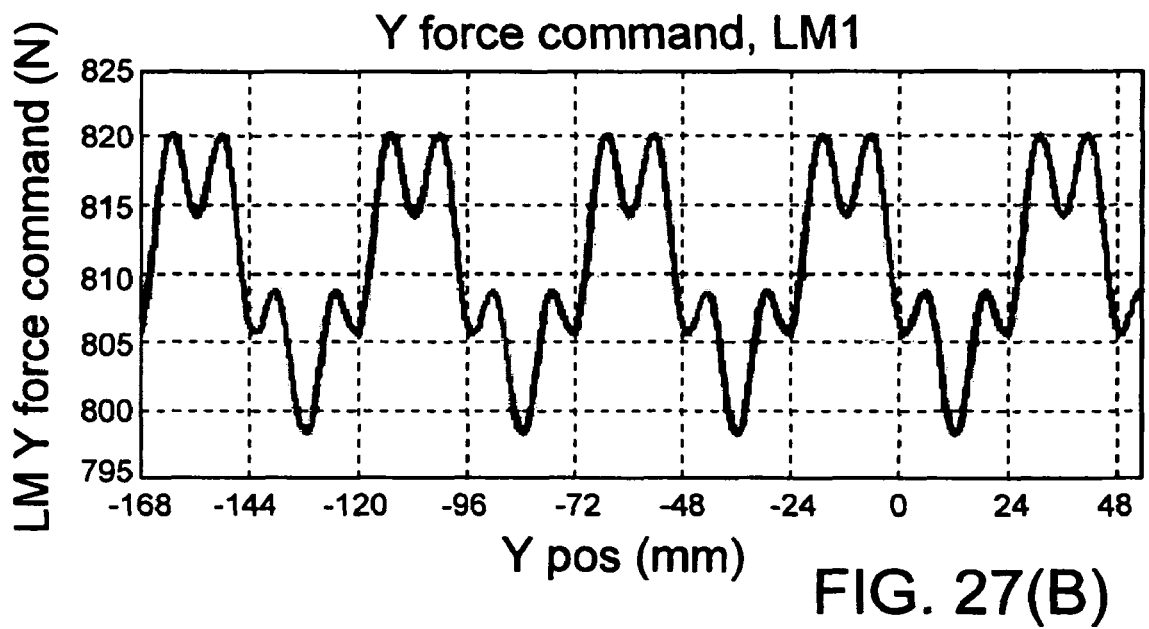

From the collected individual force-commands for the series of trajectories, to achieve better S/N, only the high-force sections are considered and assembled, yielding the data in FIGS. 27(A) and 27(B) for +scans and −scans, respectively. As can be seen, each force section is overlapped with adjacent sections very smoothly.

Figure 29A:
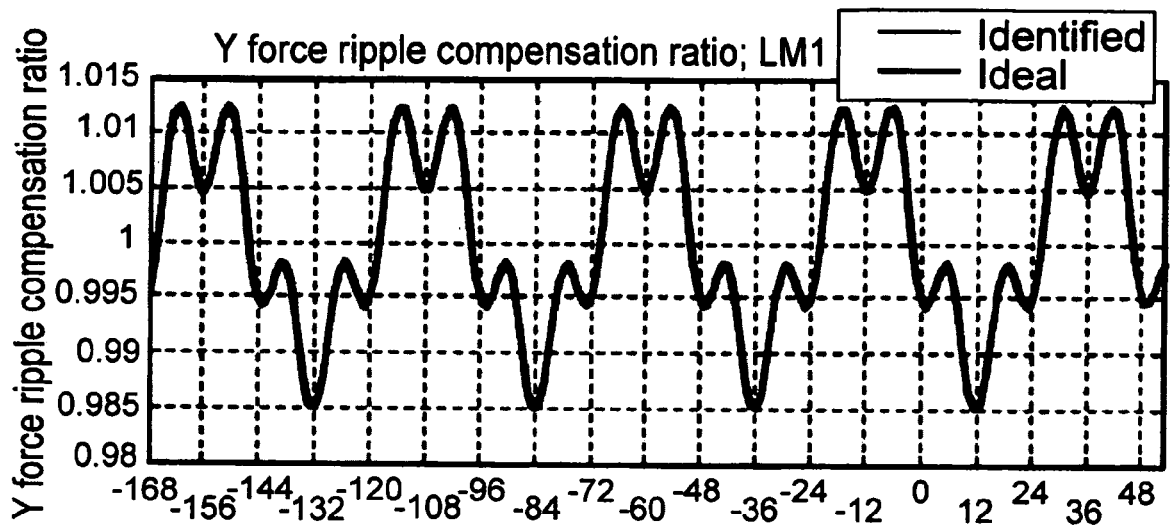
FIGS. 29(A) and 29(B) are plots of the data of FIGS. 28(A) and 28(B), respectively, in which the respective force-ripple compensation ratios are represented by averages from all overlapping sections. The curves in each instance followed "ideal" maps closely.
Figure 29B:
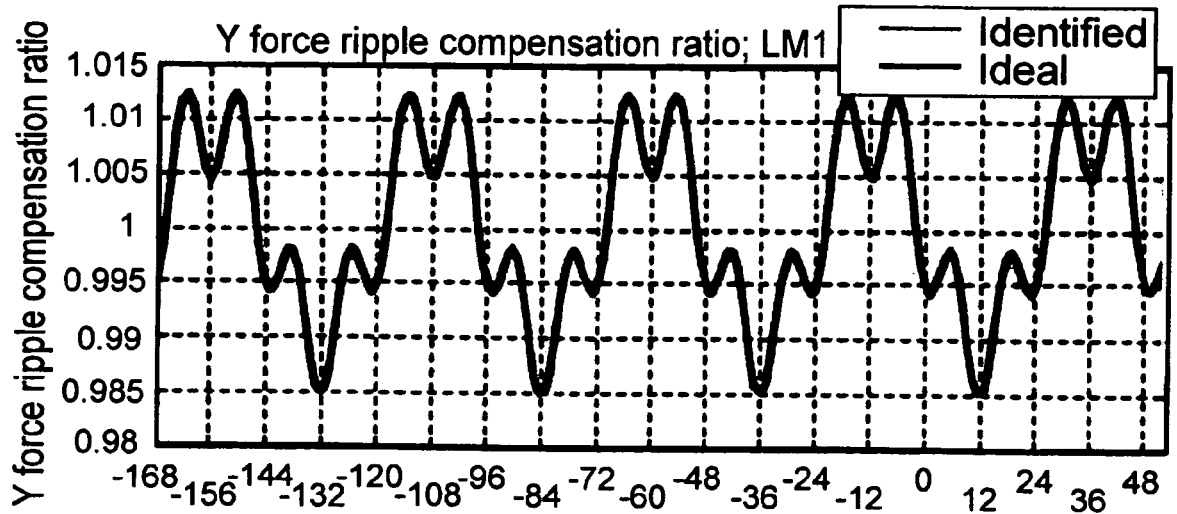
Figure 30A:
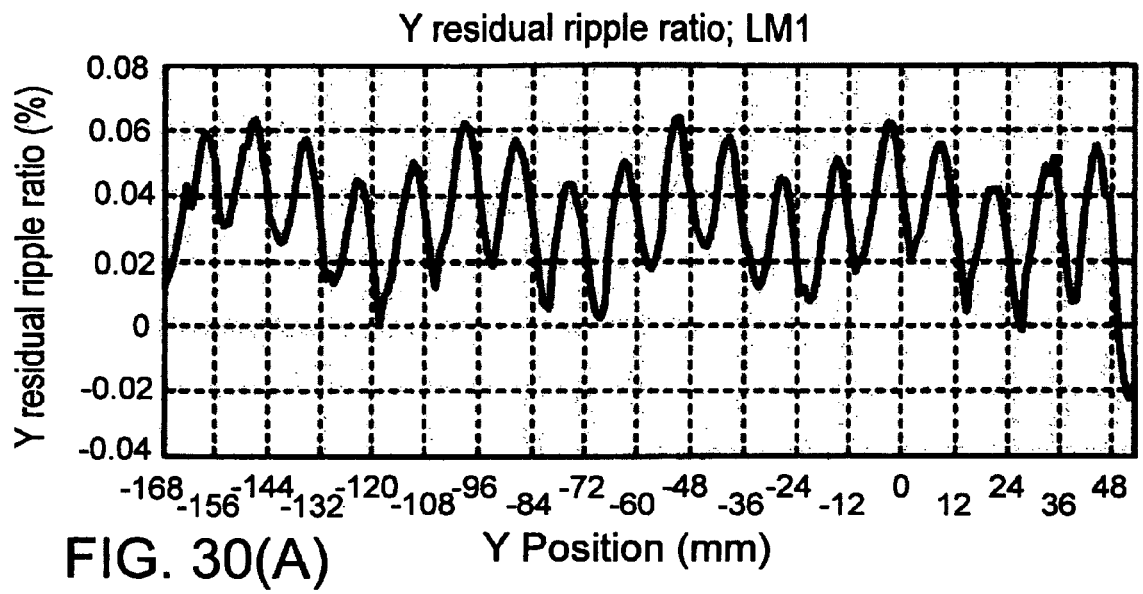
FIGS. 30(A) and 30(B) are plots of residual compensation ratios of force-ripple (=ripple compensation ratio*ripple−1) for the +scans and −scans, respectively, in the fourth representative embodiment.
Figure 30B:
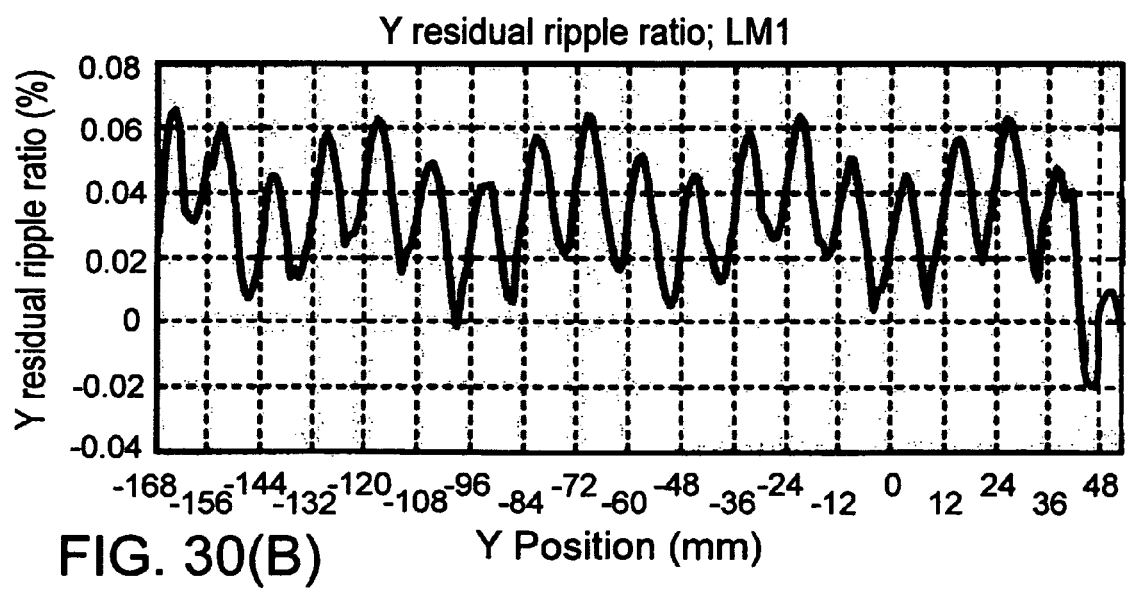

Force at the respective data points can be calculated and averaged as set forth in Equations (9) and (10), wherein $F_{j,k}$ represents the respective force at each data point (k=1, ..., n) of interest in each trajectory section (j=1, ..., N). The averaged force $\overline{F}_k$ across different trajectory sections may be regarded as the common force, which compensates for system transient response and other non-position-dependent disturbances. The ratio of each section force $F_{j,k}$ over the common force $\overline{F}_k$ yields the compensation ratios to be applied to the linear-motor force-commands for force-ripple compensations. After performing interpolation to ascertain data between subsequent trajectories, the data as plotted in FIGS. 28(A) and 28(B) yielded continuous plots of ripple compensation ratio versus y-position, wherein FIG. 28(A) is plot of data from the +scans, and FIG. 28(B) is a plot of data from the −scans. At each point on these curves, if the ripple compensation ratios are represented by averages from all overlapping sections, the resulting data appear as shown in FIGS. 29(A)-29(B) for +scans and −scans, respectively. Note that the curves in each instance followed "ideal" maps closely. Residual ratios of force-ripple (=ripple compensation ratio*ripple−1) are plotted in FIGS. 30(A)-30(B) for the +scans and −scans, respectively.

The ripple-compensation maps obtained from the respective +force sections of +scans and −scans appear very similar. They share the same position range. A plot of respective average data from both maps yields the compensation map, for all +force, shown in FIG. 31(A). The residual ripple ratio after compensation, for +force, is plotted in FIG. 31(B). Similarly, FIG. 32(A) is a compensation map, similar to FIG. 31(A), for all −force, and FIG. 32(B) is a plot of residual ripple ratio after compensation for −force, similar to FIG. 31(B).

Figure 31A:
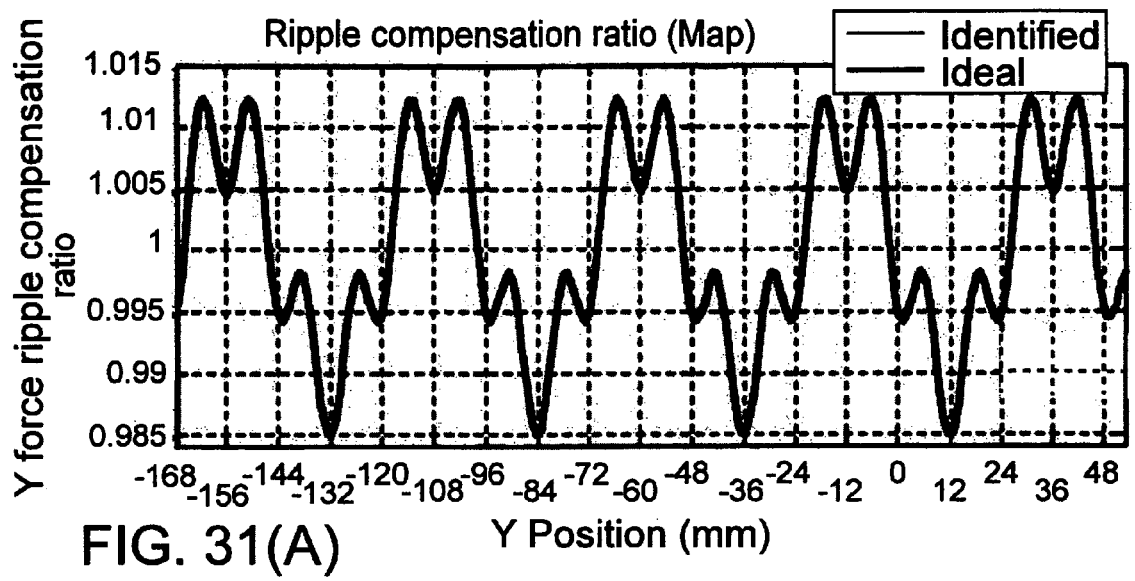
FIG. 31(A) is a force-ripple compensation map, prepared from average data from FIGS. 30(A) and 30(B), including data from +force sections of +scans and −scans, respectively.
Figure 31B:
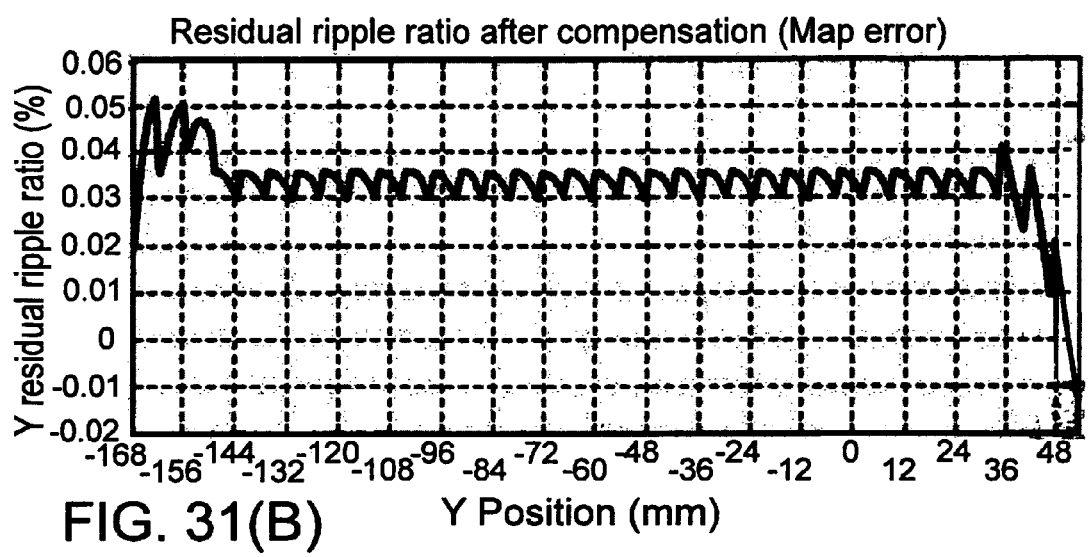
FIG. 31(B) is a plot of the residual force-ripple compensation ratio after compensating over all +force sections, from the data in FIG. 31(A).
Figure 32A:
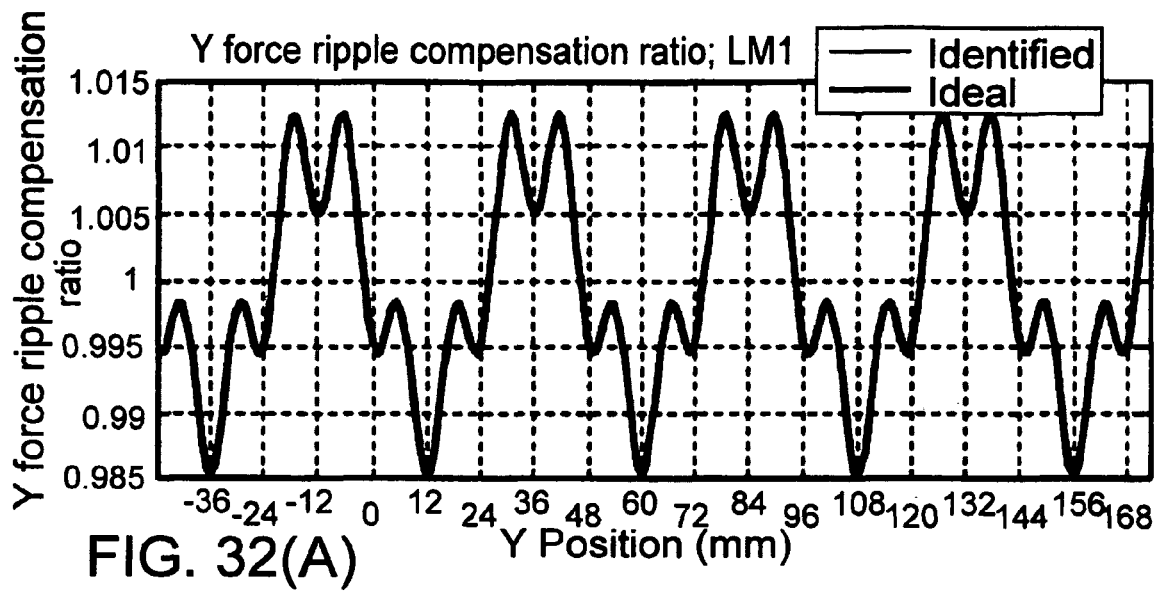
FIG. 32(A) is a force-ripple compensation map, similar to FIG. 31(A), for all the −force data (+scans and −scans).
Figure 32B:
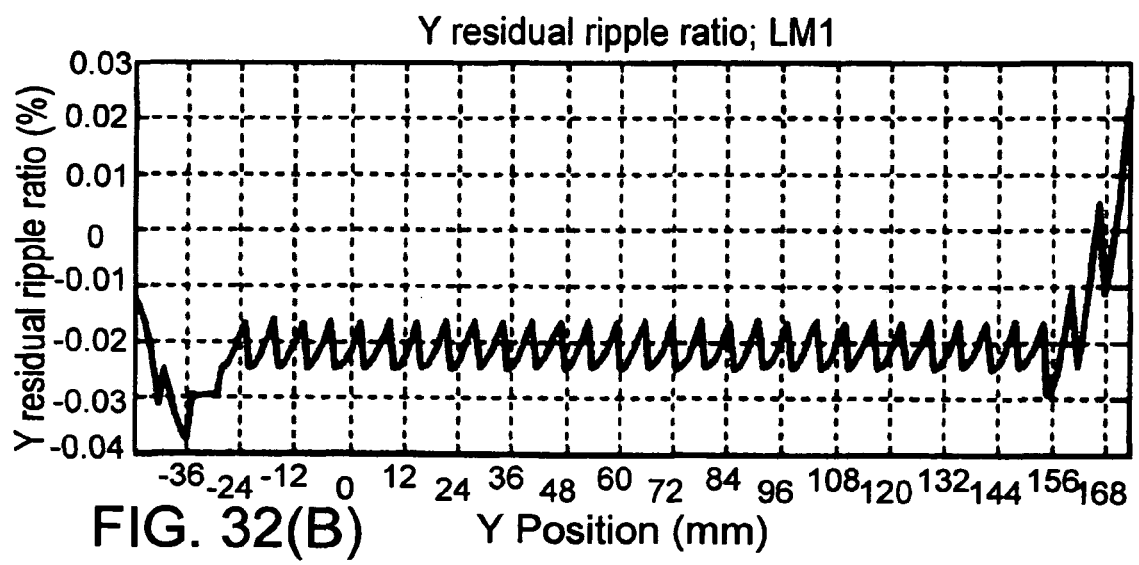
FIG. 32(B) is a plot of the residual force-ripple compensation ratio after compensating over all −force sections, similar to FIG. 31(B).
Figure 33A:
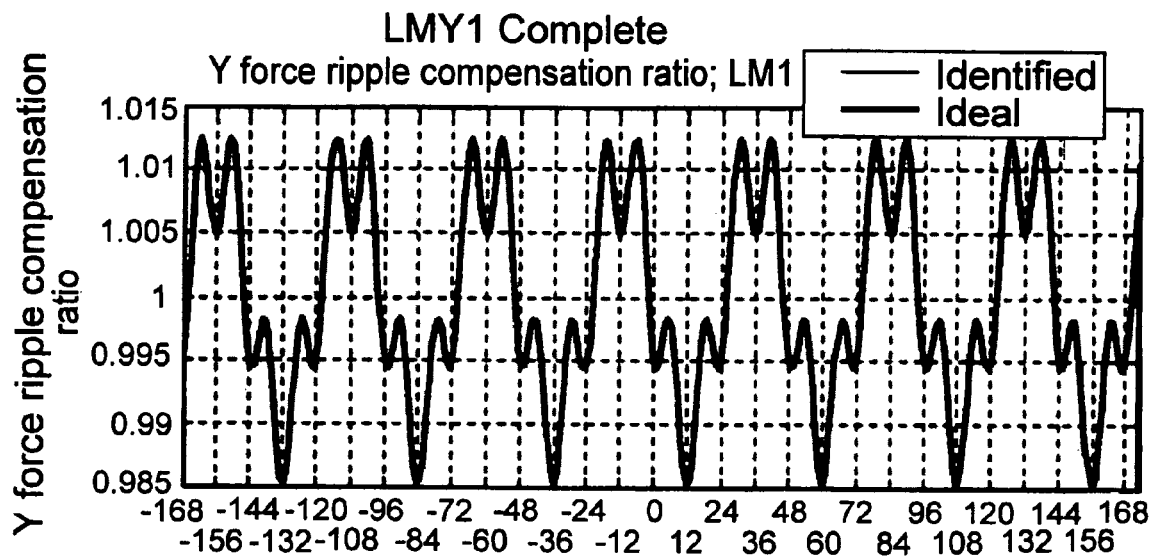
FIG. 33(A) is a plot of all the +force and −force data for LMY1, as averaged to produce a complete force-ripple compensation map to cover the entire position range for the actuator. The data in the maps of FIGS. 31(A) and 32(A) were aligned to reduce dc offsets, and then averaged at every position point in their common position areas, to produce the map in FIG. 33(A).
Figure 33B:
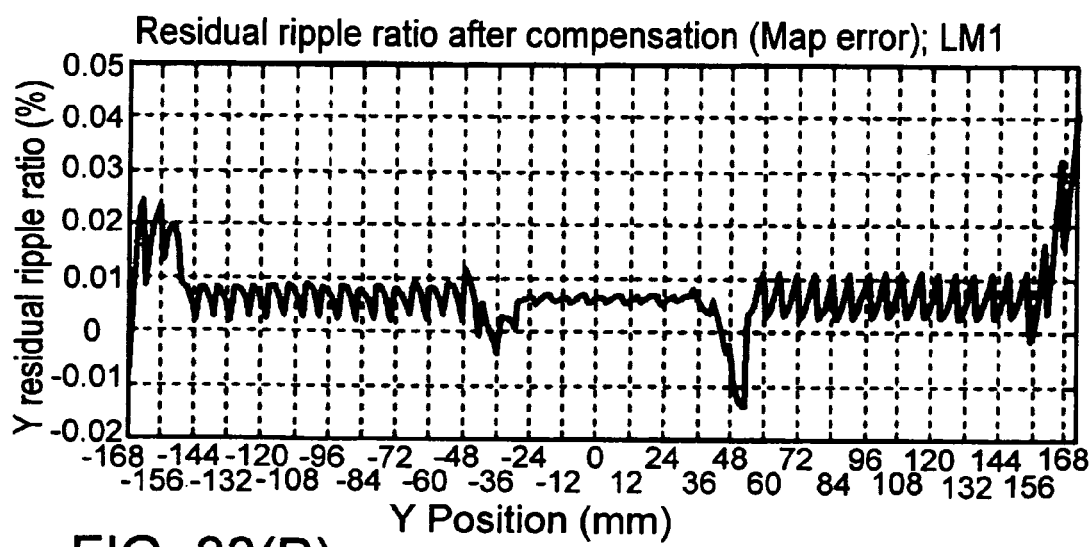
FIG. 33(B) is a plot of residual force-ripple ratio after compensation, for the data in FIG. 33(A).

The maps for +force and −force in FIGS. 31(A) and 31(B), respectively, share positive areas. Hence, the two maps can be assembled into a complete map to cover the entire position range of LMY1 by aligning their dc offsets and then averaging their associated values at every position point in their common position areas. The resulting complete force-ripple map for LMY1 is plotted in FIG. 33(A), with FIG. 33(B) providing a plot of the residual ripple ratio after compensation.

Figure 34A:
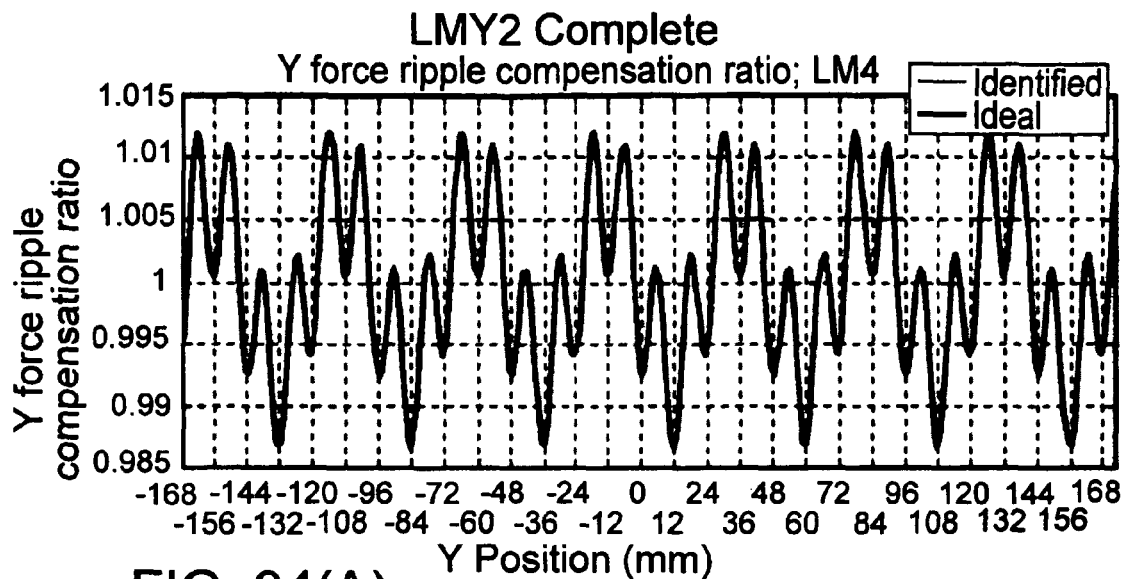
FIGS. 34(A)-34(C) are complete ripple-compensation maps, produced in a manner similar to FIG. 33(A), for LMY4, LMY2, and LMY3, respectively, of the apparatus evaluated in the fourth representative embodiment.
Figure 34B:
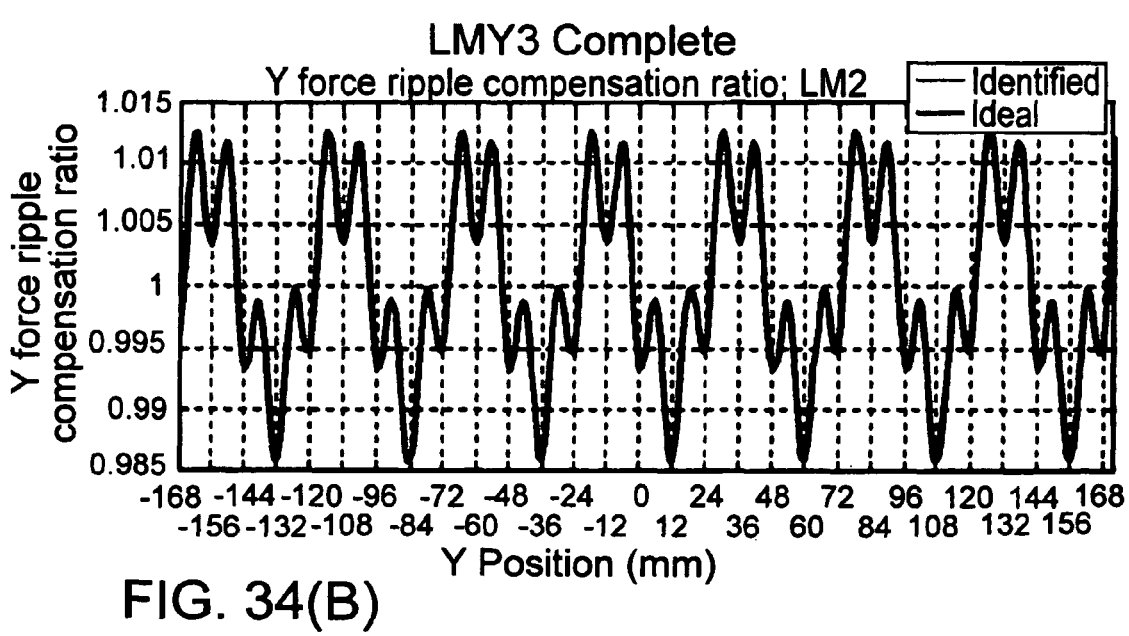
Figure 34C:
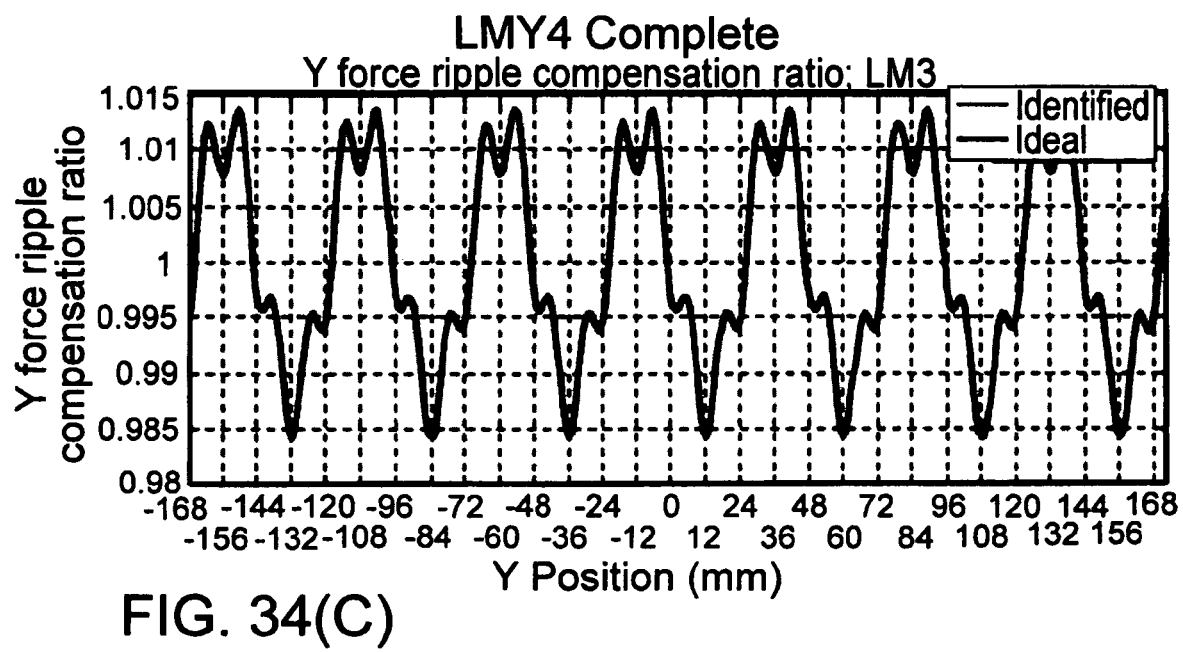

The foregoing can be repeated to obtain complete maps for LMY4, LMY2, and LMY3, which are shown in FIGS. 34(A)-34(C), respectively. Considering the results shown in these plots and in FIG. 33(A), with all four actuators and with ILC and removal of actuator redundancy during mapping, very accurate identifications were made, with residual ratios being well below 0.1%.

EXAMPLE

A position-dependent compensation ratio was derived for a reticle-stage incorporated as part of a photolithography machine. Mechanical response, including vibrations of the photolithography machine, was simulated using well-known numerical techniques. The reticle stage was driven by four linear actuators. During in situ identification of compensation ratios, the reticle-stage was driven by forces lower than those used in normal operation by reducing the number of actuators invoked. By invoking fewer than all the actuators, compensation ratios for combinations of one or more individual actuators were extracted. FIG. 25(A) illustrates the one-axis trajectory used in deriving the compensation ratio. FIG. 25(A) includes a plot 502 of actuator position versus time and FIG. 25(B) includes a plot 504 of acceleration versus time. Both plots 502, 504 are based on the same time scale. Although the trajectory of FIG. 25(A) extends only through a portion of the possible range of motion for the actuator, repeating the trajectory from multiple initial positions articulated the reticle-stage throughout the linear actuator's range of motion in discrete increments. Further, by using a trajectory that employed periods of high acceleration, good signal-to-noise ratios (S/N) were obtained.

In the plot 504 of FIG. 25(B), sections of positive and negative acceleration throughout the trajectory are labeled with respective Roman numerals I-IV. Each section I-IV corresponds to a respective range of positions along the trajectory and respective forces applied to the member. For example, section I is directed to a first range of position through which the member was moved in a positive direction under a positive force—that is to say the member accelerated throughout section I. In section II, the member's motion was in a positive direction, but under a negative force—that is to say the member decelerated throughout section II and eventually stopped between sections II and III. The member accelerated again in section III, but this time in a negative direction, under a negative force. In section IV, the member moved in a negative direction under a positive force—that is to say the member decelerated throughout section IV.

Side-force and force-ripple were determined for the actuator according to actuator position. Although the remainder of this example proceeds with respect to force-ripple rather than side-force, the method can be equally well employed to characterize and compensate for actuator side-force.

FIG. 35 illustrates a superimposed plot of the plurality of actuator force-commands directed toward moving the member through section I and section II of the trajectory of FIGS. 25(A)-25(B) for various initial positions. In each instance, the trajectory follows the same acceleration profile, but the initial positions varied. For example, the reticle stage was displaced according to the trajectory of FIG. 25(A), beginning at a first initial position. After being displaced through the trajectory, the reticle stage was positioned approximately 6 mm (millimeters) from the first initial position. The reticle stage was then displaced according to the trajectory of FIG. 25(A). Each such incremental displacement was termed a "shot." After each shot, the reticle stage was re-positioned to a new initial position. This procedure was repeated for approximately 32 different initial positions, although different numbers of initial positions could have been used. The number of initial positions can vary according to, inter alia, a desired spatial resolution of compensation ratio, extent of the range of motion through which the actuator can travel, and time available for deriving the compensation ratio.

FIG. 36 illustrates truncated portions of extracted force-command sections corresponding to each initial position and section I of the trajectory of FIG. 25(B). The extracted force-commands of FIG. 36 include portions of the data of FIG. 35 located within the horizontal ellipse.

Figure 37:
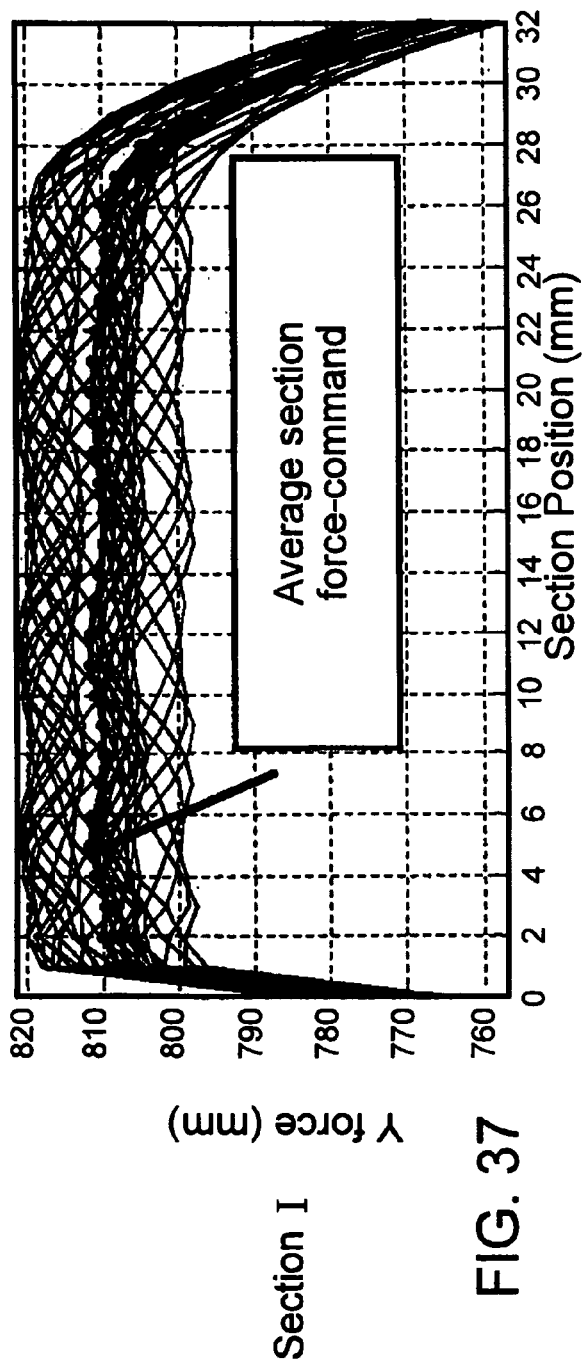
FIG. 37 is a plot of the section force-commands of FIG. 36 after transforming the spatial coordinates of FIG. 36 to correspond to a section co-ordinate system as shown. Also shown is a plot (bold) of the average section force-command.

To define a compensation ratio—that is the ratio of actual force-command supplied to achieve a desired trajectory compared to a reference force-command—the reference force-command was extracted as an average force-command. FIG. 37 illustrates the section force-commands of FIG. 36 after transforming the spatial co-ordinates of FIG. 36 to correspond to a section co-ordinate system as shown. FIG. 37 also illustrates an average section force-command superimposed thereon.

Although the average section force-command was used to normalize the section force-command of FIG. 36, other reference force-commands are possible. For example, low-pass filtering can be applied to experimentally obtained force-commands. Alternatively, numerical simulations can predict a section force-command, and the prediction can serve as the reference force-command.

Figure 38:
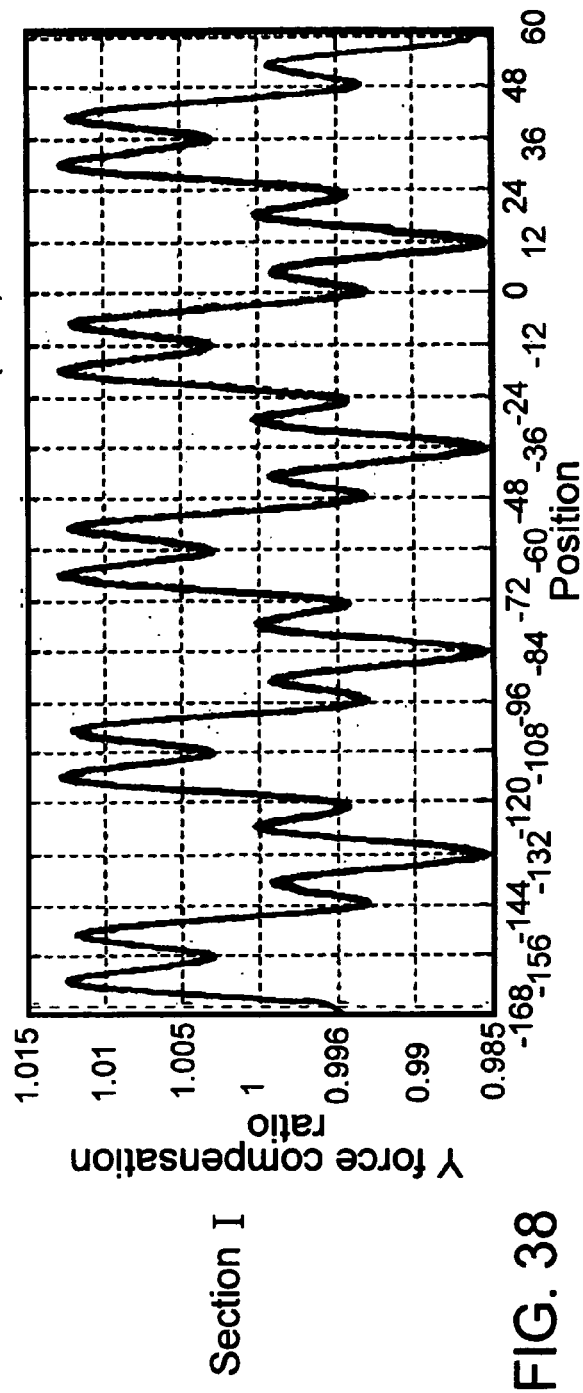
FIG. 38 is a plot of the compensation ratios for section I of the trajectory shown in FIG. 25(B), where the compensation ratio resulted from normalizing the extracted section force-commands of FIG. 36 by the average section force-command of FIG. 37.
Figure 39:
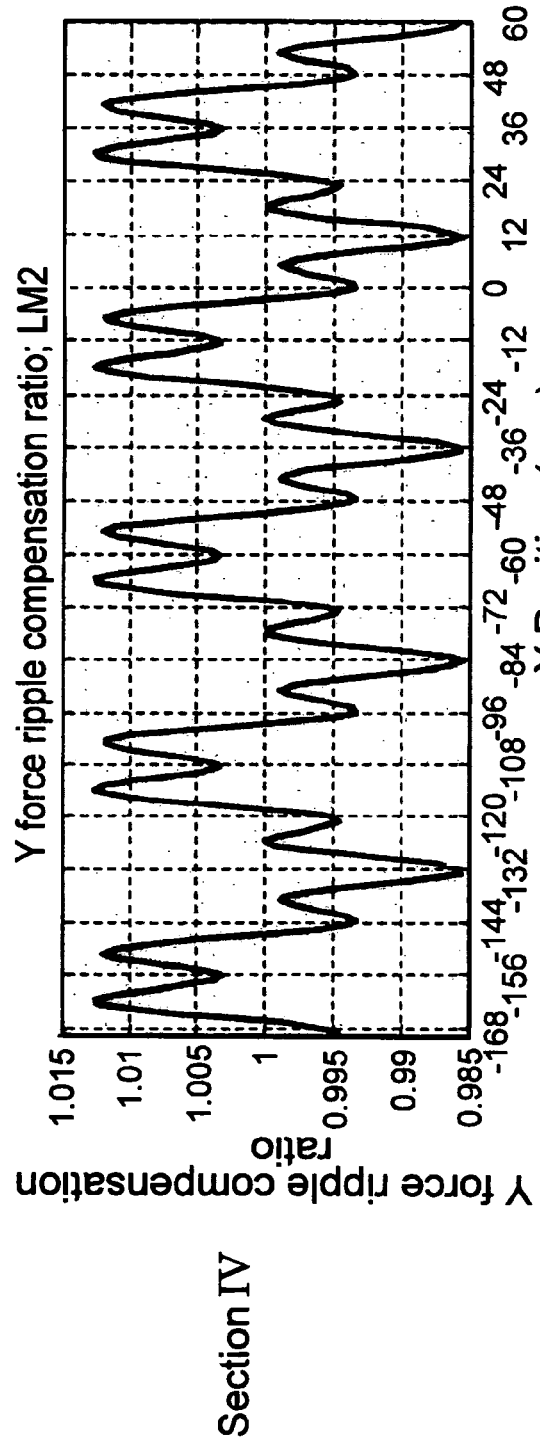
FIG. 39 is a plot, similar to FIG. 38, of the section-compensation ratios for section IV. The section compensation ratios for section IV include effects for approximately the same forces and actuator positions as section I, but for motion in a direction opposite to that of Section I.

FIG. 38 illustrates a compensation ratio for section I of the trajectory shown in FIG. 25(B), where the compensation ratio resulted from normalizing (e.g., dividing, subtracting, and more complex mathematical functions and/or expressions) the extracted section force-commands of FIG. 36 by the average section force-command of FIG. 37. FIG. 39 illustrates a section-compensation ratio for section IV similarly derived. The section compensation ratio for section IV includes effects for approximately the same forces and actuator positions as section I, but for motion in a direction opposite to that of Section I.

Figure 40:
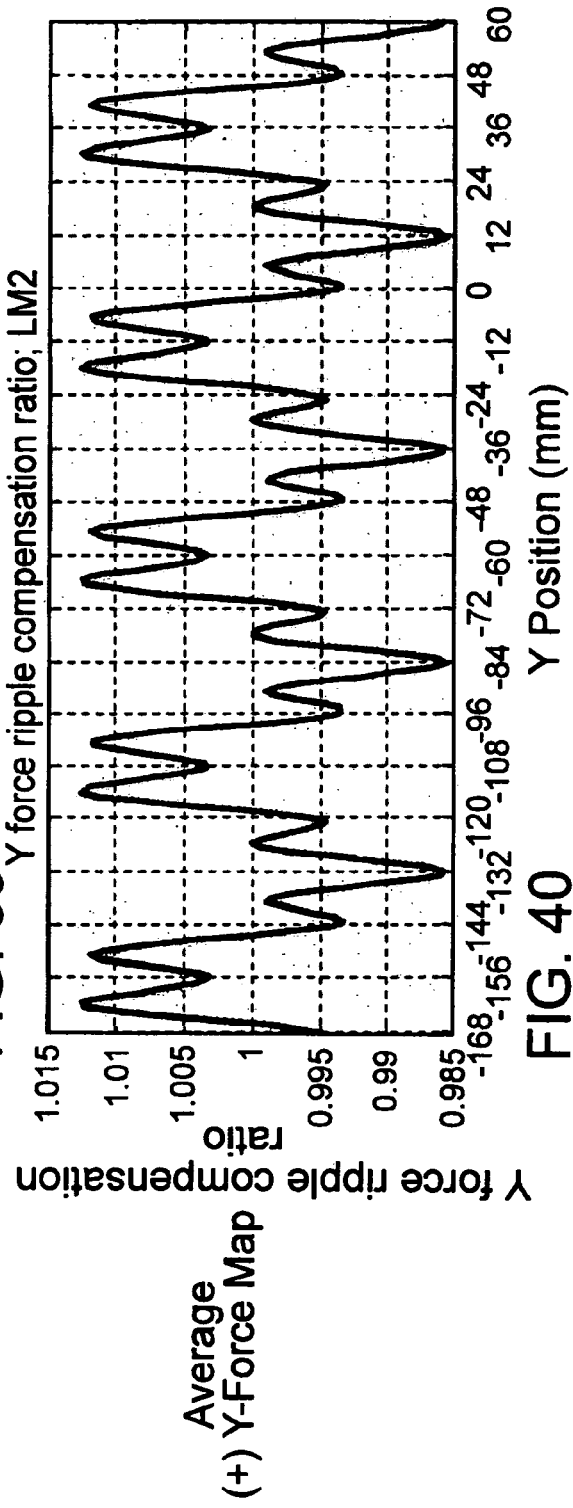
FIG. 40 is a map of averaged and combined data on section-compensation ratios that were shown in FIGS. 38 and 39. Averaged section compensation-ratios for sections II and III can be similarly derived.
Figure 41:
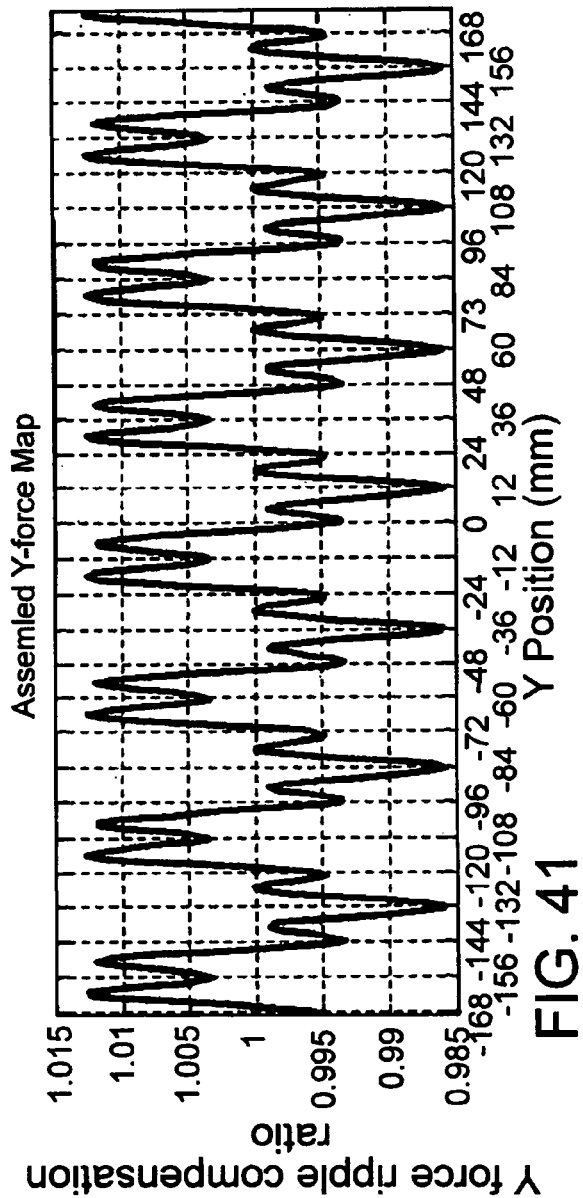
FIG. 41 is a plot of assembled compensation ratios throughout a range of motion defined by the various initial positions and the trajectory and thus includes compensation-ratios for each of sections I-IV, as described in the Example.

FIG. 40 illustrates a section-compensation ratio according to actuator position after combining (e.g., by averaging, defining a polynomial curve fit, performing a least squares curve fit, discarding anomalous portions, and/or a combination of the foregoing) the compensation ratios illustrated by FIGS. 38 and 39. Combining plural section compensation-ratios tends to minimize variations according to actuator direction of travel. Although not illustrated, section compensation-ratios for sections II and III were similarly derived. FIG. 41 illustrates an assembled compensation ratio throughout a range of motion defined by the various initial positions and the trajectory and thus includes compensation-ratios for each of sections I-IV. During assembly, some compensation ratios overlapped according to actuator position. In regions of overlap, the multiple compensation ratios were averaged to define a single, average compensation ratio for each actuator position throughout the range of motion.

Figure 42:
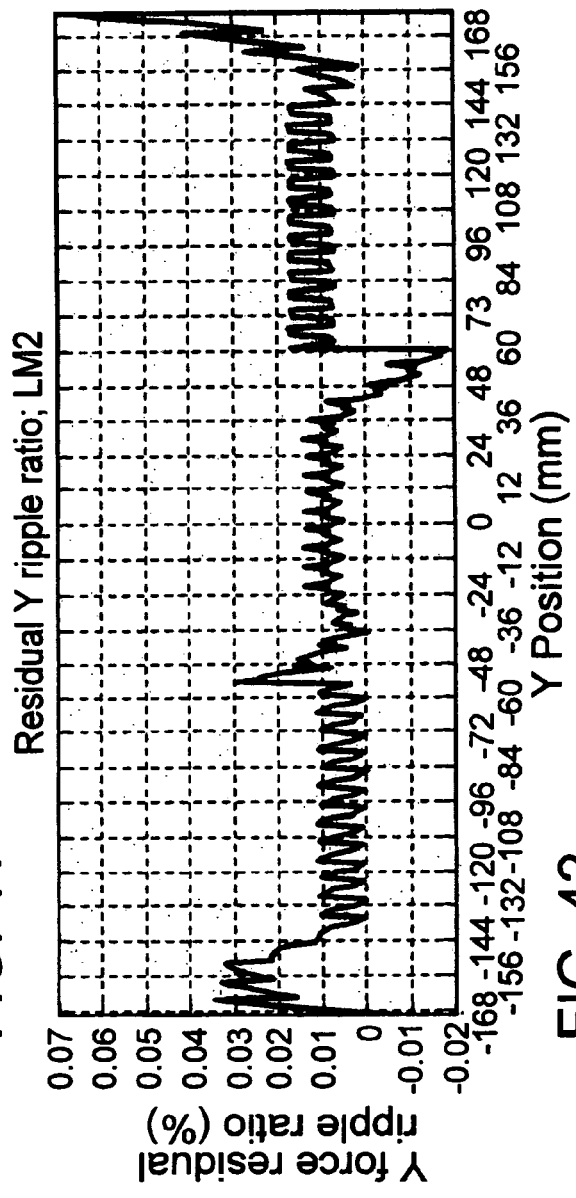
FIG. 42 is a map of relative error in the compensation-ratio plot of FIG. 41, compared to a theoretical compensation ratio.

FIG. 42 illustrates relative error in the compensation ratio of FIG. 41 compared to a theoretical compensation ratio for the simulated photolithography machine of this example. As shown, the in situ method employed in this example demonstrated close agreement with theoretical actuator force-commands.

Exemplary Computing Environment

Figure 43:
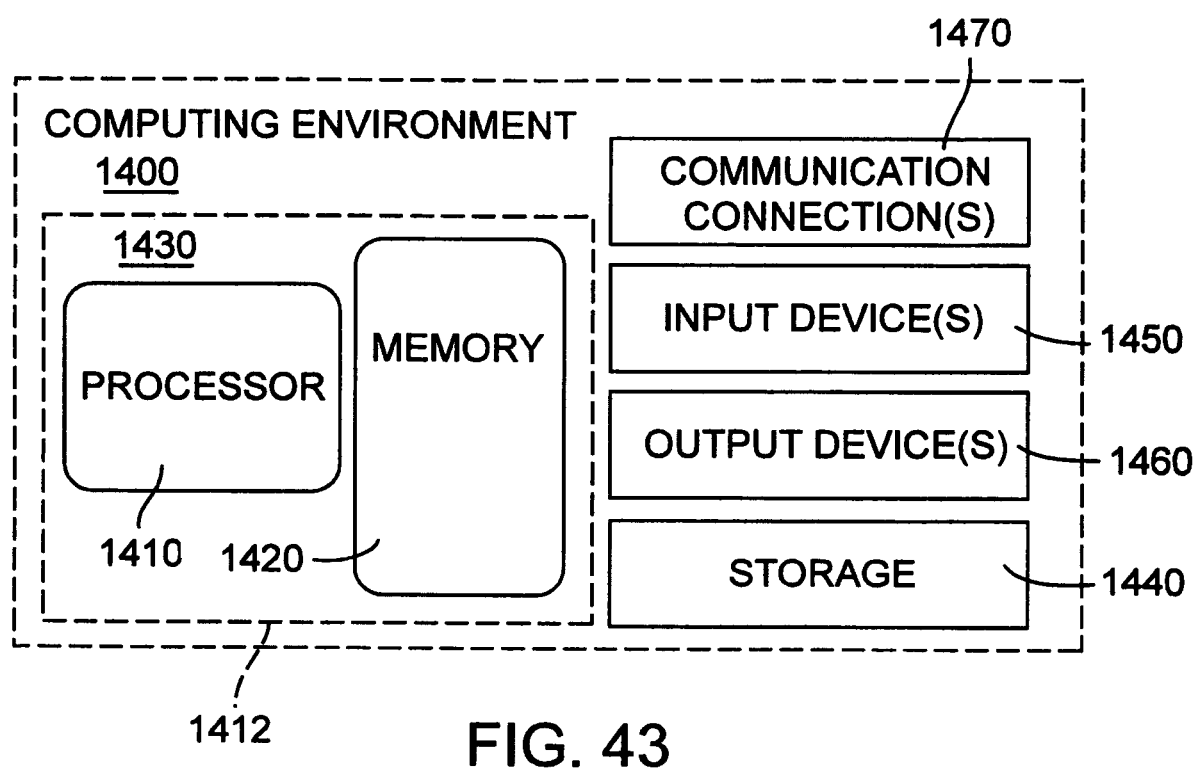
FIG. 43 is a block diagram of an exemplary computing environment in which the subject methods can be implemented.

FIG. 43 illustrates a generalized example of a suitable computing environment in which the described techniques can be implemented. The computing environment is not intended to suggest any limitation as to scope of use or functionality, as the technologies above can be implemented in diverse general-purpose or special-purpose computing environments. Mobile computing devices can similarly be considered a computing environment and can include computer-readable media. A mainframe environment will be different from that shown, but can also implement the technologies and can also have computer-readable media, one or more processors, and the like.

With reference to FIG. 43, the computing environment 1400 includes at least one processor 1410 and memory 1420. This most basic configuration 1430 is included within a dashed line 1412. The processor 1410 executes computer-executable instructions and may be a real or a virtual processor. In a multi-processing system, multiple processors execute computer-executable instructions to increase processing power. The memory 1420 may be volatile memory (e.g., registers, cache, RAM), non-volatile memory (e.g., ROM, EEPROM, flash memory, etc.), or some combination of the two. The memory 1420 can store software implementing any of the technologies described herein.

Embodiments of computing environments may have additional features. For example, the computing environment 1400 includes storage 1440, one or more input devices 1450, one or more output devices 1460, and one or more communication connections 1470. An interconnection mechanism (not shown) such as a bus, controller, or network interconnects the components of the computing environment 1400. Typically, operating system software (not shown) provides an operating environment for other software executing in the computing environment 1400, and coordinates activities of the components of the computing environment.

The storage 1440 may be removable or non-removable, and can include one or more of magnetic disks, magnetic tapes, cassettes, CD-ROMs, DVDs, and any of various other computer-readable media that can be used to store information and that can be accessed within the computing environment 1400. The storage 1440 can store software containing instructions for any of the technologies described herein.

The input device(s) 1450 may be a touch input device such as a keyboard, keypad, touch screen, mouse, pen, or trackball, a voice-input device, a scanning device, or another device that provides input to the computing environment 1400. For audio, the input device(s) 1450 may be a sound card or similar device that accepts audio input in analog or digital form, or a CD-ROM reader that provides audio samples to the computing environment. The output device(s) 1460 may be a display, printer, speaker, CD-writer, or another device that provides output from the computing environment 1400.

The communication connection(s) 1470 enable communication over a communication medium to another computing entity (not shown). The communication medium conveys information such as computer-executable instructions, audio/video or other media information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

Communication media can embody computer-readable instructions, data structures, program modules or other data in a modulated data signal such as a carrier wave or other transport mechanism and includes any information-delivery media. The term "modulated data signal" means a signal that has one or more of its characteristics set or changed in such a manner as to encode information in the signal. Communication media include wired media such as a wired network or direct-wired connection, and wireless media such as acoustic, RF, infrared and other wireless media. Combinations of any of the above can also be included within the scope of computer-readable media.

The techniques herein can be described in the general context of computer-executable instructions, such as those included in program modules, being executed in a computing environment on a target real or virtual processor. Generally, program modules include routines, programs, libraries, objects, classes, components, data structures, etc., that perform particular tasks or implement particular abstract data types. The functionality of the program modules may be combined or split between program modules as desired in various embodiments. Computer-executable instructions for program modules may be executed within a local or distributed computing environment.

Methods in Computer-Readable Media

Any of the methods described herein can be implemented by computer-executable instructions in one or more computer-readable media (e.g., computer-readable storage media or other tangible media).

Microlithography System

Figure 44:
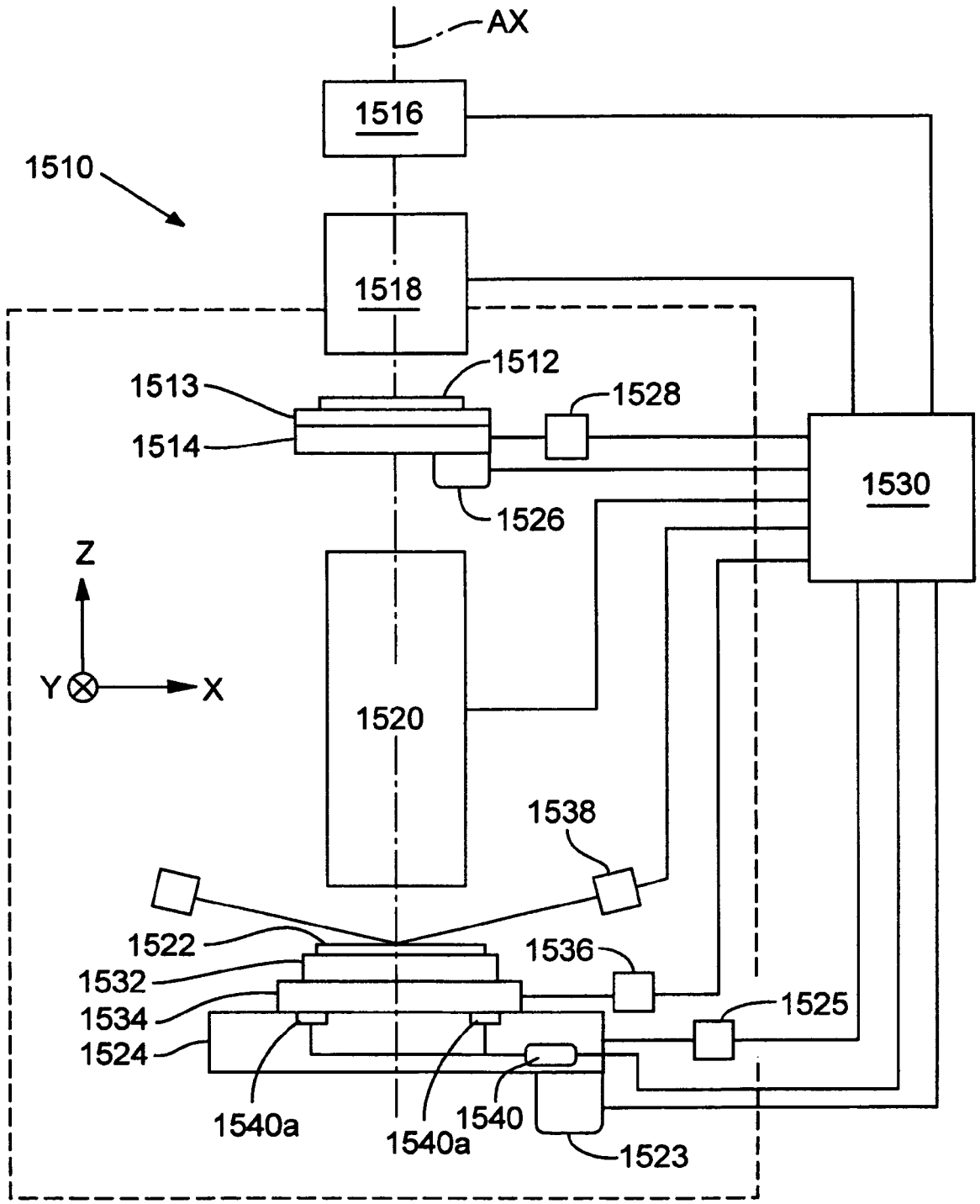
FIG. 44 is an elevational schematic diagram showing certain aspects of an exemplary exposure apparatus that includes at least one of the embodiments disclosed herein.

An exemplary microlithography system 1510 (generally termed an "exposure apparatus") with which any of the foregoing embodiments can be used is depicted in FIG. 44, which depicts an example of a projection-exposure apparatus. A pattern is defined on a reticle (sometimes termed a "mask") 1512 mounted on a reticle stage 1514. The reticle 1512 is "illuminated" by an energy beam (e.g., DUV light) produced by a source 1516 and passed through an illumination-optical system 1518. As the energy beam passes through the reticle 1512, the beam acquires an ability to form an image, of the illuminated portion of the reticle 1512, downstream of the reticle. The beam passes through a projection-optical system 1520 that focuses the beam on a sensitive surface of a substrate 1522 held on a substrate stage ("wafer stage" or "wafer x-y stage") 1524. As shown in the figure, the source 1516, illumination-optical system 1518, reticle stage 1514, projection-optical system 1520, and wafer stage 1524 generally are situated relative to each other along an optical axis AX. The reticle stage 1514 is movable at least in the x- and $\theta_z$-directions using a stage actuator 1526 (e.g., linear actuator(s) or planar actuator), and the positions of the reticle stage 1514 in the x- and y-directions are detected by respective interferometers 1528. The system 1510 is controlled by a system controller (computer) 1530.

The substrate 1522 (also termed a "wafer") is mounted on the wafer stage 1524 by a wafer chuck 1532 and wafer table 1534 (also termed a "leveling table"). The wafer stage 1524 not only holds the wafer 1522 for exposure (with the resist facing in the upstream direction) but also provides for controlled movements of the wafer 1522 in the x- and y-directions as required for exposure and for alignment purposes. The wafer stage 1524 is movable by a suitable wafer-stage actuator 1523 (e.g., linear actuator(s) or planar actuator), and positions of the wafer stage 1524 in the X- and Y-directions are determined by respective interferometers 1525. The wafer table 1534 is used to perform fine positional adjustments of the wafer chuck 1532 (holding the wafer 1522), relative to the wafer stage 1524, in each of the x-, y-, and z-directions. Positions of the wafer table 1534 in the x- and y-directions are determined by respective wafer-stage interferometers 1536.

The wafer chuck 1532 is configured to hold the wafer 1522 firmly for exposure and to facilitate presentation of a planar sensitive surface of the wafer 1522 for exposure. The wafer 1522 usually is held to the surface of the wafer chuck 1532 by vacuum, although other techniques such as electrostatic attraction can be employed under certain conditions. The wafer chuck 1532 also facilitates the conduction of heat away from the wafer 1522 that otherwise would accumulate in the wafer during exposure.

Movements of the wafer table 1534 in the z-direction (optical-axis direction) and tilts of the wafer table 1534 relative to the z-axis (optical axis AX) typically are made in order to establish or restore proper focus of the image, formed by the projection-optical system 1520, on the sensitive surface of the wafer 1522. "Focus" relates to the position of the exposed portion of the wafer 1522 relative to the projection-optical system 1520. Focus usually is determined automatically, using an auto-focus (AF) device 1538. The AF device 1538 produces data that is routed to the system controller 1530. If the focus data produced by the AF device 1538 indicates existence of an out-of-focus condition, then the system controller 1530 produces a "leveling command" that is routed to a wafer-table controller 1540 connected to individual wafer-table actuators 1540a. Energization of the wafer-table actuators 1540a results in movement and/or tilting of the wafer table 1534 serving to restore proper focus.

The exposure apparatus 1510 can be any of various types. For example, as an alternative to operating in a "step-and-repeat" manner characteristic of steppers, the exposure apparatus can be a scanning-type apparatus operable to expose the pattern from the reticle 1512 to the wafer 1522 while continuously scanning both the reticle 1512 and wafer 1522 in a synchronous manner. During such scanning, the reticle 1512 and wafer 1522 are moved synchronously in opposite directions perpendicular to the optical axis Ax. The scanning motions are performed by the respective stages 1514, 1524.

In contrast, a step-and-repeat exposure apparatus performs exposure only while the reticle 1512 and wafer 1522 are stationary. If the exposure apparatus is an "optical lithography" apparatus, the wafer 1522 typically is in a constant position relative to the reticle 1512 and projection-optical system 1520 during exposure of a given pattern field. After the particular pattern field is exposed, the wafer 1522 is moved, perpendicularly to the optical axis AX and relative to the reticle 1512, to place the next field of the wafer 1522 into position for exposure. In such a manner, images of the reticle pattern are sequentially exposed onto respective fields on the wafer 1522.

Exposure apparatus as provided herein are not limited to microlithography systems for manufacturing microelectronic devices. As a first alternative, for example, the exposure apparatus can be a microlithography system used for transferring a pattern for a liquid-crystal display (LCD) onto a glass plate. As a second alternative, the exposure apparatus can be a microlithography system used for manufacturing thin-film magnetic heads. As a third alternative, the exposure apparatus can be a proximity-microlithography system used for exposing, for example, a mask pattern. In this alternative, the mask and substrate are placed in close proximity with each other, and exposure is performed without having to use a projection-optical system 1520.

The principles set forth in the foregoing disclosure further alternatively can be used with any of various other apparatus, including (but not limited to) other microelectronic-processing apparatus, machine tools, metal-cutting equipment, and inspection apparatus.

In any of various exposure apparatus as described above, the source 1516 (in the illumination-optical system 1518) of illumination "light" can be, for example, a g-line source (436 nm), an i-line source (365 nm), a KrF excimer laser (248 nm), an ArF excimer laser (193 nm), or an $F_2$ excimer laser (157 nm). Alternatively, the source 1516 can be of any other suitable exposure light.

With respect to the projection-optical system 1520, if the illumination light comprises deep-ultraviolet radiation, then the constituent optical elements are made of DUV-transmissive materials such as quartz and fluorite that readily transmit ultraviolet radiation. If the illumination light is produced by any of certain excimer lasers (e.g., vacuum ultraviolet light having a wavelength of less than 200 nm), then the elements of the projection-optical system 1520 can be either refractive or catadioptric, and the reticle 1512 can be transmissive or reflective. A catadioptric configuration can include beam splitter and concave mirror, as disclosed for example in U.S. Pat. Nos. 5,668,672 and 5,835,275, incorporated herein by reference. A projection-optical system 520 having a reflecting-refracting configuration including a concave mirror but not a beam splitter is disclosed in U.S. Pat. Nos. 5,689,377 and 5,892,117, incorporated herein by reference. Especially as used with excimer-laser wavelengths, the projection-optical system 1520 can be an immersion type or non-immersion type. A projection-optical system used with extreme ultraviolet (EUV) wavelengths has an all-reflective configuration.

Either or both the reticle stage 1514 and wafer stage 1524 can include respective linear motors for achieving the motions of the reticle 1512 and wafer 1522, respectively, in the x-axis and y-axis directions. The linear motors can be air-levitation types (employing air bearings) or magnetic-levitation types (employing bearings based on the Lorentz force or a reactance force). Either or both stages 1514, 1524 can be configured to move along a respective guide or alternatively can be guideless. See U.S. Pat. Nos. 5,623,853 and 5,528,118, incorporated herein by reference.

Further alternatively, either or both stages 1514, 1524 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 1514, 1524 as described herein can generate reaction forces that can affect the performance of the exposure apparatus. Reaction forces generated by motion of the wafer stage 1524 can be shunted to the floor (ground) using a frame member as described, e.g., in U.S. Pat. No. 5,528,118, incorporated herein by reference. Reaction forces generated by motion of the reticle stage 1514 can be shunted to the floor (ground) using a frame member as described in U.S. Pat. No. 5,874,820, incorporated herein by reference. The reticle stage 1514 and wafer stage 1524 can include counter-masses to reduce and/or offset reaction forces.

An exposure apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical-system components and assemblies are adjusted as required to achieve maximal optical accuracy. Similarly, mechanical and electrical systems are adjusted as required to achieve maximal respective accuracies. Assembling the various subsystems into an exposure apparatus requires the making of mechanical interfaces, electrical-circuit wiring connections, and pneumatic plumbing connections as required between the various subsystems. Typically, constituent subsystems are assembled prior to assembling the subsystems into an exposure apparatus. After assembly of the apparatus, system adjustments are made as required for achieving overall system specifications in accuracy, etc.

Assembly at the subsystem and system levels desirably is performed in a clean room where temperature and humidity are controlled.

Semiconductor-Device Fabrication

Figure 45:
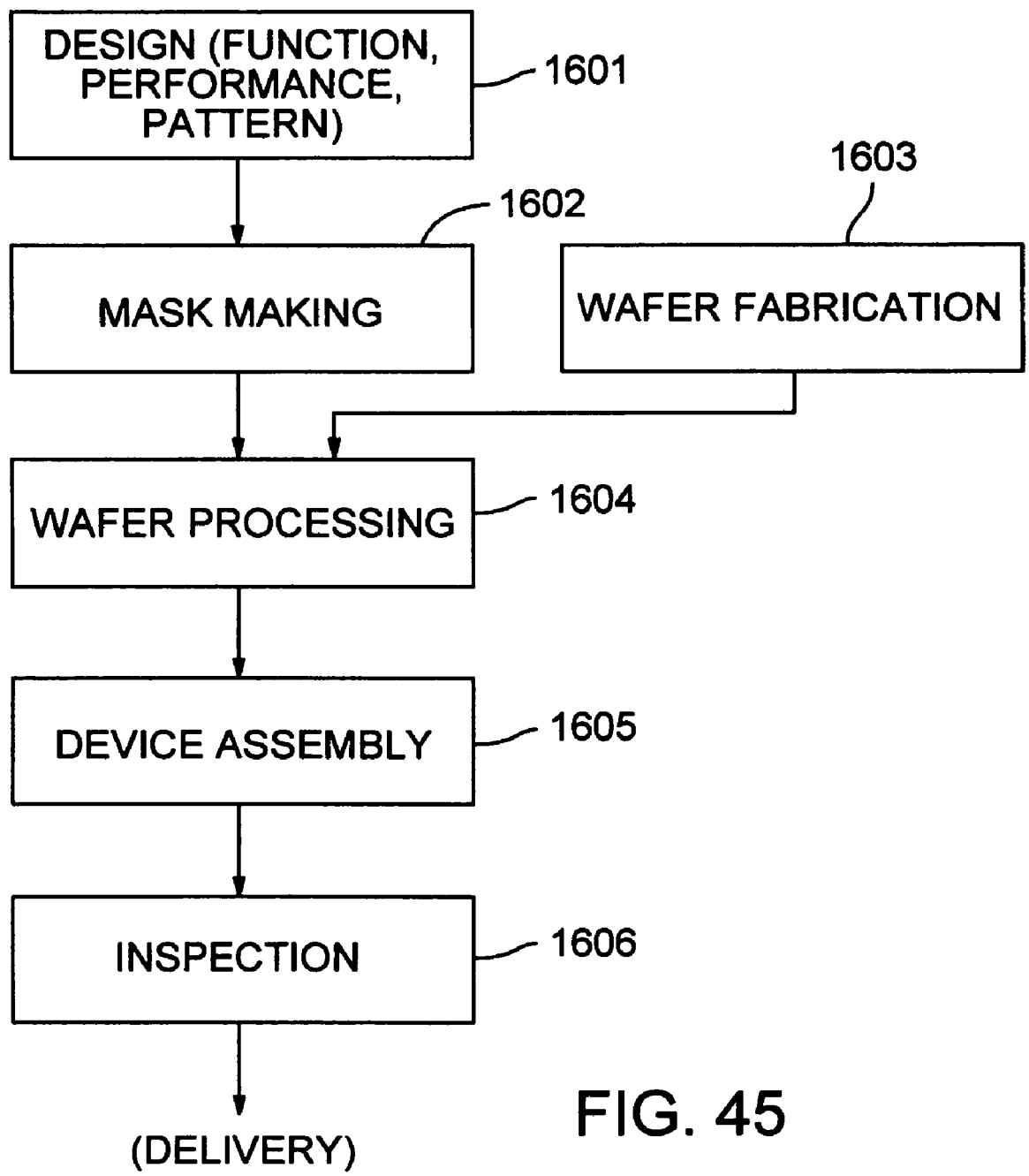
FIG. 45 is a block diagram of an exemplary semiconductor-device fabrication process that includes wafer-processing, which includes a lithography process.

Semiconductor devices can be fabricated by processes including microlithography performed using a microlithography system, for example one similar to that described above. An example of a suitable process proceeds according to that illustrated by the flow diagram of FIG. 45. Referring to FIG. 45, at 1601 the function and performance characteristics of the semiconductor device are designed. At 1602 a reticle defining the desired pattern is designed, in part according to desirable function and performance characteristics. At 1603, a substrate (wafer) is formed and coated with a suitable resist. At 1604 the reticle pattern designed at 1602 is exposed onto the surface of the substrate using the microlithography system. At 1605, the semiconductor device is assembled (including "dicing" by which individual devices or "chips" are cut from the wafer, "bonding" by which wires are bonded to the particular locations on the chips, and "packaging" by which the devices are enclosed in appropriate packages for use). At 1606 the assembled devices are tested and inspected.

Figure 46:
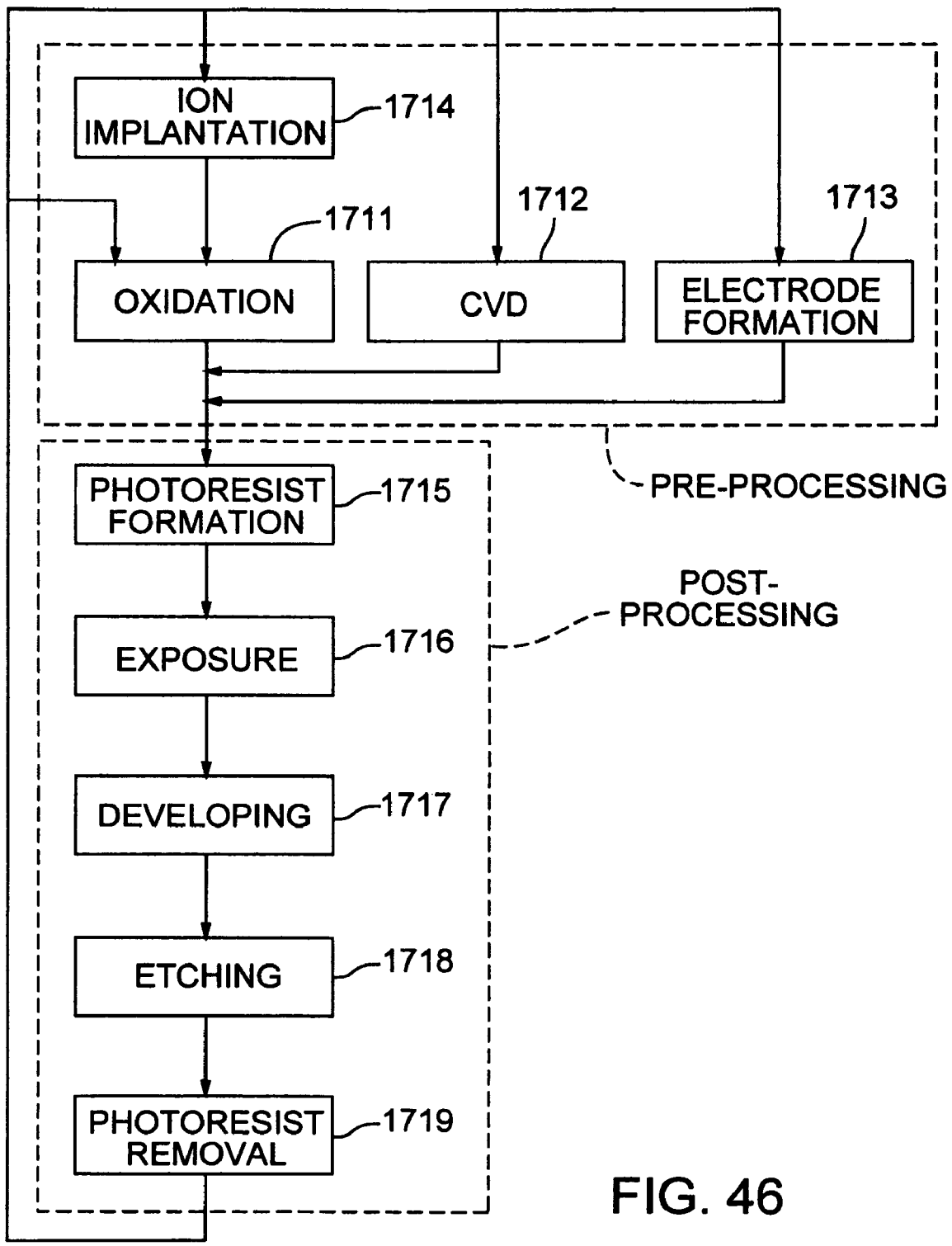
FIG. 46 is a block diagram of a wafer-processing process as referred to in FIG. 45.

Representative details of a wafer-processing process including microlithography are shown in FIG. 46. At 1711 (oxidation) the wafer surface is oxidized. At 1712 (CVD) an insulative layer is formed on the wafer surface. At 1713 (electrode formation) electrodes are formed on the wafer surface by a deposition process, for example a vapor deposition process. At 1714 (ion implantation) ions are implanted in the wafer surface. Elements 1711-1714 constitute representative "pre-processing" steps for wafers, and selections are made at each step according to desirable processing parameters.

For each stage of wafer processing, when pre-processing has been completed, the following "post-processing" can occur. For example, at 1715 (photoresist formation) a suitable resist is applied to the surface of the wafer. Next, at 1716 (exposure), the microlithography system described above is used for lithographically transferring a pattern from the reticle to the resist layer on the wafer. At 1717 (development) the exposed resist on the wafer is developed to form a usable mask pattern, corresponding, at least in part to the resist pattern, in the resist on the wafer. At 1718 (etching), regions not covered by developed resist (e.g., exposed material surfaces) are etched to a controlled depth. At 1719 (photoresist removal), residual developed resist is removed ("stripped") from the wafer.

Formation of multiple interconnected layers of circuit patterns on the wafer can be achieved by repeating the pre-processing and post-processing as desired. Generally, pre-processing and post-processing are conducted to form each layer of a semiconductor device.

Exemplary Actuator Incorporating Compensation

Figure 47:
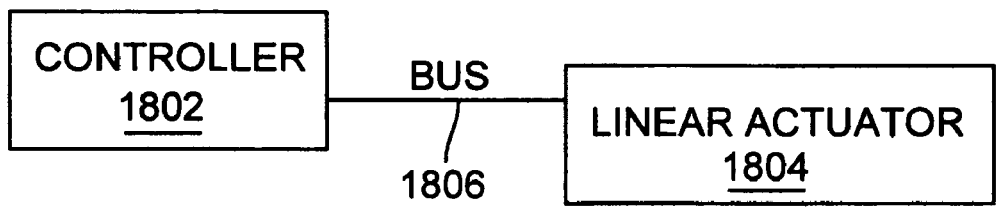
FIG. 47 is a block diagram of a representative linear actuator in combination with a controller for compensation for force-ripple and/or side-force.

An actuator as described above can be combined with a controller that provides compensation for force-ripple and/or side-force according to any of the foregoing embodiments. For example, the block diagram of FIG. 47 shows a controller 1802 coupled to a linear actuator 1804 by a bus 1806. According to some embodiments, the controller 1802 incorporates force-ripple and/or side-force compensation and applies the compensation to a received force-command. In such an embodiment, the controller 1802 will transmit a compensated force-command across the bus 1806 to the actuator 1804.

Alternative Embodiments Incorporating Compensation

Figure 48:
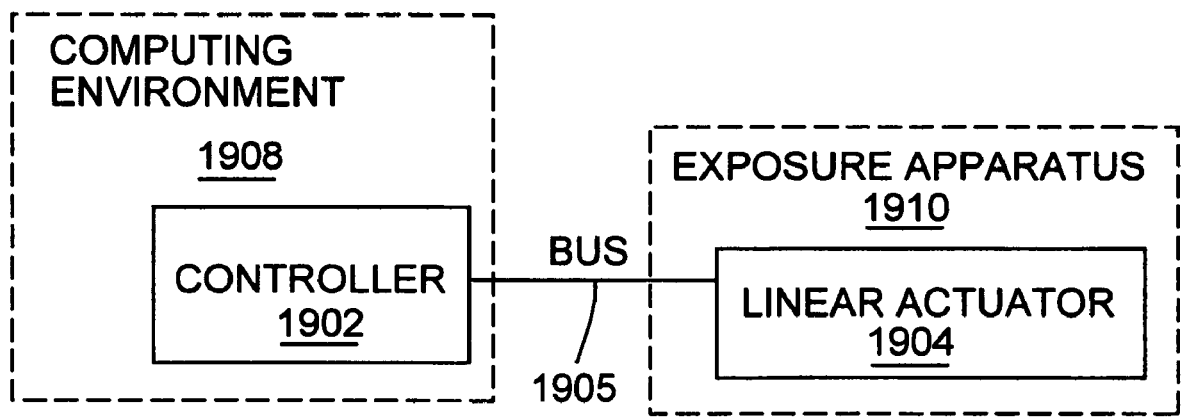
FIG. 48 is a block diagram of a representative exposure apparatus that incorporates a linear actuator with force-ripple and/or side-force compensation.

Alternative embodiments of actuators with compensation are possible. For example, the block diagram of FIG. 48 represents an exposure apparatus 1910 that incorporates a linear actuator 1904 with force-ripple and/or side-force compensation. The embodiment of FIG. 48 includes a computing environment 1908 that incorporates a controller 1902. The controller 1902 is coupled to the actuator 1904 via a bus 1906 and is configured to provide a force-command compensated for force-ripple or side-force to the actuator 1904.

Alternatives

As noted elsewhere herein, the principles described herein are not limited to linear actuators. Since planar actuators achieve motion in a plane (e.g., x-y plane, at least 2DOFs), they inherently are capable of achieving motion along a line (e.g., x or y axis) in that plane.

The technologies from any example can be combined with the technologies described in any one or more of the other examples. In view of the many possible embodiments to which the principles may be applied, it should be recognized that the illustrated embodiments are only exemplary in nature and should not be taken as limiting. Rather, the scope of protection sought is defined by the following claims. We therefore claim all that comes within the scope and spirit of the following claims.

What is claimed is:

1. With respect to at least one actuator in a set thereof situated to move a displaceable member, a method for producing a map of compensating force-commands for at least one of force-ripple and side-force in a stroke direction of the at least one actuator, the method comprising:

using a selected at least one actuator of the set, displacing the member a series of times over a predetermined increment in a range of motion in the stroke direction, each displacement being from a respective starting position in the range, and each displacement being of a predetermined trajectory having multiple trajectory sections;

obtaining, from the displacements, respective force-commands for the selected at least one actuator, for at least one trajectory section;

normalizing the section force-commands to a reference section force-command to define a series of respective section compensation ratios for at least one of force-ripple and side-force;

mapping the section compensation ratios over the range; and obtaining, from the mapped compensation ratios, a matrix of compensating force-commands sufficient to reduce at least one of force-ripple and side-force.

2. The method of claim 1, wherein:
the set includes multiple actuators; and
the selected at least one actuator is one actuator.

3. The method of claim 1, wherein:
the set includes a total of multiple redundant actuators having similar stroke directions; and
the selected at least one actuator includes multiple actuators but less than the total.

4. The method of claim 1, wherein the matrix of compensating force-commands is approximately an inverse of a corresponding actuation matrix for the selected at least one actuator.

5. The method of claim 1, further comprising combining the mapped Section compensation ratios for the at least one trajectory section with mapped section compensation ratios for at least one additional trajectory section.

6. The method of claim 1, further comprising assembling a map of the Section force-commands versus position in the range.

7. The method of claim 1, wherein the reference section force-command is determined by calculating an average of multiple section force-commands.

8. The method of claim 1, wherein the respective force-commands pertain To both force-ripple and side-force exhibited in the displacements; and
the defined array of respective section compensation ratios comprises a first array for force-ripple and a second array for side-force.

9. The method of claim 1, wherein:
the set includes a total of multiple redundant actuators having similar stroke directions; and
the method further comprises repeating the method for other selected one or more actuators of the set to map respective compensation ratios over the range for all the actuators in the set.

10. The method of claim 1, wherein the set of actuators comprises multiple redundant actuators each having at least one respective DOF of motion.

11. A method for performing an in situ characterization of position-dependent compensation for force-ripple and side-force of constituent actuators in a set of redundant actuators used for moving a member, the method comprising:
selecting a first subset of actuators of the set, the first subset including at least one actuator for use as a servo actuator for moving and positioning the member within a range in at least one stroke direction;
selecting a second subset of actuators of the set, the second subset comprising at least one actuator for use as a mapping actuator;
commanding the first subset to move the member throughout the range while commanding the second subset to generate a constant force;
with respect to the mapping actuator, measuring and mapping position-dependent force variations, over the range, imparted by the first subset moving the member;
from the mapped position-dependent forces, determining respective force-ripple and side-forces being contributed to the forces by the first subset to produce a map of position-dependent force-ripple and side-force for the mapping actuator; and
repeating using other combinations of servo and mapping actuators to obtain maps of respective force-ripple and side-forces, over the range, for each actuator in the set.

12. The method of claim 1, wherein the displacements are made according to a predetermined force distribution for the selected at least one actuator.

13. The method of claim 1, further comprising determining differences of determined compensation ratios from corresponding ideal compensation ratios.

14. The method of claim 13, wherein the ideal compensation ratios are determined from a computer-simulation model of the respective at least one of force-ripple and side-force.

15. The method of claim 1, wherein the at least one actuator is a linear actuator or a planar actuator.

16. An in situ method for producing a map of at least one of force-ripple and side-force exhibited by an actuator configured to impart motion in at least one stroke direction, the method comprising:
using the actuator in situ, repeatedly performing a displacement over a predetermined increment in a range of motion of the actuator, each displacement being from a respective starting position in the range, and each displacement being of a predetermined trajectory including multiple trajectory sections;
obtaining, from the displacements, respective position-dependent section force-commands for the actuator, for at least one trajectory section;
assembling the force-commands for the at least one trajectory section;
normalizing the assembled force-commands to a reference section force-command to define a series of respective section compensation ratios for at least one of force-ripple and side-force in the stroke direction; and
mapping the section compensation ratios over the range.

17. The method of claim 16, further comprising obtaining, from the mapped compensation ratios, a matrix of compensating force-commands sufficient to reduce at least one of force-ripple and side-force exhibited by the actuator in the stroke direction.

18. The method of claim 17, further comprising driving the actuator by actuation force-commands including the compensating force-commands.

19. The method of claim 16, wherein the actuator is a linear actuator or planar actuator.

20. The method of claim 10, wherein each of the multiple redundant actuators has multiple DOFs of motion.

21. The method of claim 11, wherein a number of actuators in either subset is selected to match a predetermined number of degrees of freedom of control of member motion.

22. The method of claim 11, further comprising determining and mapping, from the mapped position-dependent forces, compensation ratios for the mapping actuator, the compensation ratios corresponding to respective mapped position-dependent forces.

23. The method of claim 22, wherein the compensation ratios are determined from a high-force section of member movement as caused when the first subset is commanded to move the member throughout the range.

24. The method of claim 23, further comprising combining the mapped compensation ratios for multiple high-force sections of member movement.

25. The method of claim 11, wherein the actuators are linear actuators or planar actuators.

26. A method for controlling actuation of a set of redundant actuators used for moving and positioning, in a predetermined direction, a movable member of a stage apparatus in a precision system, the method comprising:
defining a respective force-command for each actuator of the set of redundant actuators that move the movable member of the stage apparatus;
in situ in the system, determining a respective position-dependent compensation ratio for each actuator of the set, each respective position-dependent compensation ratio being defined, at least in part, by using the respective actuator to displace the member throughout a range of motion according to a predetermined trajectory in combination with a plurality of initial positions in the direction;
applying the respective compensation ratio to each respective force-command to provide respective corrected force-commands; and
displacing the member according to the respective corrected force-commands applied to the actuators of the set.

27. The method of claim 26, wherein the actuators are linear actuators or planar actuators.

28. A system, comprising:
an exposure apparatus;
a set of actuators configured to displace a movable member of the exposure apparatus;
a controller;

a bus coupled from the controller to the set of actuators;

wherein the controller is configured to control actuation of the actuators in situ on the system by defining a respective force-command for each actuator of the set, determining a respective position-dependent compensation ratio for each actuator of the set, each respective position-dependent compensation ratio being defined, at least in part, by using the respective actuator to displace the member throughout a range of motion according to a predetermined trajectory in combination with a plurality of initial positions in a movement direction for the actuators, applying the respective compensation ratios to the respective force-commands to provide respective corrected force-commands, and displacing the member according to the respective corrected force-commands applied to the actuators of the set.

29. The system of claim 28, wherein the actuators are linear actuators or planar actuators.

30. A method for producing compensating information regarding a driving signal, for at least one actuator of a moving device that includes a plurality of actuators to move a movable member along a plurality of directions, regarding a stroke direction of at least one actuator, the method comprising:

using a selected at least one actuator of the moving device, displacing the movable member in a series of time instants over a predetermined increment in a range of motion in the stroke direction, each displacement being from a respective starting position in the range, and each displacement being of a predetermined trajectory having multiple trajectory sections;

obtaining, from the displacements, a respective driving signal for the selected at least one actuator, for at least one trajectory section;

normalizing the driving signal for the at least one trajectory section to a reference section of driving signals to define a series of respective section compensation ratios; and combining the section compensation ratios over the range.

31. The method of claim 30, wherein the compensating information includes a map of compensating force-commands of the at least one actuator.

32. The method of claim 31, wherein the compensating information includes a map of compensating force-commands for at least one of force-ripple and side-force in the stroke direction of the at least one actuator.

33. The method of claim 32, further comprising obtaining, from the combined section compensation ratios, a matrix of compensations for the force-commands to reduce at least one of force-ripple and side-force.

34. The method of claim 31, further comprising assembling a map of the compensating force-commands versus respective positions of the movable member in the range.

35. The method of claim 30, wherein:

the moving device includes multiple actuators that generate a driving force along multiple axis directions; and the selected at least one actuator is one actuator.

36. The method of claim 30, wherein the at least one actuator includes a linear motor or a planar motor.

37. An exposure apparatus including a movable member, comprising:

a moving device including a plurality of actuators to move a movable member along a plurality of directions; and a controller connected to the actuators, wherein the controller controls actuation of the actuators by defining a respective driving signal for each actuator of the moving device and determining respective position-dependent compensation ratios for each actuator of the moving device, each respective position-dependent compensation ratio being defined, at least in part, by using the respective actuator to displace the movable member throughout a range of motion according to a predetermined trajectory in combination with a plurality of initial positions in the movement direction for the actuators, applying the respective compensation ratios to the respective driving signals to provide respective corrected driving signals, and displacing the movable member according to the respective corrected driving signals applied to the actuators of the moving device.

38. The exposure apparatus of claim 37, wherein the controller uses a map of respective compensation ratios to compensate for the driving signal of the at least one actuator.

39. The exposure apparatus of claim 38, wherein the map of the respective compensation ratios is used to compensate a force-command for at least one of force-ripple and side-force in the stroke of the at least one actuator.

40. The exposure apparatus of claim 37, wherein the moving device includes multiple actuators that generate a driving force along multiple axis directions.

41. The exposure apparatus of claim 37, wherein the moving device includes a linear motor or a planar motor.

* * * * *

UNITED STATES PATENT AND TRADEMARK OFFICE
CERTIFICATE OF CORRECTION

PATENT NO. : 8,140,288 B2
APPLICATION NO. : 11/986314
DATED : March 20, 2012
INVENTOR(S) : Yang et al.

Page 1 of 1

It is certified that error appears in the above-identified patent and that said Letters Patent is hereby corrected as shown below:

Column 21, line 12 (equation 13), " $\Delta u_{yl}^{j}(y) = u_{yl}^{j}(y) - \bar{u}_{yl}(y)$ " should read -- $\Delta u_{yl}^{j}(y) = u_{yl}^{j}(y) - \bar{u}_{yl}(y)$ --

Column 21, line 14 (equation 14), " $\Delta u_{zl}^{j}(y) = u_{zl}^{j}(y) - \bar{u}_{zl}(y)$ " should read -- $\Delta u_{zl}^{j}(y) = u_{zl}^{j}(y) - \bar{u}_{zl}(y)$ --

Signed and Sealed this
Second Day of October, 2012

David J. Kappos
*Director of the United States Patent and Trademark Office*